(12) United States Patent
Oikawa

(10) Patent No.: US 9,128,374 B2
(45) Date of Patent: Sep. 8, 2015

(54) RESIST COMPOSITION AND METHOD OF FORMING RESIST PATTERN

(71) Applicant: Tokyo Ohka Kogyo Co., Ltd., Kawasaki-shi (JP)

(72) Inventor: Tomohiro Oikawa, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 14/056,277

(22) Filed: Oct. 17, 2013

(65) Prior Publication Data

US 2014/0147790 A1    May 29, 2014

(30) Foreign Application Priority Data

Oct. 19, 2012 (JP) ................. 2012-232370

(51) Int. Cl.
   G03F 7/039   (2006.01)
   G03F 7/20    (2006.01)
   G03F 7/038   (2006.01)

(52) U.S. Cl.
   CPC ............ G03F 7/0382 (2013.01); G03F 7/0392 (2013.01); G03F 7/0397 (2013.01); G03F 7/20 (2013.01)

(58) Field of Classification Search
   CPC ....... G03F 7/004; G03F 7/0045; G03F 7/028; G03F 7/039; G03F 7/0392; G03F 7/20
   USPC .............................. 430/270.1, 326, 919, 920
   See application file for complete search history.

(56) References Cited

U.S. PATENT DOCUMENTS

| | | | |
|---|---|---|---|
| 2004/0110085 A1 | 6/2004 | Iwai et al. | |
| 2006/0172228 A1 | 8/2006 | Wada | |
| 2009/0197204 A1 | 8/2009 | Shiono et al. | |
| 2009/0317743 A1 | 12/2009 | Shiono et al. | |
| 2010/0255418 A1* | 10/2010 | Yamaguchi et al. | 430/270.1 |
| 2010/0310985 A1 | 12/2010 | Mori et al. | |
| 2011/0117499 A1 | 5/2011 | Matsumiya et al. | |
| 2012/0148955 A1* | 6/2012 | Utsumi et al. | 430/285.1 |
| 2012/0149916 A1 | 6/2012 | Utsumi et al. | |
| 2013/0045443 A1* | 2/2013 | Utsumi et al. | 430/270.1 |
| 2013/0260312 A1* | 10/2013 | Suzuki et al. | 430/270.1 |
| 2013/0302736 A1* | 11/2013 | Utsumi et al. | 430/285.1 |

FOREIGN PATENT DOCUMENTS

| | | |
|---|---|---|
| JP | A-2003-241385 | 8/2003 |
| JP | A-2006-208781 | 8/2006 |
| JP | A-2009-025723 | 2/2009 |
| JP | A-2010-002870 | 1/2010 |
| JP | A-2010-032994 | 2/2010 |
| JP | 2010-237334 | * 10/2010 |
| JP | A-2010-277043 | 12/2010 |
| JP | A-2011-013569 | 1/2011 |
| JP | A-2011-128226 | 6/2011 |

OTHER PUBLICATIONS

Machine translation of JP 2006-208781, published on Aug. 10, 2006.*
Machine translation of JP 2010-237334, published on Oct. 21, 2010.*

* cited by examiner

*Primary Examiner* — Anca Eoff
(74) *Attorney, Agent, or Firm* — Knobbe Martens Olson & Bear LLP

(57) ABSTRACT

A resist composition which generates acid upon exposure and exhibits changed solubility in a developing solution under the action of acid, the resist composition including: a base component (A) which exhibits changed solubility in a developing solution under the action of acid and an acid generator component (B) which generates an acid upon exposure, the base component (A) including a polymeric compound (A1) having a structural unit (a0) containing an acid decomposable group that exhibits increased polarity by the action of acid and a lactone-containing cyclic group, an —SO$_2$— containing cyclic group or a carbonate-containing cyclic group, and the acid generator component (B) including an acid generator (B1) containing a compound having a nitrogen atom exhibiting a proton acceptor property and an acid generating site capable of generating an acid upon exposure in the same molecule thereof.

17 Claims, No Drawings

RESIST COMPOSITION AND METHOD OF FORMING RESIST PATTERN

TECHNICAL FIELD

The present invention relates to a resist composition and a method of forming a resist pattern.

Priority is claimed on Japanese Patent Application No. 2012-232370, filed on Oct. 19, 2012, the content of which is incorporated herein by reference.

BACKGROUND ART

In lithography techniques, for example, a resist film composed of a resist material is formed on a substrate, and the resist film is subjected to selective exposure, followed by development, thereby forming a resist pattern having a predetermined shape on the resist film. A resist material in which the exposed portions of the resist film become soluble in a developing solution is called a positive-type, and a resist material in which the exposed portions of the resist film become insoluble in a developing solution is called a negative-type.

In recent years, in the production of semiconductor elements and liquid crystal display elements, advances in lithography techniques have led to rapid progress in the field of pattern miniaturization. Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter (energy higher) than these excimer lasers, such as electron beam (EB), extreme ultraviolet radiation (EUV), and X ray.

Resist materials for use with these types of exposure light sources require lithography properties such as a high resolution and mask reproducibility capable of reproducing patterns of minute dimensions, excellent pattern shape, and a high level of sensitivity to these types of exposure light sources.

As a resist material that satisfies these conditions, a chemically amplified composition is used, which includes a base material component that exhibits a changed solubility in a developing solution under the action of acid and an acid-generator component that generates acid upon exposure.

For example, in the case where the developing solution is an alkali developing solution (alkali developing process), a chemically amplified positive resist which contains, as a base component (base resin), a resin which exhibits increased solubility in an alkali developing solution under action of acid, and an acid generator is typically used.

If a resist film formed using such a resist composition is selectively exposed at the time of forming a resist pattern, in exposed areas, an acid is generated from the acid generator component, and the polarity of the base resin increases by the action of the generated acid, thereby making the exposed areas soluble in the alkali developing solution. Thus, by conducting alkali developing, the unexposed portions remain to form a positive resist pattern.

On the other hand, when such a base resin is applied to a solvent developing process using a developing solution containing an organic solvent (organic developing solution), the solubility of the exposed portions in an organic developing solution is decreased. As a result, the unexposed portions of the resist film are dissolved and removed by the organic developing solution, and a negative resist pattern in which the exposed portions are remaining is formed. Such a solvent developing process for forming a negative-tone resist composition is sometimes referred to as "negative-tone developing process" (for example, see Patent Document 1).

In general, the base resin used for a chemically amplified resist composition contains a plurality of structural units for improving lithography properties and the like. For example, in the case of a resin composition which exhibits increased solubility in an alkali developing solution by the action of acid, a structural unit containing an acid decomposable group which is decomposed by the action of acid generated from an acid generator component and exhibits increased polarity is used. In addition, a structural unit containing a lactone-containing cyclic group or a structural unit containing a polar group such as a hydroxy group is used (for example, see Patent Document 2).

On the other hand, as acid generators usable in a chemically amplified resist composition, various types have been proposed including, for example, onium salt acid generators; oxime sulfonate acid generators; diazomethane acid generators; nitrobenzylsulfonate acid generators; iminosulfonate acid generators; and disulfone acid generators.

As miniaturization of pattern progresses, demands for a compound useful as an acid generator for a resist composition has been demanded. In response to such demands, Patent Document 3 discloses a compound having a proton acceptor functional group as an acid generator, the compound generating a sulfonic acid group by irradiation of an active ray or a radial ray, thereby lowering or losing the acceptor properties, or rendering the proton acceptor functional group acidic.

DOCUMENTS OF RELATED ART

Patent Literature

[Patent Literature 1] Japanese Unexamined Patent Application, First Publication No. 2009-025723

[Patent Document 2] Japanese Unexamined Patent Application, First Publication No. 2003-241385

[Patent Document 3] Japanese Unexamined Patent Application, First Publication No. 2006-208781

SUMMARY OF THE INVENTION

As further progress is made in lithography techniques and miniaturization of resist patterns, further improvement in resist materials is required in terms of various lithography properties and resist pattern shape. In particular, a technique for forming a pattern which is enables both reduction of the roughness and mask reproducibility is demanded. In response to such demands, with a conventional resist composition using a combination of a resin and an acid generator as disclosed in Patent Documents 2 and 3, it was difficult to achieve both reduction of roughness and mask reproducibility, while satisfying the above high level requirements.

The present invention takes the above circumstances into consideration, with an object of obtaining a resist pattern with reduced roughness and excellent mask reproducibility.

For solving the above-mentioned problems, the present invention employs the following aspects.

Specifically, a first aspect of the present invention is a resist composition which generates acid upon exposure and exhibits changed solubility in a developing solution under the action of acid, the resist composition including: a base component (A) which exhibits changed solubility in a developing solution under the action of acid and an acid generator component (B) which generates an acid upon exposure, the base component (A) including a polymeric compound (A1) having a structural unit (a0) containing an acid decomposable group that exhibits increased polarity by the action of acid and a lactone-containing cyclic group, an —$SO_2$— containing cyclic group or a carbonate-containing cyclic group, and the acid generator component (B) including an acid generator (B1) containing a compound having a nitrogen atom exhibiting a proton acceptor property and an acid generating site capable of generating an acid upon exposure in the same molecule thereof.

A second embodiment of the present invention is concerned with a method for forming a resist pattern including a step of forming a resist film using the resist composition of the first embodiment on a support, a step of exposing the resist film, and a step of developing the resist film to form a resist pattern.

According to the resist composition and method of forming the resist pattern of the present invention, a resist pattern with reduced roughness and excellent mask reproducibility can be formed.

MODE FOR CARRYING OUT THE INVENTION

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified. The same applies for the alkyl group within an alkoxy group.

The term "alkylene group" includes linear, branched or cyclic, divalent saturated hydrocarbon, unless otherwise specified.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with fluorine atom(s).

The term "structural unit" refers to a monomer unit that contributes to the formation of a polymeric compound (resin, polymer, copolymer).

The expression "may have a substituent" means that a case where a hydrogen atom (—H) is substituted with a monovalent group, or a case where a methylene (—$CH_2$—) group is substituted with a divalent group.

The term "exposure" is used as a general concept that includes irradiation with any form of radiation.

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2$=CH—COOH) has been substituted with an organic group.

The acrylate ester may have the hydrogen atom bonded to the carbon atom on the α-position substituted with a substituent. The substituent ($R^{\alpha 0}$) that substitutes the hydrogen atom bonded to the carbon atom on the α-position is an atom other than hydrogen or a group, and examples thereof include an alkyl group of 1 to 5 carbon atoms and a halogenated alkyl group of 1 to 5 carbon atoms. Further, an acrylate ester having the hydrogen atom bonded to the carbon atom on the α-position substituted with a substituent ($R^{\alpha 0}$) in which the substituent has been substituted with a substituent containing an ester bond (e.g., an itaconic acid diester), or an acrylic acid having the hydrogen atom bonded to the carbon atom on the α-position substituted with a substituent ($R^{\alpha 0}$) in which the substituent has been substituted with a hydroxyalkylgroup or a group in which the hydroxy group within a hydroxyalkyl group has been modified (e.g., α-hydroxyalkyl acrylate ester) can be mentioned as an acrylate ester having the hydrogen atom bonded to the carbon atom on the α-position substituted with a substituent. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from acrylamide" refers to a structural unit that is formed by the cleavage of the ethylenic double bond of acrylaminde.

The acrylamide may have the hydrogen atom bonded to the carbon atom on the α-position substituted with a substituent, and may have either or both terminal hydrogen atoms on the amino group of acrylamide substituted with a substituent. A carbon atom on the α-position of an acrylamide refers to the carbon atom bonded to the carbonyl group, unless specified otherwise.

As the substituent which substitutes the hydrogen atom on the α-position of acrylamide, the same substituents as those described above for the substituent ($R^{\alpha 0}$) the α-position of the aforementioned α-position of the aforementioned α-substituted acrylate ester can be mentioned.

A "structural unit derived from hydroxystyrene or a hydroxystyrene derivative" refers to a structural unit that is formed by the cleavage of the ethylenic double bond of hydroxystyrene or a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxy group has been substituted with an organic group and may have the hydrogen atom on the α-position substituted with a substituent; and hydroxystyrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

As the substituent which substitutes the hydrogen atom on the α-position of hydroxystyrene, the same substituents as those described above for the substituent on the α-position of the aforementioned α-substituted acrylate ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include benzoic acid in which the hydrogen atom of the carboxy group has been substituted with an organic group and may have the hydrogen atom on the α-position substituted with a substituent; and benzoic acid which has a substituent other than a hydroxy group and a carboxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

The term "styrene" is a concept including styrene and compounds in which the hydrogen atom at the α-position of styrene is substituted with other substituent such as an alkyl group and a halogenated alkyl group.

A "structural unit derived from styrene" or "structural unit derived from a styrene derivative" refers to a structural unit that is formed by the cleavage of the ethylenic double bond of styrene or a styrene derivative.

As the alkyl group as a substituent on the α-position, a linear or branched alkyl group is preferable, and specific examples include alkyl groups of 1 to 5 carbon atoms, such as a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group of 1 to 5 carbon atoms as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

<<Resist Composition>>

The resist composition of the present invention is a resist composition which generates acid upon exposure and exhibits changed solubility in a developing solution under action of acid, the resist composition including a base component (A) which exhibits changed solubility in a developing solution under action of acid (hereafter, referred to as "component (A)") and an acid generator component (B) which generates acid upon exposure (hereafter, referred to as "component (B)").

When a resist film is formed using the resist composition and the formed resist film is subjected to a selective exposure, acid is generated from the component (B) at exposed portions, and the generated acid acts on the component (A) to change the solubility of the component (A) in a developing solution, whereas the solubility of the component (A) in a developing solution is not changed at unexposed portions, thereby generating difference in solubility in a developing solution between exposed portions and unexposed portions. Therefore, by subjecting the resist film to development, the exposed portions are dissolved and removed to form a positive-tone resist pattern in the case of a positive resist, whereas the unexposed portions are dissolved and removed to form a negative-tone resist pattern in the case of a negative resist.

In the present specification, a resist composition which forms a positive resist pattern by dissolving and removing the exposed portions is called a positive resist composition, and a resist composition which forms a negative resist pattern by dissolving and removing the unexposed portions is called a negative resist composition.

The resist composition of the present invention may be either a positive resist composition or a negative resist composition.

Further, in the formation of a resist pattern, the resist composition of the present invention can be applied to an alkali developing process using an alkali developing solution in the developing treatment, or a solvent developing process using a developing solution containing an organic solvent (organic developing solution) in the developing treatment.

<Base Component: Component (A)>

In the present invention, the term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed.

The organic compound used as the base component is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. Hereafter, a "resin" or a "polymeric compound" refers to a polymer having a molecular weight of 1,000 or more.

As the molecular weight of the polymer, the weight average molecular weight in terms of the polystyrene equivalent value determined by gel permeation chromatography (GPC) is used.

The component (A) used in the resist composition of the present invention includes a polymeric compound (A1) (hereafter, referred to as "component (A1)") which has a structural unit (a0) containing an acid decomposable group that exhibits increased polarity by the action of acid and a lactone-containing cyclic group, an —$SO_2$— containing cyclic group or a carbonate-containing cyclic group.

As the component (A), at least the component (A1) is used, and a polymeric compound and/or a low molecular weight compound may be used in combination with the component (A1).

[Component (A1)]

The component (A1) is a polymeric compound having a structural unit (a0) containing an acid decomposable group that exhibits increased polarity by the action of acid and a lactone-containing cyclic group, an —$SO_2$— containing cyclic group or a carbonate-containing cyclic group.

(Structural Unit (a0))

The structural unit (a0) is a structural unit containing an acid decomposable group that exhibits increased polarity by the action of acid and a lactone-containing cyclic group, an —$SO_2$— containing cyclic group or a carbonate-containing cyclic group. When the component (A1) is used for forming a resist film, the cyclic group contributes to improvement in the adhesion between the resist film and the substrate.

In the structural unit (a0), the term "lactone-containing cyclic group" refers to a cyclic group including a ring containing a —O—C(=O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

The lactone-containing cyclic group for the structural unit (a0) is not particularly limited, and an arbitrary structural unit may be used. Specific examples include groups represented by general formulae (a0-r-1) to (a0-r-7) shown below. In the formulae, "*" represents a valence bond (the same applies hereafter).

[Chemical Formula 1]

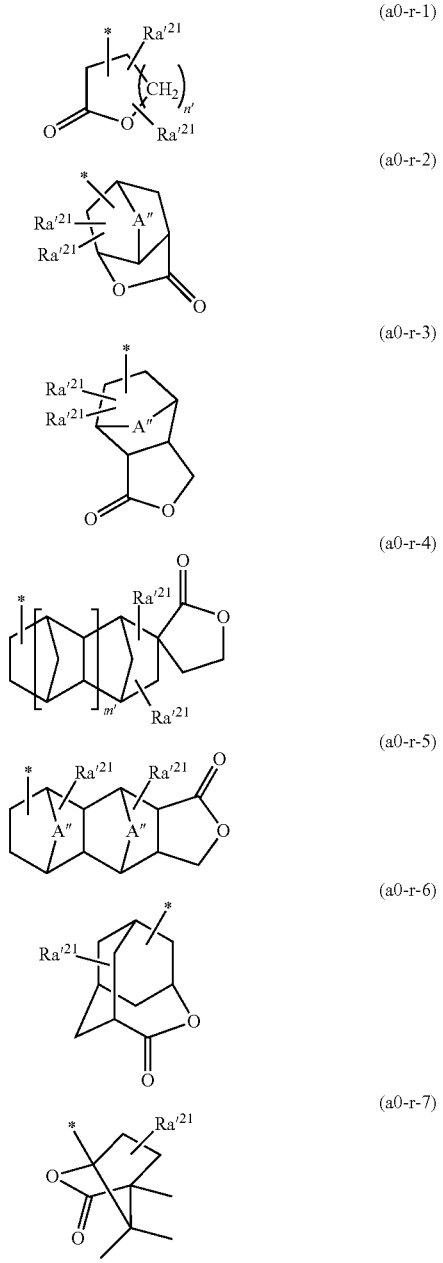

In the formulae, each $Ra'^{21}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom (—O—), a sulfur atom (—S—) or an alkylene group of 1 to 5 carbon atoms which may contain an oxygen atom or a sulfur atom; n' represents an integer of 0 to 2; and m' represents 0 or 1.

In formulae (a0-r-1) to (a0-r-7), the alkyl group for $Ra'^{21}$ is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

The alkoxy group for $Ra'^{21}$ is preferably an alkoxy group of 1 to 6 carbon atoms.

Further, the alkoxy group is preferably a linear or branched alkoxy group. Specific examples of the alkoxy groups include the aforementioned alkyl groups for $Ra'^{21}$ having an oxygen atom (—O—) bonded thereto.

As examples of the halogen atom for $Ra'^{21}$, a fluorine atom, chlorine atom, bromine atom and iodine atom can be given. Among these, a fluorine atom is preferable.

Examples of the halogenated alkyl group for $Ra'^{21}$ include groups in which part or all of the hydrogen atoms within the aforementioned alkyl groups has been substituted with the aforementioned halogen atoms. As the halogenated alkyl group, a fluorinated alkyl group is preferable, and a perfluoroalkyl group is particularly desirable.

With respect to —COOR" and —OC(=O)R" for $Ra'^{21}$, R" represents a hydrogen atom or an alkyl group.

The alkyl group for R" may be linear, branched or cyclic, and preferably has 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for $Ra'^{21}$ preferably has 1 to 6 carbon atoms, and specific examples thereof include the aforementioned alkyl groups for the substituent in which at least one hydrogen atom has been substituted with a hydroxy group.

In formulae (a0-r-2), (a0-r-3) and (a0-r-5), as the alkylene group of 1 to 5 carbon atoms represented by A", a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$— and —CH$_2$—S—CH$_2$—. As A", an alkylene group of 1 to 5 carbon atoms or —O— is preferable, more preferably an alkylene group of 1 to 5 carbon atoms, and most preferably a methylene group.

Specific examples of the groups represented by the aforementioned general formulae (a0-r-1) to (a0-r-7) are shown below.
[Chemical Formula 2]
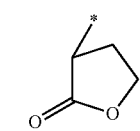
(r-Ic-1-1)
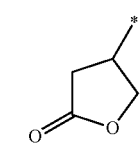
(r-Ic-1-2)
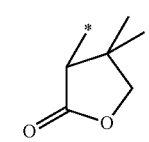
(r-Ic-1-3)
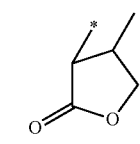
(r-Ic-1-4)
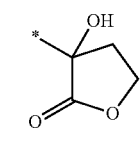
(r-Ic-1-5)
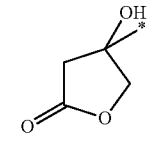
(r-Ic-1-6)
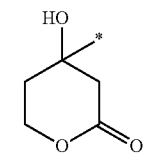
(r-Ic-1-7)
(r-Ic-2-1)
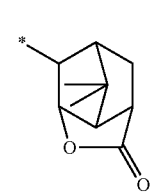
(r-Ic-2-2)
-continued
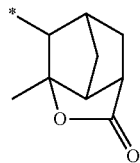
(r-Ic-2-3)
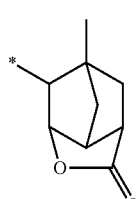
(r-Ic-2-4)
(r-Ic-2-5)
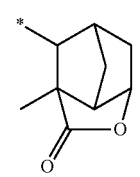
(r-Ic-2-6)
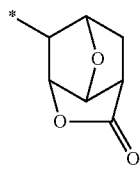
(r-Ic-2-7)
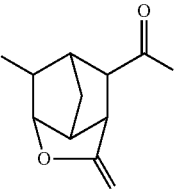
(r-Ic-2-8)
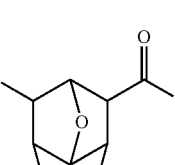
(r-Ic-2-9)
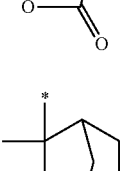
(r-Ic-2-10)
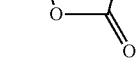

(r-Ic-2-11)
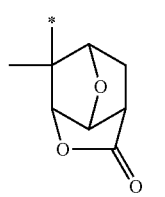
(r-Ic-2-12)
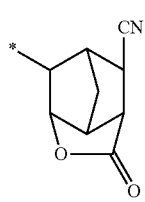
(r-Ic-2-13)
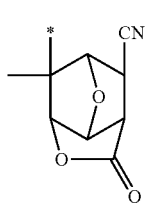
(r-Ic-3-1)
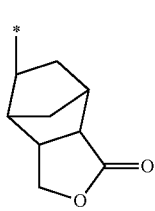
(r-Ic-3-2)
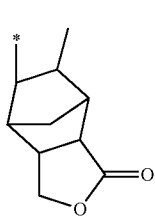
(r-Ic-3-3)
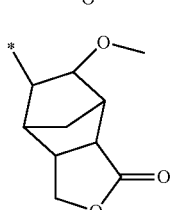
(r-Ic-3-4)
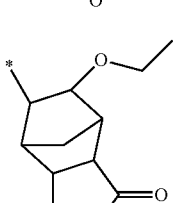
(r-Ic-3-5)
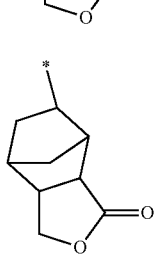
[Chemical Formula 3]
(r-Ic-4-1)
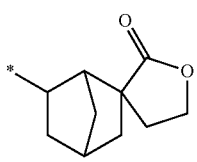
(r-Ic-4-2)
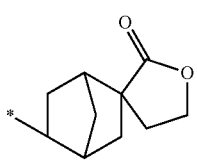
(r-Ic-4-3)
(r-Ic-4-4)
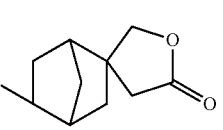
(r-Ic-4-5)
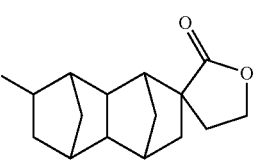
(r-Ic-4-6)
(r-Ic-4-7)
(r-Ic-4-8)
(r-Ic-4-9)
(r-Ic-5-1)
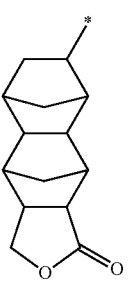

(r-Ic-5-2)

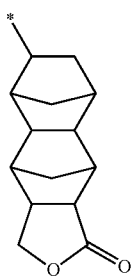

(r-Ic-5-3)

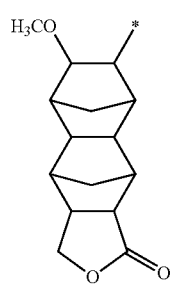

(r-Ic-5-4)

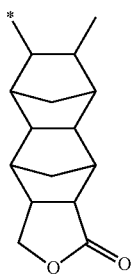

(r-Ic-6-1)

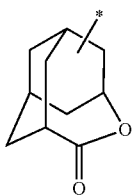

(r-Ic-7-1)

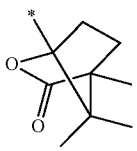

In the structural unit (a0), an "—SO$_2$— containing cyclic group" refers to a cyclic group having a ring containing —SO$_2$— within the ring structure thereof, i.e., a cyclic group in which the sulfur atom (S) within —SO$_2$— forms part of the ring skeleton of the cyclic group. The ring containing —SO$_2$— within the ring skeleton thereof is counted as the first ring. A cyclic group in which the only ring structure is the ring that contains —SO$_2$— in the ring skeleton thereof is referred to as a monocyclic group, and a group containing other ring structures is described as a polycyclic group regardless of the structure of the other rings. The —SO$_2$— containing cyclic group may be either a monocyclic group or a polycyclic group.

As the —SO$_2$— containing cyclic group, a cyclic group containing —O—SO$_2$— within the ring skeleton thereof, i.e., a cyclic group containing a sultone ring in which —O—S— within the —O—SO$_2$— group forms part of the ring skeleton thereof is particularly desirable.

More specific examples of the —SO$_2$— containing cyclic group include groups represented by general formulas (a0-r-8) to (a0-r-11) shown below.

[Chemical Formula 4]

(a0-r-8)

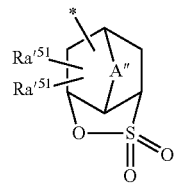

(a0-r-9)

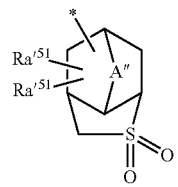

(a0-r-10)

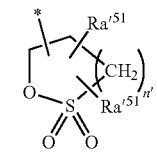

(a0-r-11)

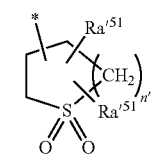

In the formulae, each $Ra'^{51}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms which may contain an oxygen atom or a sulfur atom; and n' represents an integer of 0 to 2.

In formulae (a0-r-8) and (a0-r-9), A" is the same as defined for A" in the aforementioned formulae (a0-r-2), (a0-r-3) and (a0-r-5).

In formulae (a0-r-8) to (a0-r-11), examples of the alkyl group, alkoxy group, halogen atom, halogenated alkyl group, —COOR", —OC(=O)R" and hydroxyalkyl group for $Ra'^{51}$ include the same groups as those described above in the explanation of $Ra'^{21}$ in the general formulae (a0-r-1) to (a0-r-7).

Specific examples of the groups represented by the aforementioned general formulae (a0-r-8) to (a0-r-11) are shown below. In the formulae shown below, "Ac" represents an acetyl group.

[Chemical Formula 5]
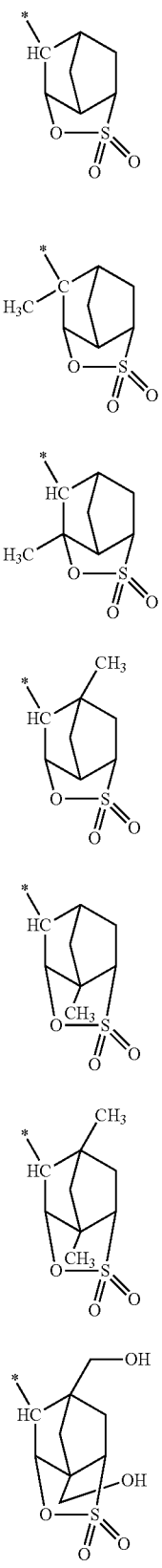
(r-s1-1-1)
(r-s1-1-2)
(r-s1-1-3)
(r-s1-1-4)
(r-s1-1-5)
(r-s1-1-6)
(r-s1-1-7)
-continued
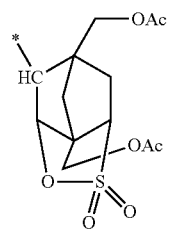 (r-s1-1-8)
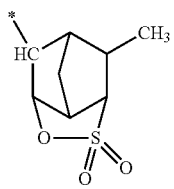 (r-s1-1-9)
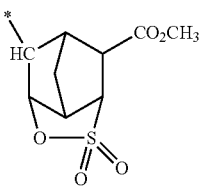 (r-s1-1-10)
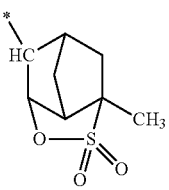 (r-s1-1-11)
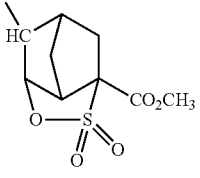 (r-s1-1-12)
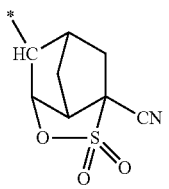 (r-s1-1-13)
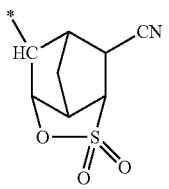 (r-s1-1-14)
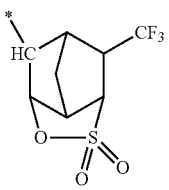 (r-s1-1-15)

(r-s1-1-16) 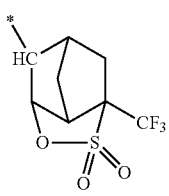
(r-s1-1-17) 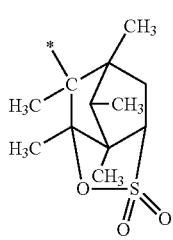
(r-s1-1-18) 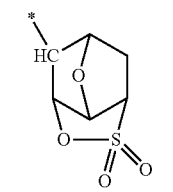
(r-s1-1-19) 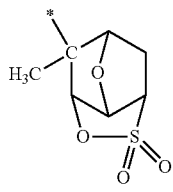
(r-s1-1-20) 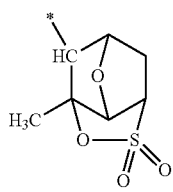
(r-s1-1-21) 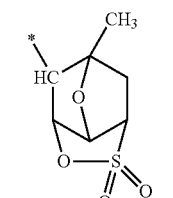
[Chemical Formula 6]
(r-s1-1-22) 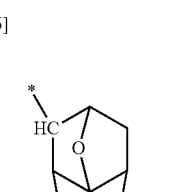
(r-s1-1-23) 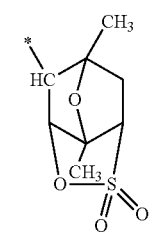
(r-s1-1-24) 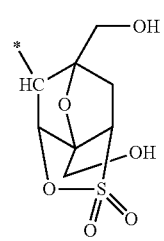
(r-s1-1-25) 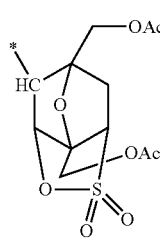
(r-s1-1-26) 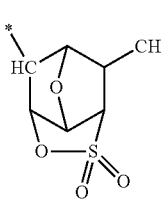
(r-s1-1-27) 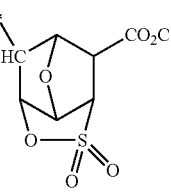
(r-s1-1-28) 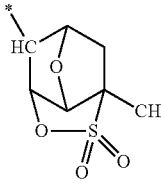
(r-s1-1-29) 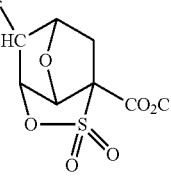

-continued

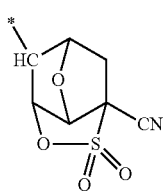
(r-s1-1-30)

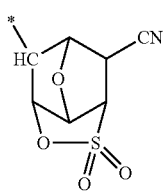
(r-s1-1-31)

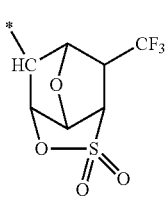
(r-s1-1-32)

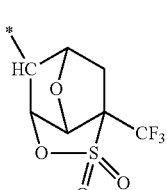
(r-s1-1-33)

[Chemical Formula 7]

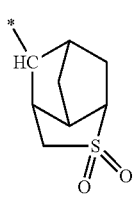
(r-s1-2-1)

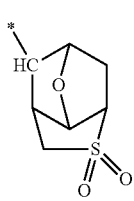
(r-s1-2-2)

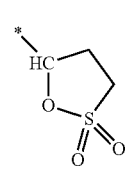
(r-s1-3-1)

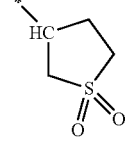
(r-s1-4-1)

The term "carbonate-containing cyclic group" refers to a cyclic group including a ring containing a —O—C(=O)—O— structure (carbonate ring). The term "carbonate ring" refers to a single ring containing a —O—C(=O)—O— structure, and this ring is counted as the first ring. A carbonate-containing cyclic group in which the only ring structure is the carbonate ring is referred to as a monocyclic group, and groups containing other ring structures are described as polycyclic groups regardless of the structure of the other rings. The carbonate-containing cyclic group may be either a monocyclic group or a polycyclic group.

The carbonate-containing cyclic group is not particularly limited, and an arbitrary group may be used. Specific examples include groups represented by general formulae (a0-r-12) to (a0-r-14) shown below.

[Chemical Formula 8]

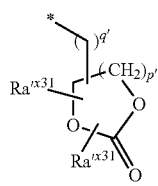
(a0-r-12)

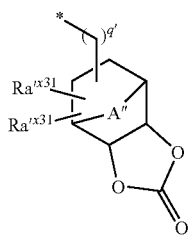
(a0-r-13)

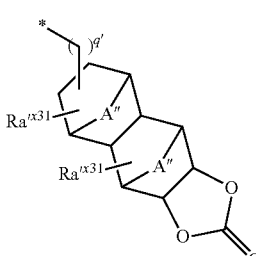
(a0-2-14)

In the formulae, each $Ra'^{x31}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms which may contain an oxygen atom or a sulfur atom; and q' represents 0 or 1.

In formulae (a0-r-13) and (a0-r-14), A" is the same as defined for A" in the aforementioned formulae (a0-r-2), (a0-r-3) and (a0-r-5).

In formulae (a0-r-12) to (a0-r-14), examples of the alkyl group, alkoxy group, halogen atom, halogenated alkyl group, —COOR", —OC(=O)R" and hydroxyalkyl group for $Ra'^{x31}$ include the same groups as those described above in the explanation of $Ra'^{21}$ in the general formulae (a0-r-1) to (a0-r-7).

Specific examples of the groups represented by the aforementioned general formulae (a0-r-12) to (a0-r-14) are shown below.

[Chemical Formula 9]
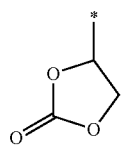 (r-cr-1-1)
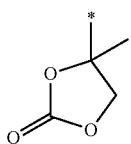 (r-cr-1-2)
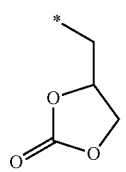 (r-cr-1-3)
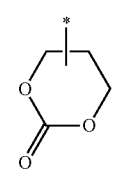 (r-cr-1-4)
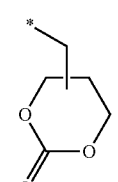 (r-cr-1-5)
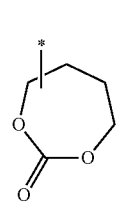 (c-cr-1-6)
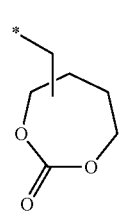 (r-cr-1-6)
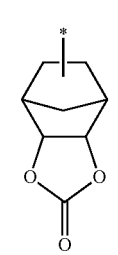 (r-cr-2-1)
-continued
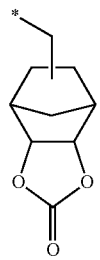 (r-cr-2-2)
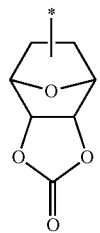 (r-cr-2-3)
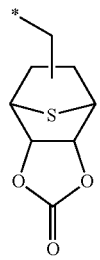 (r-cr-2-4)
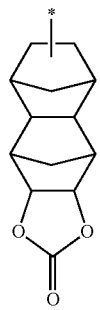 (r-cr-3-1)
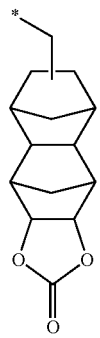 (r-cr-3-2)

(r-cr-3-3)

(r-cr-3-4)

(r-cr-3-5)

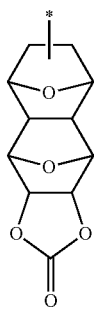

In the structural unit (a0), the term "acid decomposable group" refers to a group in which at least a part of the bond within the structure thereof is cleaved by the action of an acid.

Examples of acid decomposable groups which exhibit increased polarity by the action of an acid include groups which are decomposed by the action of an acid to form a polar group.

Examples of the polar group include a carboxy group, a hydroxy group, an amino group and a sulfo group (—SO₃H). Among these, a polar group containing —OH in the structure thereof (hereafter, referred to as "OH-containing polar group") is preferable, a carboxy group or a hydroxy group is more preferable, and a carboxy group is particularly desirable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

The "acid dissociable group" refers to both (i) a group in which the bond between the acid dissociable group and the adjacent atom is cleaved by the action of acid; and (ii) a group in which one of the bonds is cleaved by the action of acid, and then a decarboxylation reaction occurs, thereby cleaving the bond between the acid dissociable group and the adjacent atom.

It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A1) is increased. By the increase in the polarity, the solubility in an alkali developing solution changes, and the solubility in an alkali developing solution is relatively increased, whereas the solubility in an organic developing solution is relatively decreased.

In the present invention, in the structural unit (a0), the acid decomposable group preferably has a structure containing the lactone-containing cyclic group, the —SO₂— containing cyclic group or the carbonate-containing cyclic group. As a result, an excellent dissolution contrast can be obtained between the exposed portions and unexposed portions. Among these examples, in the structural unit (a0), it is more preferable that the acid decomposable group has a structure containing the lactone-containing cyclic group or the —SO₂— containing cyclic group.

Specific examples of the acid decomposable group include groups in which the aforementioned polar group is protected with an acid dissociable group shown below.

In the structural unit (a0), as the acid dissociable group constituting the acid decomposable group, for example, an acid dissociable group represented by general formula (a0-r-100) shown below which protects a carboxy group or a hydroxy group as a polar group can be mentioned.

[Chemical Formula 10]

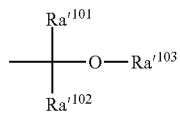

(a0-r-100)

In the formula, $Ra'_{101}$ and $Ra'^{102}$ represents a hydrogen atom or an alkyl group; and $Ra'^{103}$ represents a lactone-containing cyclic group, an —SO₂— containing cyclic group or a carbonate-containing cyclic group.

In the formula (a0-r-100), it is preferable that at least one of $Ra'^{101}$ and $Ra'^{102}$ represents a hydrogen atom, and it is more preferable that both of $Ra'^{101}$ and $Ra'^{102}$ represent a hydrogen atom.

In the case where $Ra'^{101}$ or $Ra'^{102}$ is an alkyl group, as the alkyl group, the same alkyl groups as those described above the for the substituent which may be bonded to the carbon atom on the α-position of the aforementioned α-substituted acrylate ester can be mentioned, and an alkyl group of 1 to 5 carbon atoms is preferable.

Specific examples include linear or branched alkyl groups. Specific examples of the alkyl group include a methyl group, an ethyl group, a propyl group, an isopropyl group, an n-butyl group, an isobutyl group, a tert-butyl group, a pentyl group, an isopentyl group and a neopentyl group. Of these, a methyl group or an ethyl group is preferable, and a methyl group is particularly preferable.

Examples of the acid dissociable group for protecting the carboxy group as a polar group include the acid dissociable group represented by general formula (a0-r-200) shown below.

[Chemical Formula 11]

(a0-r-200)

In the formula, $Ra'^{104}$ and $Ra'^{105}$ each independently represents a hydrocarbon group, and $Ra'^{106}$ a lactone-containing cyclic group, an —$SO_2$— containing cyclic group or a carbonate-containing cyclic group; or $Ra'^{104}$ represents a hydrocarbon group, and $Ra'^{105}$ and $Ra'^{106}$ are mutually bonded to form a lactone-containing cyclic group, an —$SO_2$— containing cyclic group or a carbonate-containing cyclic group.

Examples of the hydrocarbon group for $Ra'^{104}$ and $Ra'^{105}$ include a linear or branched alkyl group and a cyclic hydrocarbon group.

The linear alkyl group preferably has 1 to 10 carbon atoms, more preferably 1 to 5 carbon atoms, still more preferably 1 to 4 carbon atoms, and most preferably 1 or 2 carbon atoms. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5. Specific examples include an isopropyl group, an isobutyl group, a tert-butyl group, an isopentyl group, a neopentyl group a 1,1-diethylpropyl group and a 2,2-dimethylbutyl group. Among these, an isopropyl group is preferable.

In the case where $Ra'^{104}$ or $Ra'^{105}$ represents a cyclic hydrocarbon group, the hydrocarbon group may be aliphatic or aromatic, and may be polycyclic or monocyclic.

As the monocyclic aliphatic hydrocarbon group, a group in which 1 hydrogen atom has been removed from a monocycloalkane is preferable. The monocycloalkane preferably has 3 to 6 carbon atoms, and specific examples thereof include cyclopentane and cyclohexane.

As the polycyclic group, a group in which 1 hydrogen atom has been removed from a polycycloalkane is preferable, and the polycyclic group preferably has 7 to 12 carbon atoms. Examples of the polycycloalkane include adamantane, norbornane, isobornane, tricyclodecane and tetracyclododecane.

In the case where the hydrocarbon group the cyclic hydrocarbon group for $Ra'^{104}$ or $Ra'^{105}$ is an aromatic hydrocarbon group, examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which 1 hydrogen atom has been removed from the aforementioned aromatic hydrocarbon ring (aryl group); and a group in which 1 hydrogen atom of the aforementioned aryl group has been substituted with an alkylene group (an arylalkyl group such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atom, more preferably 1 or 2, and most preferably 1.

Among these examples, as the hydrocarbon group for $Ra'^{104}$ and $Ra'^{105}$, a linear or branched alkyl group is preferable, and an alkyl group of 1 to 5 carbon atoms is most preferable.

More specifically, as the acid dissociable group represented by general formula (a0-r-200), in the case where $Ra'^{105}$ and $Ra'^{106}$ are mutually bonded to form a ring, a group represented by general formula (a0-r-201) shown below can be mentioned. On the other hand, in the case where $Ra'^{105}$ and $Ra'^{106}$ are not mutually bonded, a group represented by general formula (a0-r-202) shown below can be mentioned.

[Chemical Formula 12]

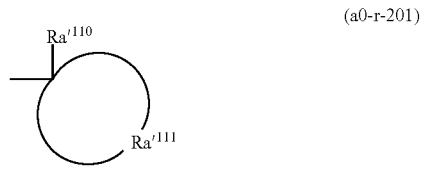

(a0-r-201)

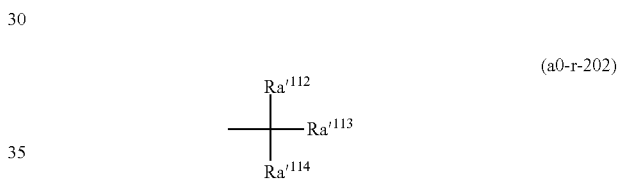

(a0-r-202)

In the formulae, $Ra'^{110}$ represents an alkyl group of 1 to 10 carbon atoms; $Ra'^{111}$ represents a group which forms a lactone-containing cyclic group, an —$SO_2$— containing cyclic group or a carbonate-containing cyclic group together with the carbon atom having $Ra'^{110}$ bonded; $Ra'^{112}$ and $Ra'^{114}$ each independently represents a hydrocarbon group; and $Ra'^{113}$ represents a lactone-containing cyclic group, an —$SO_2$— containing cyclic group or a carbonate-containing cyclic group.

In formula (a0-r-201), the alkyl group of 1 to 10 carbon atoms for $Ra'^{110}$ is preferably a linear or branched alkyl group, and most preferably a linear or branched alkyl group of 1 to 5 carbon atoms. As the group formed by $Ra'^{111}$ with the carbon atom bonded to $Ra'^{110}$, a lactone-containing cyclic group or an —$SO_2$— containing cyclic group is preferable.

In formula (a0-r-202), it is preferable that $Ra'^{112}$ and $Ra'^{114}$ each independently represents an alkyl group of 1 to 10 carbon atoms. The alkyl group is more preferably a linear or branched alkyl group, still more preferably a linear alkyl group of 1 to 5 carbon atoms, and most preferably a methyl group or an ethyl group.

As $Ra'^{113}$, a lactone-containing cyclic group, an —$SO_2$— containing cyclic group is preferable.

Specific examples of the group represented by the aforementioned formula (a0-r-100) are shown below.

[Chemical Formula 13]

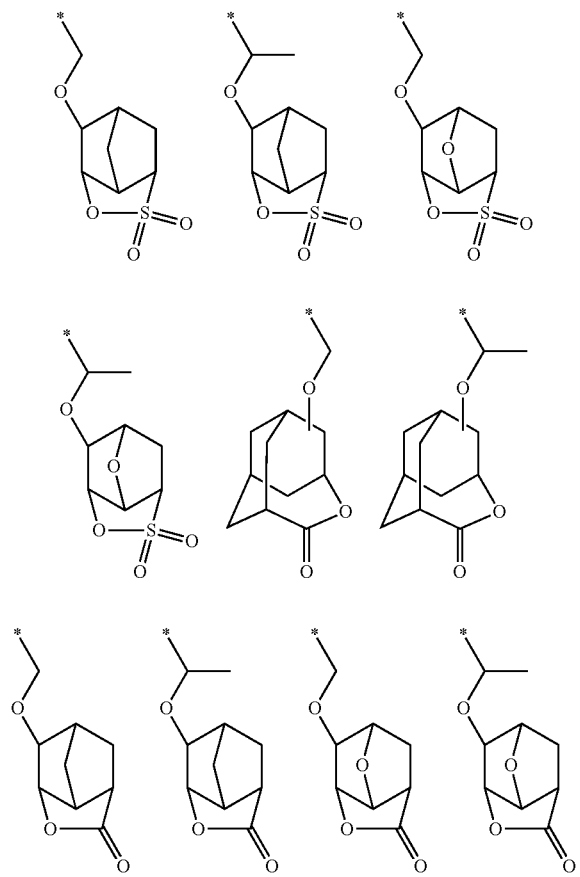

Specific examples of the group represented by the aforementioned formula (a0-r-201) are shown below.

[Chemical Formula 14]

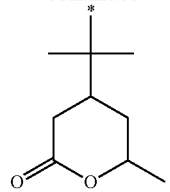

Specific examples of the group represented by the aforementioned formula (a0-r-202) are shown below.

[Chemical Formula 15]

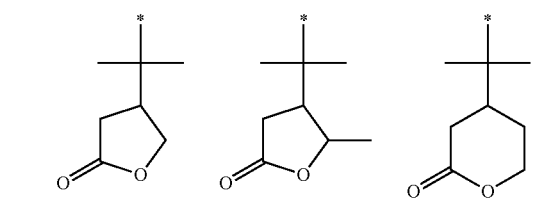

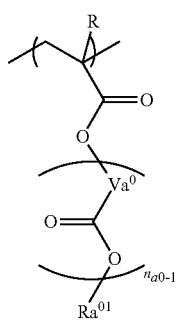

Examples of the structural unit (a0) include a structural unit derived from an acrylate ester which may have the hydrogen atom bonded to the carbon atom on the α-position substituted with a substituent and contains an acid decomposable group which exhibits increased polarity by the action of acid; a structural unit derived from an acrylamide which contains an acid decomposable group which exhibits increased polarity by the action of acid; a structural unit derived from hydroxystyrene or a hydroxystyrene derivative in which at least a part of the hydrogen atom of the hydroxy group is protected with a substituent containing an acid decomposable group; and a structural unit derived from vinylbenzoic acid or a vinylbenzoic acid derivative in which at least a part of the hydrogen atom within —C(=O)—OH is protected with a substituent containing an acid decomposable group.

As the structural unit (a0), a structural unit derived from an acrylate ester which may have the hydrogen atom bonded to the carbon atom on the α-position substituted with a substituent is preferable.

Specific examples of preferable structural units for the structural unit (a0) include structural units represented by general formula (a0-1) shown below.

[ChemicaL Formula 16]

(a0-1)

In the formula, R represents a hydrogen atom, an alkyl group of 1 to 5 carbon atoms or a halogenated alkyl group of 1 to 5 carbon atoms; $Va^0$ represents a divalent hydrocarbon group which may contain an ether bond; $n_{a01}$ each independently represents an integer of 0 to 2; and $Ra^{01}$ represents an acid dissociable group represented by the aforementioned formula (a0-r-100) or (a0-r-200).

In the aforementioned formula (a0-1), as the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms represented by R is a group in which part or all of the hydrogen atoms of the aforementioned alkyl group of 1 to 5 carbon atoms have been substituted with halogen atoms.

Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

The hydrocarbon group for $Va^0$ may be either an aliphatic hydrocarbon group or an aromatic hydrocarbon group. An "aliphatic hydrocarbon group" refers to a hydrocarbon group that has no aromaticity. The aliphatic hydrocarbon group as the divalent hydrocarbon group for $Va^0$ may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

In addition, $Va^0$ may have an ether bond (—O—) between carbon atoms of the divalent hydrocarbon group. $Va^0$ may have 1 ether bond present, or 2 or more ether bonds present.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—CH$_2$—], an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—].

As the branched aliphatic hydrocarbon group, branched alkylene groups are preferred, and specific examples include various alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)CH$_2$CH$_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. As the alkyl group within the alkylalkylene group, a linear alkyl group of 1 to 5 carbon atoms is preferable.

As examples of the hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a polycyclic group or a monocyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane.

As the polycyclic group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aromatic hydrocarbon group is a hydrocarbon group having an aromatic ring.

The aromatic hydrocarbon group as the divalent hydrocarbon group for $Va^0$ preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which two hydrogen atoms have been removed from the aforementioned aromatic hydrocarbon ring (arylene group); and a group in which one hydrogen atom has been removed from the aforementioned aromatic hydrocarbon ring (aryl group) and one hydrogen atom thereof has been substituted with an alkylene group (for example, a group in which one hydrogen atom has been removed from an aryl group within an arylalkyl group such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atom, more preferably 1 or 2, and most preferably 1.

Specific examples of structural unit represented by formula (a0-1) are shown below. In the formulae shown below, $R^\alpha$ represents a hydrogen atom, a methyl group or a trifluoromethyl group.

[Chemical Formula 17]

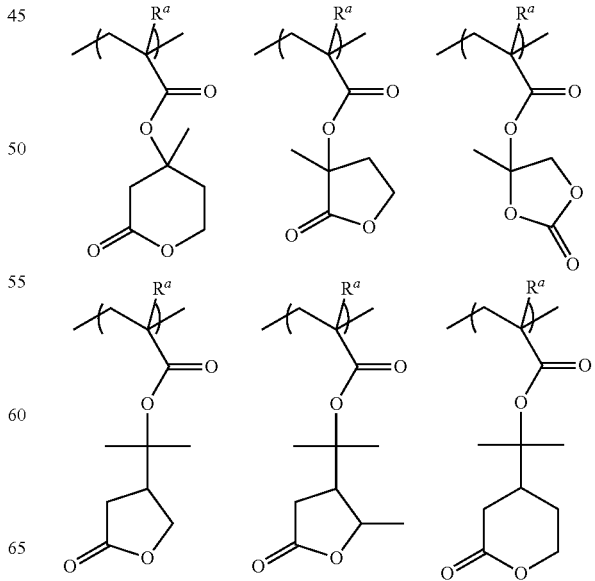

-continued

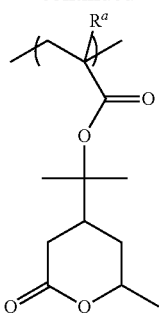

[Chemical Formula 18]

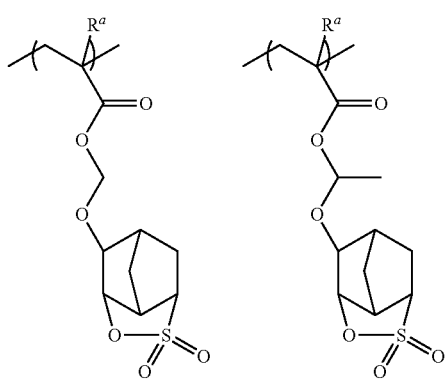

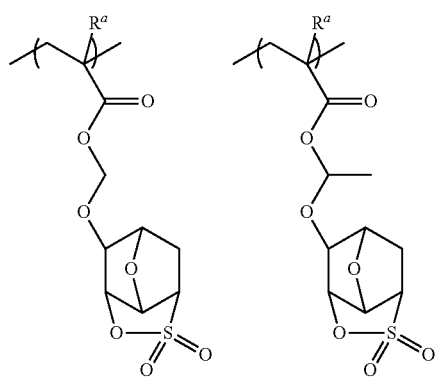

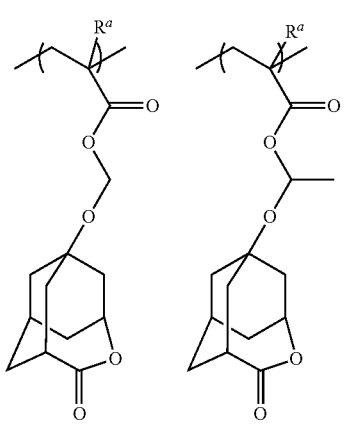

-continued

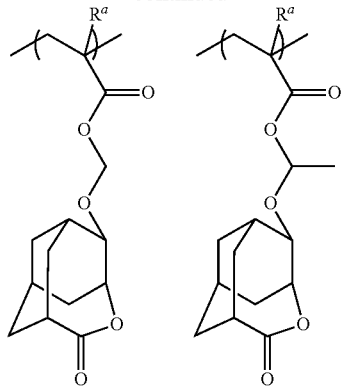

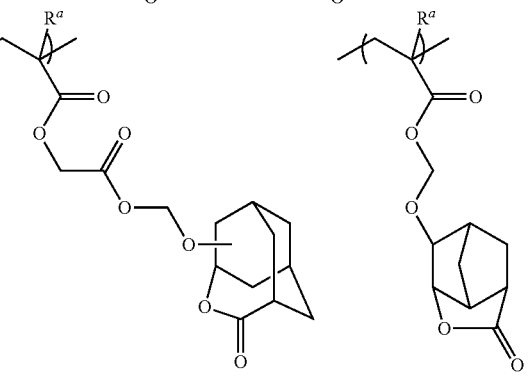

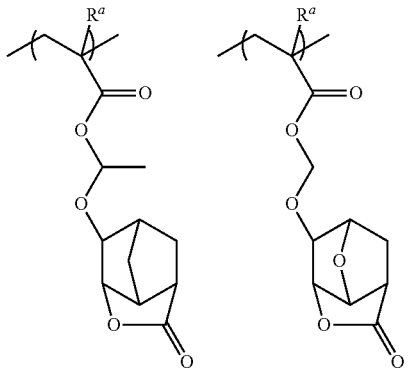

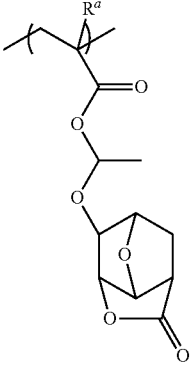

As the structural unit (a0) contained in the component (A1), 1 type of structural unit may be used, or 2 or more types may be used.

The amount of the structural unit (a0) within the component (A1) based on the combined total of all structural units constituting the component (A1) is preferably 5 to 80 mol %, more preferably 10 to 75 mol %, and still more preferably 20 to 70 mol %.

When the amount of the structural unit (a0) is at least as large as the lower limit of the above-mentioned range, various lithography properties such as reduction of roughness and mask reproducibility are improved. On the other hand, when the amount of the structural unit (a0) is no more than the upper limit of the above-mentioned range, a good balance can be achieved with the other structural units, and a resist pattern with an excellent shape can be obtained.

(Other Structural Units)

The component (A1) may be further include a structural unit other than the structural unit (a0), as well as the structural unit (a0).

As the other structural unit, any other structural unit which cannot be classified as the aforementioned structural units can be used without any particular limitation, and any of the multitude of conventional structural units used within resist resins for ArF excimer lasers or KrF excimer lasers (and particularly for ArF excimer lasers) can be used. For example, a structural units (a1), (a2), (a3) and (a4) shown below can be used.

Structural Unit (a1):

The structural unit (a1) is a structural unit which does not fall under the definition of the structural unit (a0), and contains an acid decomposable group that exhibits increased polarity by the action of acid.

In the structural unit (a1), the acid decomposable group is the same as defined for the acid decomposable group in the aforementioned structural unit (a0).

In the structural unit (a1), the acid dissociable group that constitutes the acid decomposable group is not particularly limited, and any of the groups that have been conventionally proposed as acid dissociable groups for the base resins of chemically amplified resists can be used.

Examples of the acid dissociable group for protecting the carboxy group or hydroxy group as a polar group include the acid dissociable group represented by general formula (a0-r-1) shown below (hereafter, referred to as "acetal-type acid dissociable group").

[Chemical Formula 19]

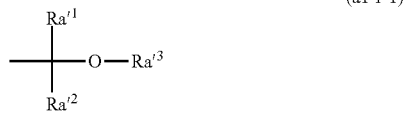

(a1-r-1)

In the formula, $Ra'^1$ and $Ra'^2$ represents a hydrogen atom or an alkyl group; and $Ra'^3$ represents a hydrocarbon group, provided that $Ra'^3$ may be bonded to $Ra'^1$ or $Ra'^2$.

In the formula (a0-r-1), it is preferable that at least one of $Ra'^1$ and $Ra'^2$ represents a hydrogen atom, and it is more preferable that both of $Ra'^1$ and $Ra'^2$ represent a hydrogen atom.

In the case where $Ra'^1$ or $Ra'^2$ is an alkyl group, as the alkyl group, the same alkyl groups as those described above the for the substituent which may be bonded to the carbon atom on the α-position of the aforementioned α-substituted acrylate ester can be mentioned, and an alkyl group of 1 to 5 carbon atoms is preferable. Specific examples include linear or branched alkyl groups. Specific examples of the alkyl group include a methyl group, an ethyl group, a propyl group, an isopropyl group, an n-butyl group, an isobutyl group, a tert-butyl group, a pentyl group, an isopentyl group and a neopentyl group. Of these, a methyl group or an ethyl group is preferable, and a methyl group is particularly preferable.

In formula (a1-r-1), examples of the hydrocarbon group for $Ra'^3$ include a linear or branched alkyl group and a cyclic hydrocarbon group.

The linear alkyl group preferably has 1 to 5 carbon atoms, more preferably 1 to 4, and still more preferably 1 or 2. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5. Specific examples include an isopropyl group, an isobutyl group, a tert-butyl group, an isopentyl group, a neopentyl group a 1,1-diethylpropyl group and a 2,2-dimethylbutyl group. Among these, an isopropyl group is preferable.

In the case where $Ra'^3$ represents a cyclic hydrocarbon group, the cyclic hydrocarbon group may be aliphatic or aromatic, and may be polycyclic or monocyclic.

As the monocyclic aliphatic hydrocarbon group, a group in which 1 hydrogen atom has been removed from a monocycloalkane is preferable. The monocycloalkane preferably has 3 to 6 carbon atoms, and specific examples thereof include cyclopentane and cyclohexane.

As the polycyclic group, a group in which 1 hydrogen atom has been removed from a polycycloalkane is preferable, and the polycyclic group preferably has 7 to 12 carbon atoms. Examples of the polycycloalkane include adamantane, norbornane, isobornane, tricyclodecane and tetracyclododecane.

In the case where the cyclic hydrocarbon group for $Ra'^3$ is an aromatic hydrocarbon group, examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which 1 hydrogen atom has been removed from the aforementioned aromatic hydrocarbon ring (aryl group); and a group in which 1 hydrogen atom of the aforementioned aryl group has been substituted with an alkylene group (an arylalkyl group such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atom, more preferably 1 or 2, and most preferably 1.

In the case where $Ra'^3$ is bonded to $Ra'^1$ or $Ra'^2$ to form a ring, the cyclic group is preferably a 4 to 7-membered ring, and more preferably a 4 to 6-membered ring. Specific examples of the cyclic group include tetrahydropyranyl group and tetrahydrofuranyl group.

Examples of the acid dissociable group for protecting the carboxy group as a polar group include the acid dissociable group represented by general formula (a1-r-2) shown below. Among the acid dissociable groups represented by general formula (a1-r-2), for convenience, a group which is constituted of alkyl groups is referred to as "tertiary ester-type acid dissociable group".

[Chemical Formula 20]

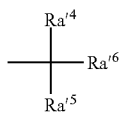
(a1-r-2)

In the formula, $Ra'^4$ to $Ra'^6$ each independently represents a hydrocarbon group, provided that $Ra'^5$ and $Ra'^6$ may be mutually bonded to form a ring.

As the hydrocarbon group for $Ra'^4$ to $Ra'^6$, the same groups as those described above for $Ra'^3$ can be mentioned.

$Ra'^4$ is preferably an alkyl group of 1 to 5 carbon atoms. In the case where $Ra'^5$ and $Ra'^6$ are mutually bonded to form a ring, a group represented by general formula (a1-r2-1) shown below can be mentioned. On the other hand, in the case where $Ra'^4$ to $Ra'^6$ are not mutually bonded and independently represent a hydrocarbon group, the group represented by general formula (a1-r2-2) shown below can be mentioned.

[Chemical Formula 21]

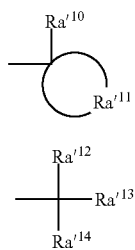

(a1-r2-1)

(a1-r2-2)

In the formulae, $Ra'^{10}$ represents an alkyl group of 1 to 10 carbon atoms; $Ra'^{11}$ is a group which forms an aliphatic cyclic group together with a carbon atom having $Ra'^{10}$ bonded thereto; and $Ra'^{12}$ to $Ra'^{14}$ each independently represents a hydrocarbon group.

In the formula (a2-r2-1), as the alkyl group of 1 to 10 carbon atoms for $Ra'^{10}$, the same groups as described above for the linear or branched alkyl group for $Ra'^3$ in the formula (a1-r-1) are preferable. In the formula (a1-r2-1), as the aliphatic cyclic group which is formed by $Ra'^{11}$ together with the carbon atom bonded to $Ra'^{10}$, the same groups as those described above for the cyclic alkyl group for $Ra'^3$ in the formula (a1-r-1) are preferable.

In the formula (a1-r2-2), it is preferable that $Ra'^{12}$ and $Ra'^{14}$ each independently represents an alkyl group or 1 to 10 carbon atoms, and it is more preferable that the alkyl group is the same group as the described above for the linear or branched alkyl group for $Ra'^3$ in the formula (a1-r-1), it is still more preferable that the alkyl group is a linear alkyl group of 1 to 5 carbon atoms, and it is particularly preferable that the alkyl group is a methyl group or an ethyl group.

In the formula (a1-r2-2), it is preferable that $Ra'^{13}$ is the same group as described above for the linear, branched or cyclic alkyl group for $Ra'^3$ in the formula (a1-r-1).

Among these, the same cyclic alkyl group as those describe above for $Ra'^3$ is more preferable.

Specific examples of the group represented by the aforementioned formula (a1-r2-1) are shown below.

[Chemical Formula 22]

(r-pr-m1)

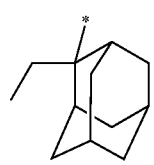
(r-pr-m2)

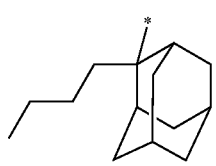
(r-pr-m3)

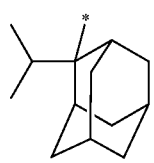
(r-pr-m4)

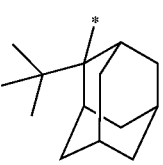
(r-pr-m5)

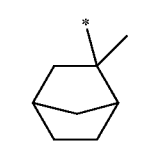
(r-pr-m6)

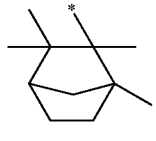
(r-pr-m7)

(r-pr-m8)

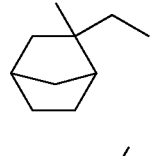
(r-pr-m9)

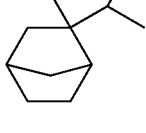
(r-pr-m10)

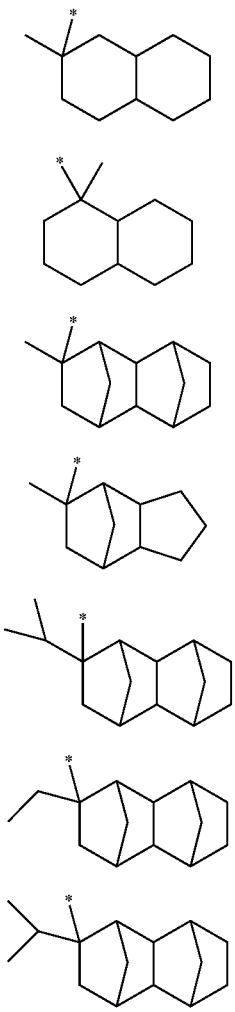
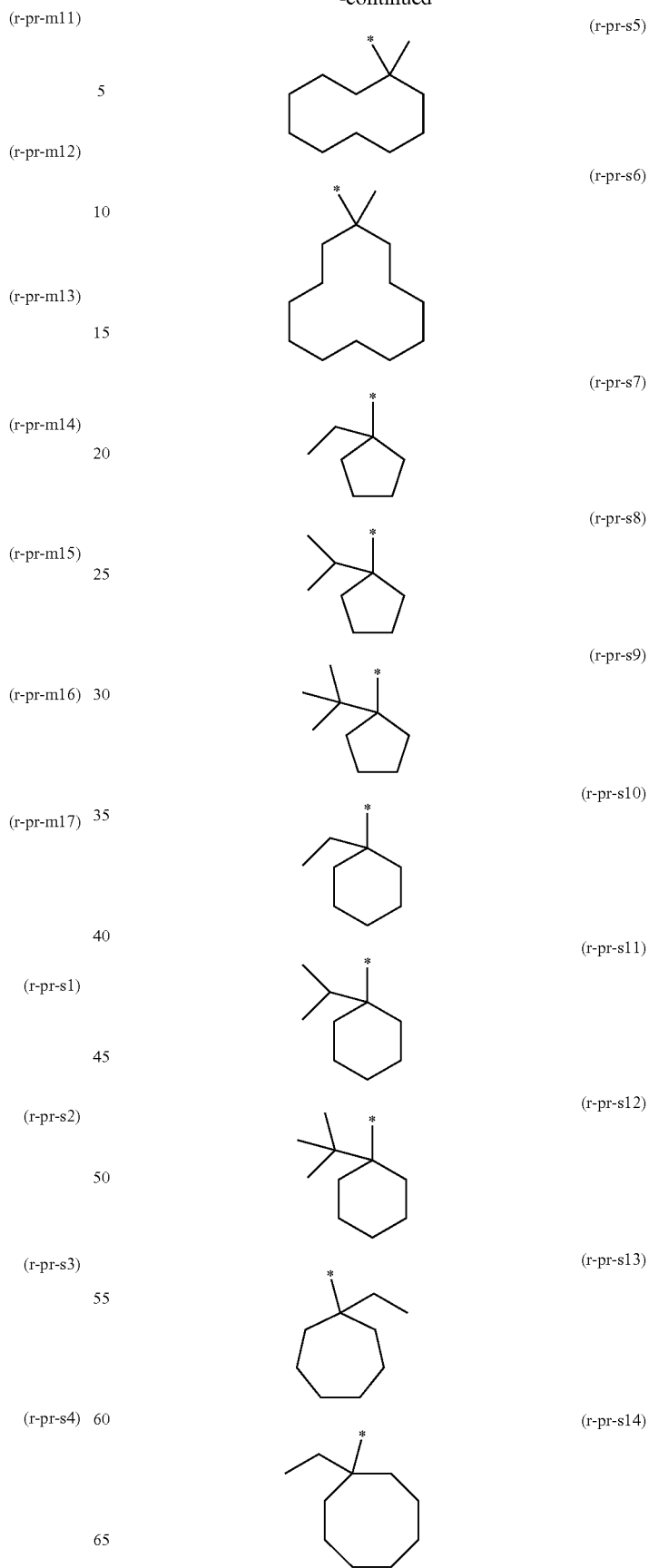

-continued
(r-pr-s15)
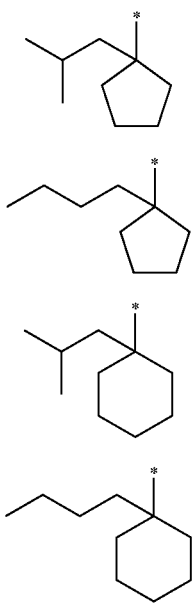
(r-pr-s16)
(r-pr-s17)
(r-pr-s18)
Specific examples of the group represented by the aforementioned formula (a1-r2-2) are shown below.
[Chemical Formula 24]
(r-pr-cm1)
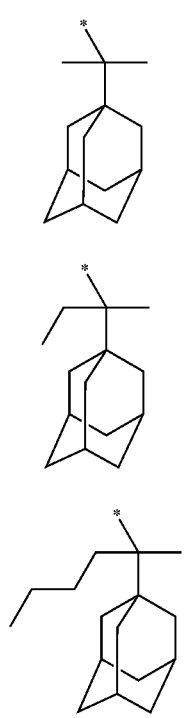
(r-pr-cm2)
(r-pr-cm3)
(r-pr-cm4)
-continued
(r-pr-cm5)
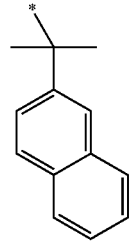
(r-pr-cm6)
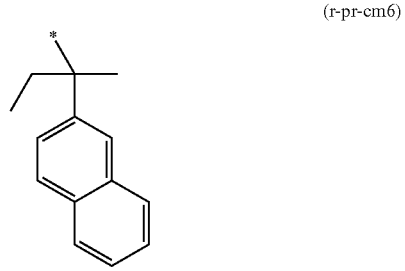
(r-pr-cm7)
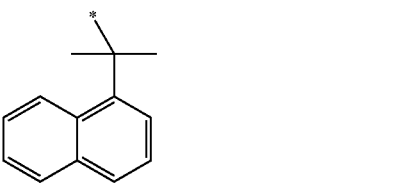
(r-pr-cm8)
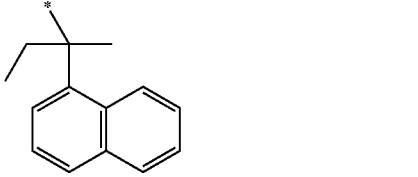
(r-pr-cs1)
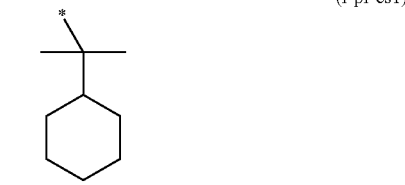
(r-pr-cs2)
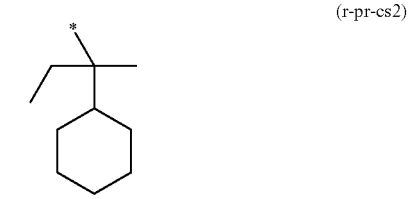
(r-pr-cs3)

-continued

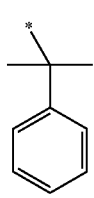
(r-pr-cs4)

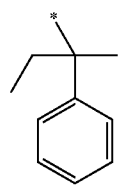
(r-pr-cs5)

(r-pr-c1)

(r-pr-c2)

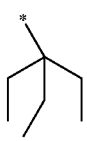
(r-pr-c3)

Examples of the acid dissociable group for protecting a hydroxy group as a polar group include the acid dissociable group represented by general formula (a1-r-3) shown below (hereafter, for convenience, referred to as "tertiary alkyloxycarbonyl-type acid dissociable group").

[Chemical Formula 25]

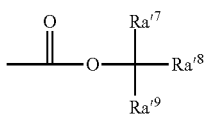
(a1-r-3)

In the formula, $Ra'^7$ to $Ra'^9$ each independently represents an alkyl group.

In the formula (a1-r-3), $Ra'^7$ to $Ra'^9$ is preferably an alkyl group of 1 to 5 carbon atoms, and more preferably an alkyl group of 1 to 3 carbon atoms.

Further, the total number of carbon atoms within the alkyl group is preferably 3 to 7, more preferably 3 to 5, and most preferably 3 or 4.

Examples of the structural unit (a1) include a structural unit derived from an acrylate ester which may have the hydrogen atom bonded to the carbon atom on the α-position substituted with a substituent and contains an acid decomposable group which exhibits increased polarity by the action of acid; a structural unit derived from an acrylamide which contains an acid decomposable group which exhibits increased polarity by the action of acid; a structural unit derived from hydroxystyrene or a hydroxystyrene derivative in which at least a part of the hydrogen atom of the hydroxy group is protected with a substituent containing an acid decomposable group; and a structural unit derived from vinylbenzoic acid or a vinylbenzoic acid derivative in which at least a part of the hydrogen atom within —C(=O)—OH is protected with a substituent containing an acid decomposable group.

As the structural unit (a1), a structural unit derived from an acrylate ester which may have the hydrogen atom bonded to the carbon atom on the α-position substituted with a substituent is preferable.

Specific examples of preferable structural units for the structural unit (a1) include structural units represented by general formula (a1-1) or (a1-2) shown below.

[Chemical Formula 26]

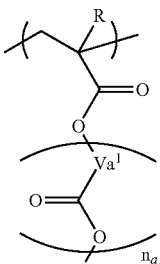
(a1-1)

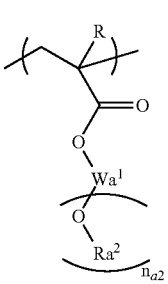
(a1-2)

In the formula, R represents a hydrogen atom, an alkyl group of 1 to 5 carbon atoms or a halogenated alkyl group of 1 to 5 carbon atoms; $Va^1$ represents a divalent hydrocarbon group which may contain an ether bond; $n_{a1}$ each independently represents an integer of 0 to 2; and $Ra^1$ represents an acid dissociable group represented by the aforementioned formula (a1-r-1) or (a1-r-2). $Wa^1$ represents a hydrocarbon group having a valency of $n_{a2}+1$; $n_{a2}$ represents an integer of 1 to 3; and $Ra^2$ represents an acid dissociable group represented by the aforementioned formula (a1-r-1) or (a1-r-3).

In the aforementioned formula (a1-1), as the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In formula (a1-1), the hydrocarbon group for $Va^1$ is the same as defined for the hydrocarbon group for $Va^0$ described above in relation to formula (a0-1).

In the aforementioned formula (a1-2), the hydrocarbon group for $Wa^1$ having a valency of $n_{a2}+1$ may be either an aliphatic hydrocarbon group or an aromatic hydrocarbon group. The aliphatic cyclic group refers to a hydrocarbon group that has no aromaticity, and may be either saturated or unsaturated, but is preferably saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof.

The valency of $n_{a2}+1$ is preferably divalent, trivalent or tetravalent, and divalent or trivalent is more preferable.

Specific examples of structural unit represented by formula (a1-1) are shown below. In the formulae shown below, $R^\alpha$ represents a hydrogen atom, a methyl group or a trifluoromethyl group.

[Chemical Formula 27]

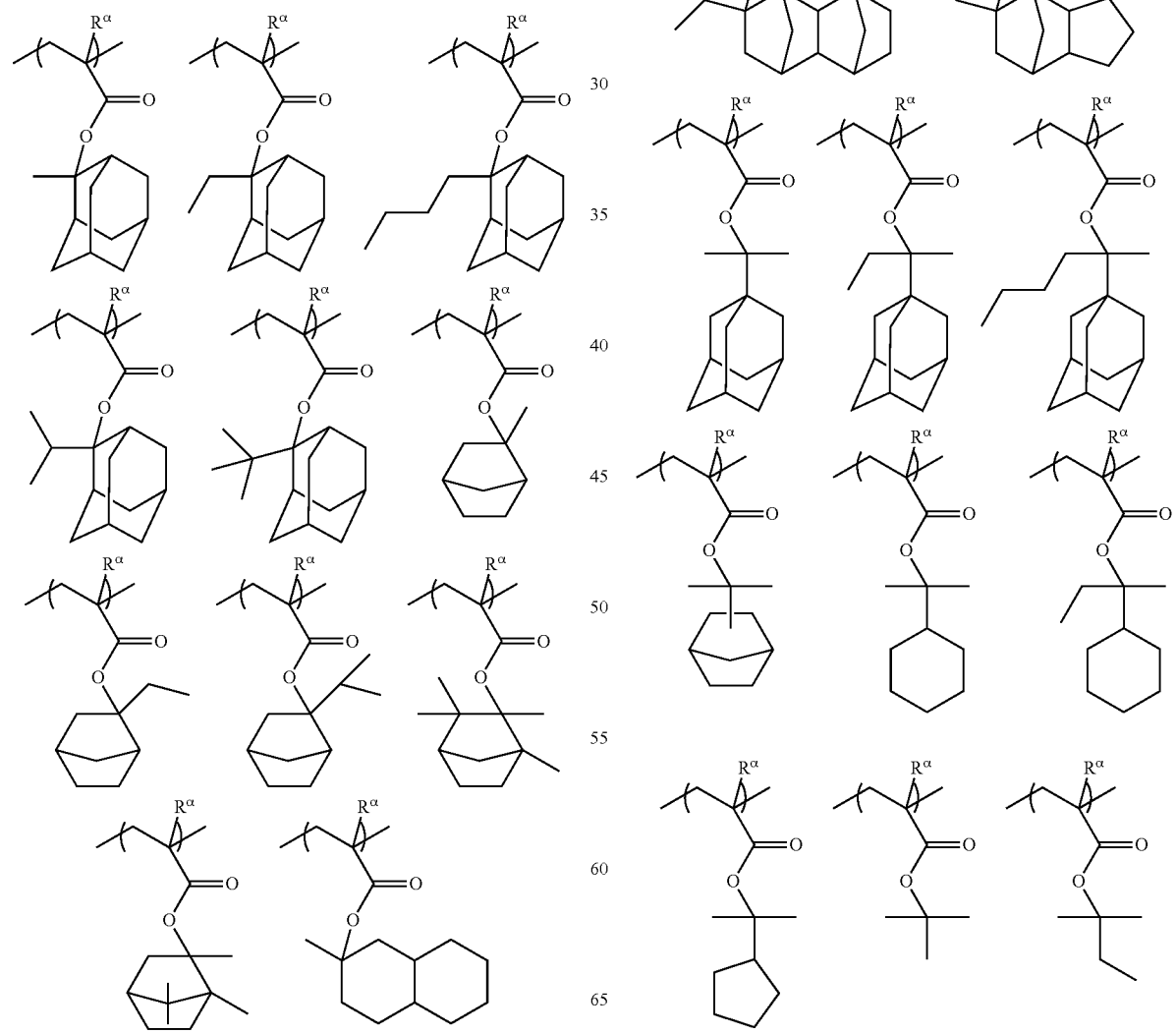

-continued

[Chemical Formula 28]
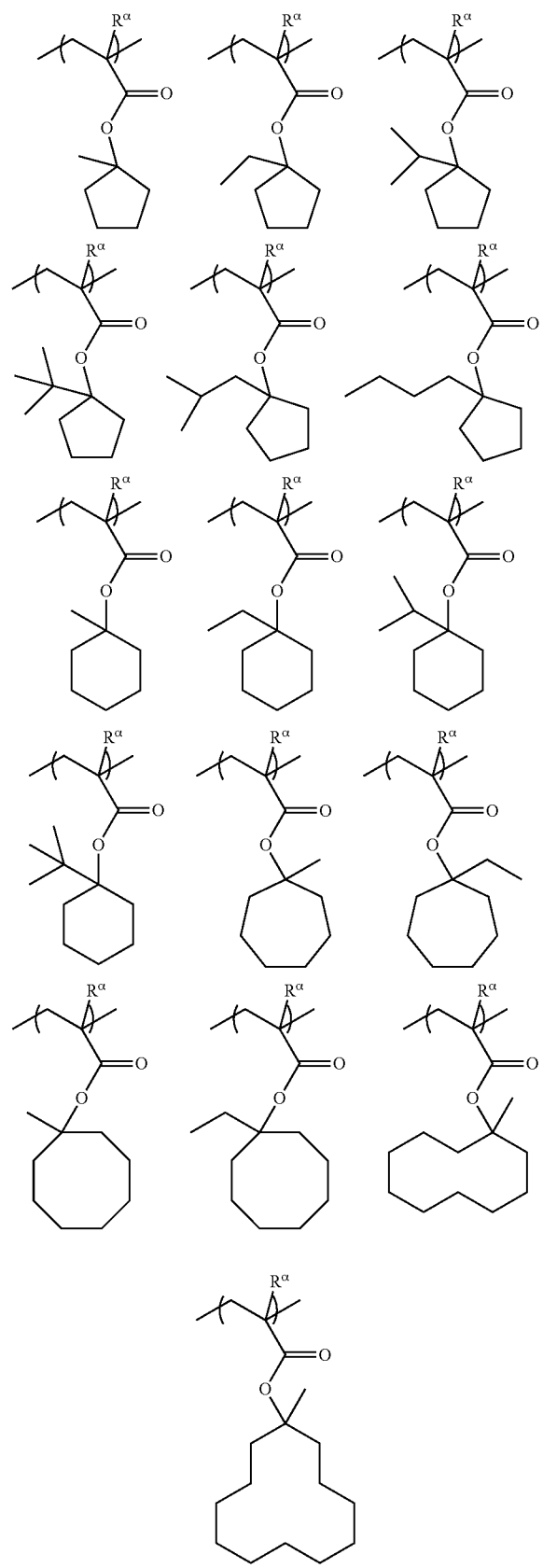
[Chemical Formula 29]
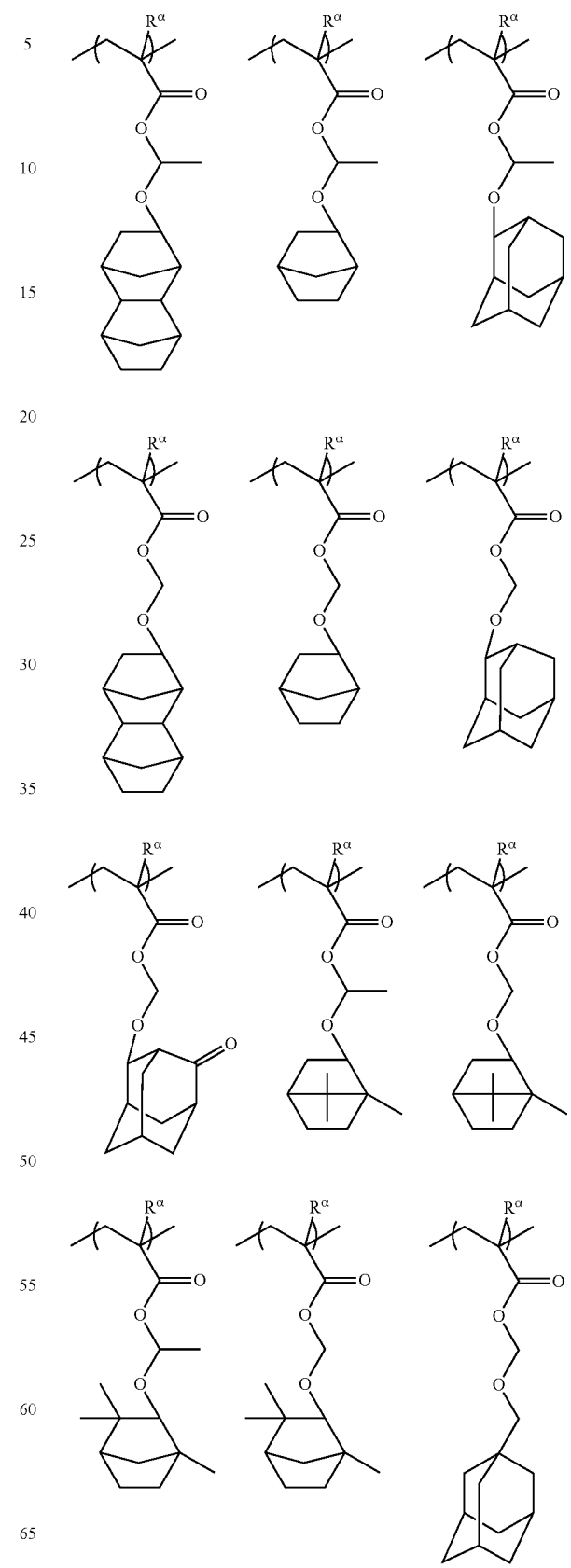

-continued
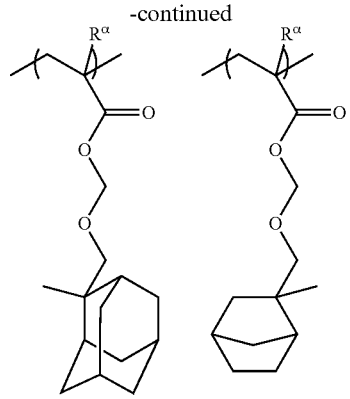
[Chemical Formula 30]
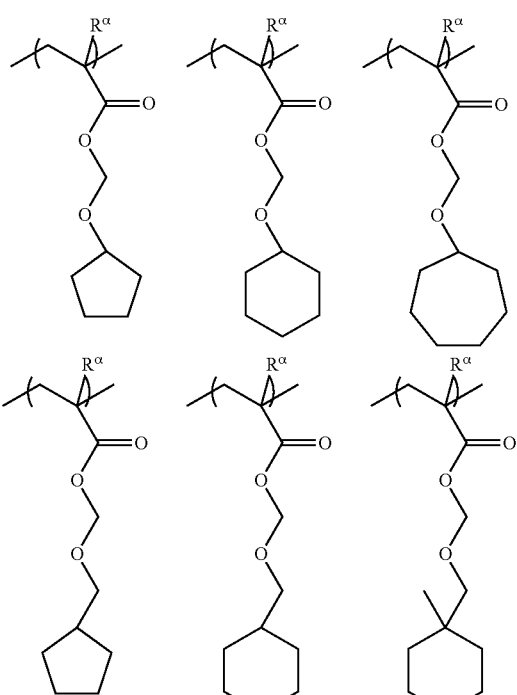
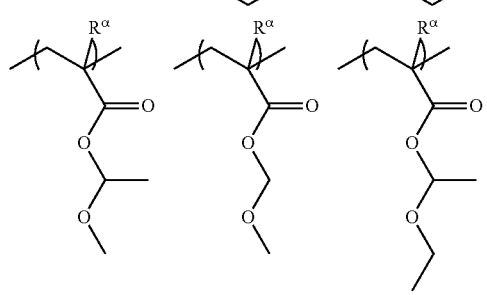
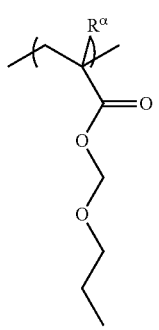
[Chemical Formula 31]
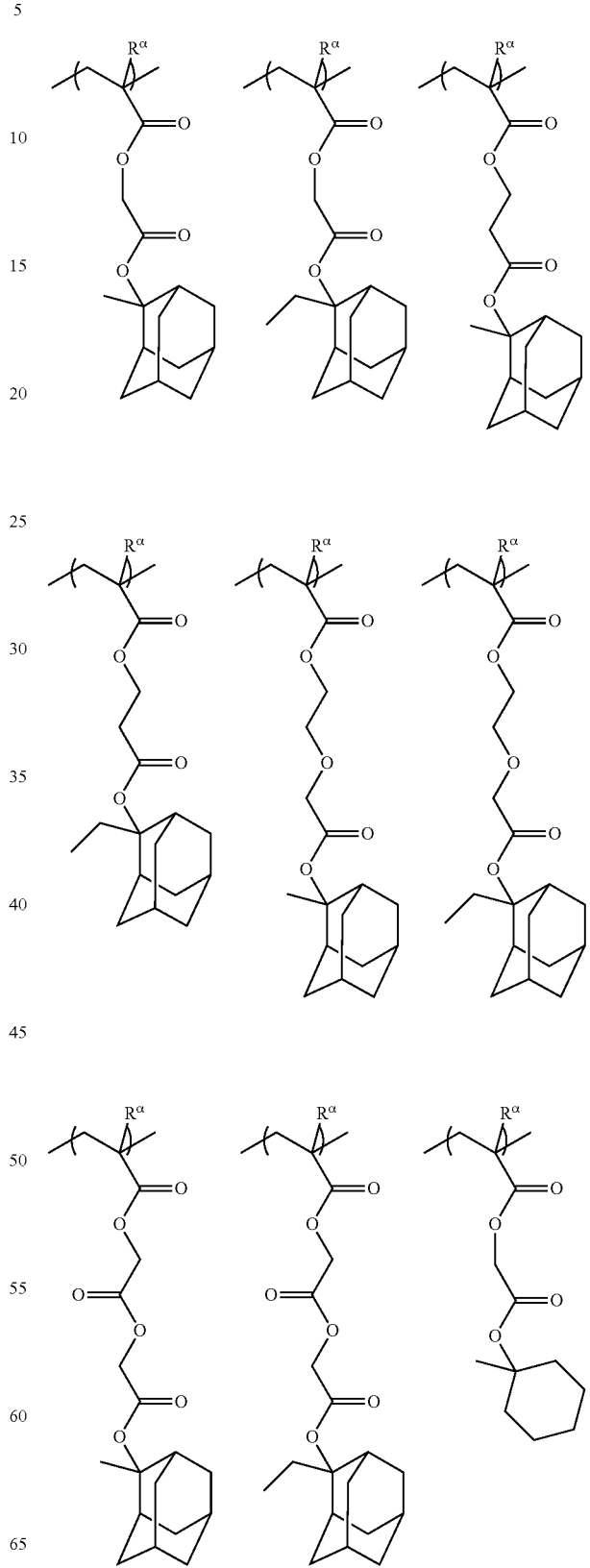

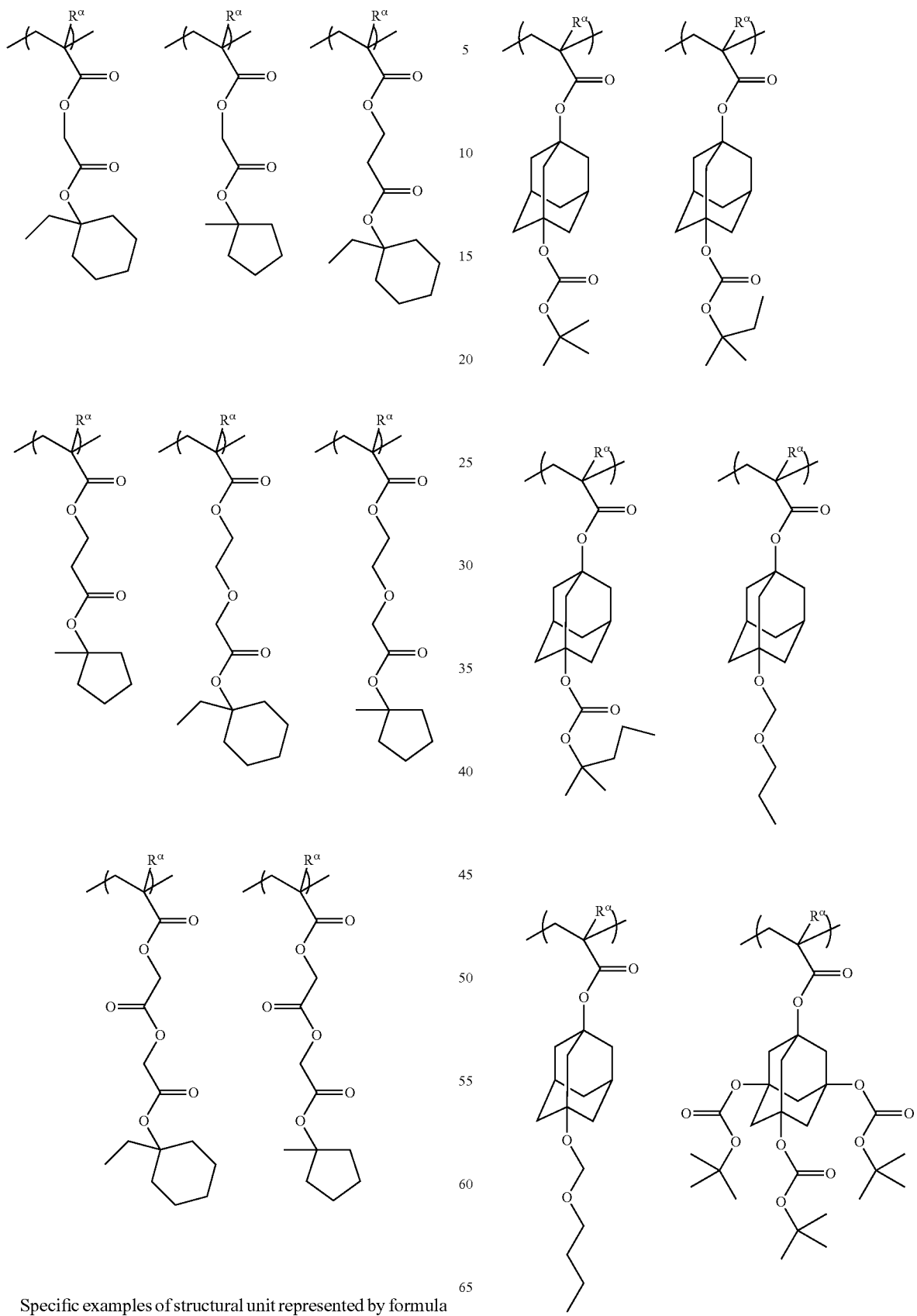
[Chemical Formula 32]
Specific examples of structural unit represented by formula (a1-2) are shown below.

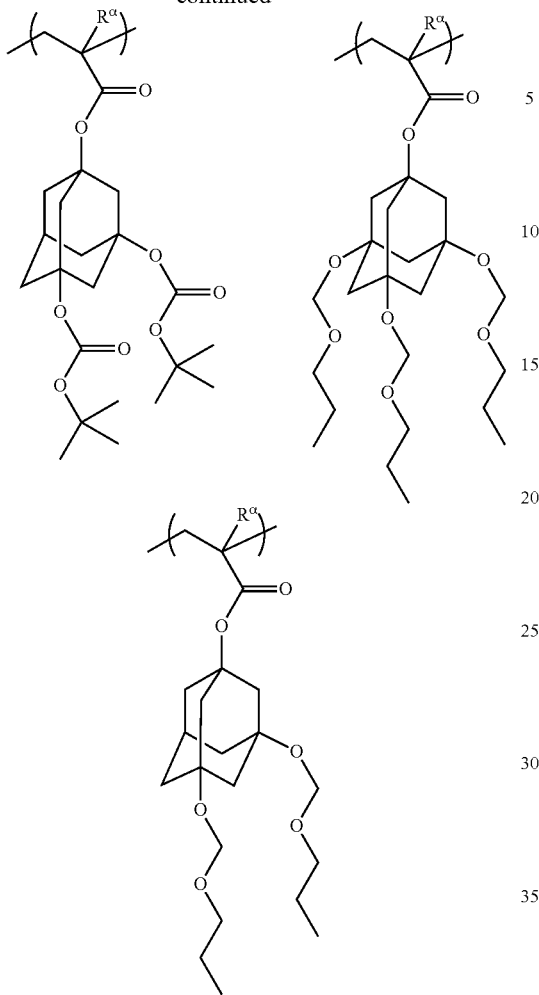

As the structural unit (a1) contained in the component (A1), 1 type of structural unit may be used, or 2 or more types may be used.

When the component (A1) includes the structural unit (a1), the amount of the structural unit (a1) based on the combined total of all structural units constituting the component (A1) is preferably 5 to 70 mol %, more preferably 5 to 60 mol %, and still more preferably 5 to 50 mol %.

When the amount of the structural unit (a0) is at least as large as the lower limit of the above-mentioned range, a resist pattern can be reliably obtained, and various lithography properties such as reduction of roughness and mask reproducibility are further improved.

On the other hand, when the amount of the structural unit (a0) is no more than the upper limit of the above-mentioned range, a good balance can be achieved with the other structural units, and a resist pattern with an excellent shape can be obtained.

Structural Unit (a2):

The structural unit (a2) is a structural unit which does not fall under the definition of the structural unit (a0), and contains a lactone-containing cyclic group, an —$SO_2$— containing cyclic group or a carbonate-containing cyclic group. By virtue of the component (A1) further including the structural unit (a2), when the component (A1) is used for forming a resist film, the adhesion between the resist film and the substrate is further improved.

In the structural unit (a2), the lactone-containing cyclic group, the —$SO_2$— containing cyclic group and the carbonate-containing cyclic group are the same as defined for the lactone-containing cyclic group, the —$SO_2$— containing cyclic group and the carbonate-containing cyclic group in the structural unit (a0).

As the structural unit (a2), a structural unit derived from an acrylate ester which may have the hydrogen atom bonded to the carbon atom on the α-position substituted with a substituent is preferable.

Specific examples of preferable structural units for the structural unit (a2) include structural units represented by general formula (a2-1) shown below.

[Chemical Formula 33]

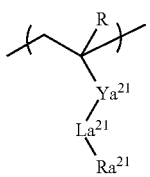

(a2-1)

In the formula, R represents a hydrogen atom, an alkyl group of 1 to 5 carbon atoms or a halogenated alkyl group of 1 to 5 carbon atoms; $Ya^{21}$ represents a single bond or a divalent linking group; $La^{21}$ represents —O—, —COO—, —CON(R')—, —OCO—, —CONHCO— or —CONHCS—; and R' represents a hydrogen atom or a methyl group; provided that, when $La^{21}$ represents —O—, $Ya^{21}$ does not represents —CO—; and $Ra^{21}$ represents a lactone-containing cyclic group, a carbonate-containing cyclic group or an —$SO_2$— containing cyclic group.

In the formula (a2-1), R are the same as defined above.

The divalent linking group for $Ya^{21}$ is not particularly limited, and preferable examples thereof include a divalent hydrocarbon group which may have a substituent and a divalent linking group containing a hetero atom.

(Divalent Hydrocarbon Group which may have a Substituent)

The hydrocarbon group as a divalent linking group may be either an aliphatic hydrocarbon group or an aromatic hydrocarbon group.

The aliphatic hydrocarbon group for $Ya^{21}$ may be either saturated or unsaturated, but is preferably saturated.

Examples of the aliphatic hydrocarbon group include a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)CH$_2$CH$_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms, and a carbonyl group.

As examples of the hydrocarbon group containing a ring in the structure thereof, a cyclic aliphatic hydrocarbon group containing a hetero atom in the ring structure thereof and may have a substituent (a group in which two hydrogen atoms have been removed from an aliphatic hydrocarbon ring), a group in which the cyclic aliphatic hydrocarbon group is bonded to the terminal of the aforementioned chain-like aliphatic hydrocarbon group, and a group in which the cyclic aliphatic group is interposed within the aforementioned linear or branched aliphatic hydrocarbon group, can be given. As the linear or branched aliphatic hydrocarbon group, the same groups as those described above can be used.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group, an alkoxy group, a halogen atom, a halogenated alkyl group, a hydroxyl group and a carbonyl group.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

The cyclic aliphatic hydrocarbon group may have part of the carbon atoms constituting the ring structure thereof substituted with a substituent containing a hetero atom. As the substituent containing a hetero atom, —O—, —C(=O)—O—, —S—, —S(=O)$_2$— or —S(=O)$_2$—O— is preferable.

The aromatic hydrocarbon group for Ya$^{21}$ is a hydrocarbon group having at least one aromatic ring.

The aromatic ring is not particularly limited, as long as it is a cyclic conjugated compound having (4n+2) π electrons, and may be either monocyclic or polycyclic. The aromatic ring preferably has 5 to 30 carbon atoms, more preferably 5 to 20, still more preferably 6 to 15, and most preferably 6 to 12. Here, the number of carbon atoms within a substituent(s) is not included in the number of carbon atoms of the aromatic hydrocarbon group. Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hetero ring include a pyridine ring and a thiophene ring.

Specific examples of the aromatic hydrocarbon group include a group in which two hydrogen atoms have been removed from the aforementioned aromatic hydrocarbon ring or aromatic hetero ring (arylene group or heteroarylene group); a group in which two hydrogen atoms have been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (a group in which one hydrogen atom has been removed from the aryl group within the aforementioned arylalkyl group such as a benzyl group, a phenethyl group, a 1-naphthylmethyl group, a 2-naphthylmethyl group, a 1-naphthylethyl group, or a 2-naphthylethyl group, or a heteroarylalkyl group). The alkylene group which is bonded to the aforementioned aryl group or heteroaryl group preferably has 1 to 4 carbon atoms, more preferably 1 or 2 carbon atoms, and most preferably 1 carbon atom.

With respect to the aromatic hydrocarbon group, the hydrogen atom within the aromatic hydrocarbon group may be substituted with a substituent. For example, the hydrogen atom bonded to the aromatic ring within the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group of 1 to 5 carbon atoms, and a methyl group, an ethyl group, a propyl group, an n-butyl group or a tert-butyl group is particularly desirable.

As the alkoxy group, the halogen atom and the halogenated alkyl group for the substituent, the same groups as the aforementioned substituent groups for substituting a hydrogen atom within the cyclic aliphatic hydrocarbon group can be used.

(Divalent Linking Group Containing a Hetero Atom)

With respect to a divalent linking group containing a hetero atom, a hetero atom is an atom other than carbon and hydrogen, and examples thereof include an oxygen atom, a nitrogen atom, a sulfur atom and a halogen atom.

In the case where Ya$^{21}$ represents a divalent linking group containing a hetero atom, preferable examples of the linking group include —O—, —C(=O)—O—, —C(=O)—, —O—C(=O)—O—, —C(=O)—NH—, —NH—, —NH—C(=NH)— (H may be substituted with a substituent such as an alkyl group, an acyl group or the like), —S—, —S(=O)$_2$—, —S(=O)$_2$—O—, a group represented by general formula —Y$^{21}$—O—Y$^{22}$—, —Y$^{21}$—O—, —Y$^{21}$—C(=O)—O—, —[Y$^{21}$—C(=O)—O]$_{m'''}$—, —Y$^{22}$—, —Y$^{21}$—O—C(=O)—Y$^{22}$— or —Y$^{21}$—S(=O)$_2$—O—Y$^{22}$— [in the formulae, Y$^{21}$ and Y$^{22}$ each independently represents a divalent hydrocarbon group which may have a substituent, O represents an oxygen atom, and m' represents an integer of 0 to 3].

In the case where the divalent linking group containing a hetero atom is —C(=O)—NH—, —C(=O)—NH—C(=O)—, —NH— or —NH—C(=NH)—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In formulae —$Y^{21}$—O—$Y^{22}$—, —$Y^{21}$—O—, —$Y^{21}$—C(=O)—O—, —[$Y^{21}$—C(=O)—O]$_{m''}$—$Y^{22}$—, —$Y^{21}$—O—C(=O)—$Y^{22}$— or —$Y^{21}$—S(=O)$_2$—O—$Y^{22}$—, $Y^{21}$ and $Y^{22}$ each independently represents a divalent hydrocarbon group which may have a substituent. Examples of the divalent hydrocarbon group include the same groups as those described above as the "divalent hydrocarbon group which may have a substituent" in the explanation of the aforementioned divalent linking group.

As $Y^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As $Y^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[$Y^{21}$—C(=O)—O]$_{m''}$—$Y^{22}$—, m'' represents an integer of 0 to 3, preferably an integer of 0 to 2, more preferably 0 or 1, and most preferably 1. Namely, it is particularly desirable that the group represented by the formula —[$Y^{21}$—C(=O)—O]$_{m''}$—$Y^{22}$— is a group represented by the formula —$Y^{21}$—C(=O)—O—$Y^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

Ya$^{21}$ preferably represents an ester bond [—C(=O)—O—], an ether bond (—O—), linear or branched alkylene group, a combination of these, or a single bond.

In the formula (a2-1), Ra$^{21}$ represents a lactone-containing cyclic group, an —SO$_2$— containing cyclic group or a carbonate-containing cyclic group.

Preferable examples of the lactone-containing cyclic group, the —SO$_2$— containing cyclic group and the carbonate-containing cyclic group for Ra$^{21}$ include lactone-containing cyclic groups represented by the aforementioned general formulae (a0-r-1) to (a0-r-7), —SO$_2$— containing cyclic groups represented by the aforementioned general formulae (a0-r-8) to (a0-r-11), and carbonate-containing cyclic groups represented by the aforementioned general formulae (a0-r-12) to (a0-r-14).

Among these examples, a lactone-containing cyclic group or an —SO$_2$— containing cyclic group is preferable, a group represented by the aforementioned general formula (a0-r-1), (a0-r-2), (a0-r-6) or (a0-r-8) is more preferable, and a group represented by the aforementioned chemical formula (r-1c-1-1) to (r-1c-1-7), (r-1c-2-1) to (r-1c-2-13), (r-1c-6-1), (r-s1-1-1) or (r-s1-1-18) is still more preferable.

As the structural unit (a2) contained in the component (A1), 1 type of structural unit may be used, or 2 or more types may be used.

When the component (A1) includes the structural unit (a2), the amount of the structural unit (a2) based on the combined total of all structural units constituting the component (A1) is preferably 5 to 70 mol %, more preferably 5 to 60 mol %, and still more preferably 5 to 50 mol %.

When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units, and various lithography properties and pattern shape can be improved.

Structural Unit (a3):

The structural unit (a3) is a structural unit containing a polar group-containing aliphatic hydrocarbon group (provided that the structural units that fall under the definition of structural units (a1), (a0) and (a2) are excluded).

When the component (A1) includes the structural unit (a3), the hydrophilicity of the component (A1) is enhanced, thereby contributing to improvement in resolution.

Examples of the polar group include a hydroxyl group, cyano group, carboxyl group, or hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

As the structural unit (a3), there is no particular limitation as long as it is a structural unit containing a polar group-containing aliphatic hydrocarbon group, and an arbitrary structural unit may be used.

The structural unit (a3) is preferably a structural unit derived from an acrylate ester which may have the hydrogen atom bonded to the carbon atom on the α-position substituted with a substituent and contains a polar group-containing aliphatic hydrocarbon group.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 34]

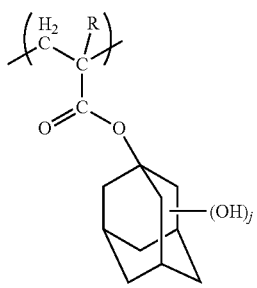

(a3-1)

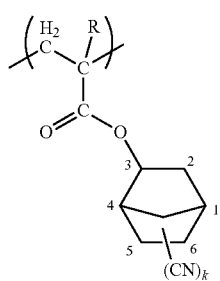

(a3-2)

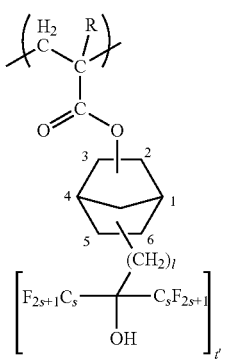

(a3-3)

In the formulas, R is the same as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. 1 is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a3) contained in the component (A1) 1 type of structural unit may be used, or 2 or more types may be used.

When the component (A1) includes the structural unit (a3), the amount of the structural unit (a3) based on the combined total of all structural units constituting the component (A1) is preferably 20 mol % or more, more preferably 5 to 15 mol %, and still more preferably 5 to 10 mol %.

When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

Structural Unit (a4):

The structural unit (a4) is a structural unit containing an acid non-dissociable, aliphatic cyclic group.

When the component (A1) includes the structural unit (a4), dry etching resistance of the resist pattern to be formed is improved. Further, the hydrophobicity of the component (A) is further improved. Increase in the hydrophobicity contributes to improvement in terms of resolution, shape of the resist pattern and the like, particularly in an organic solvent developing process.

An "acid non-dissociable, aliphatic cyclic group" in the structural unit (a4) refers to a cyclic group which is not dissociated by the action of the acid (e.g., acid generated from the component (B) described later) upon exposure, and remains in the structural unit.

As the structural unit (a4), a structural unit which contains a non-acid-dissociable aliphatic cyclic group, and is also derived from an acrylate ester is preferable. Examples of this cyclic group include the same groups as those described above in relation to the aforementioned structural unit (a1), and any of the multitude of conventional groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include structural units represented by general formulae (a4-1) to (a4-7) shown below.

[Chemical Formula 35]

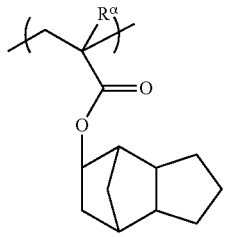

(a4-1)

-continued (a4-2)
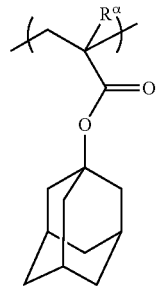

(a4-3)
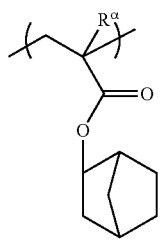

(a4-4)
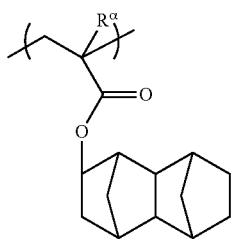

(a4-5)
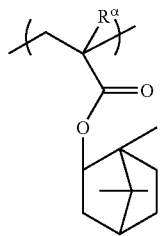

(a4-6)
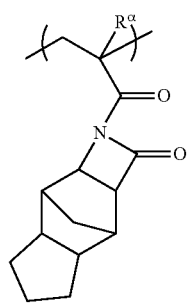

(a4-7)
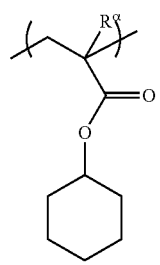

In the formulae, $R^\alpha$ is the same as defined above.

As the structural unit (a4) contained in the component (A1), 1 type of structural unit may be used, or 2 or more types may be used.

When the component (A1) includes the structural unit (a4), the amount of the structural unit (a4) based on the combined total of all structural units constituting the component (A1) is preferably 20 mol % or more, more preferably 5 to 15 mol %, and still more preferably 5 to 10 mol %.

When the amount of the structural unit (a4) is at least as large as the lower limit of the above-mentioned range, the effect of using the structural unit (a4) can be satisfactorily achieved. On the other hand, when the amount of the structural unit (a4) is no more than the upper limit of the above-mentioned range, a good balance can be achieved with the other structural units.

In the resist composition of the present invention, the component (A1) is a polymeric compound having the structural unit (a0), and is preferably a polymeric compound having, in addition to the structural unit (a0), a structural unit (a1) containing an acid decomposable group that exhibits increased polarity by the action of acid and does not fall under the definition of the structural unit (a0).

In such a case, the total amount of the structural units (a0) and (a1) based on the combined total of all the structural units that constitute the component (A1) is preferably 30 mol % or more, more preferably 50 to 100 mol %, and most preferably 70 to 100 mol %.

When the total amount is at least as large as the lower limit of the above-mentioned range, both reduction of roughness and mask reproducibility can be reliably achieved, and a resist pattern with further improved lithography properties can be formed.

Specific examples of preferable component (A1) include a polymeric compound consisting of a repeating structure of the structural unit (a0) and the structural unit (a1); a polymeric compound consisting of a repeating structure of the structural unit (a0), the structural unit (a1) and the structural unit (a2); and a polymeric compound consisting of a repeating structure of the structural unit (a0), the structural unit (a1), the structural unit (a2) and the structural unit (a3).

In the polymeric compound composed of a repeating structure of the structural unit (a0) and the structural unit (a1), the amount of the structural unit (a0) within the polymeric compound, based on 100 mol % of the total of the structural units (a0) and (a1)) is preferably 40 mol % or more, more preferably 40 to 80 mol %, and still more preferably 40 to 70 mol %. When the amount of the structural unit (a0) is at least as large as the lower limit of the above-mentioned range, both reduction of roughness and mask reproducibility can be reliably achieved, and a resist pattern with further improved lithography properties can be formed.

The weight average molecular weight (Mw) (the polystyrene equivalent value determined by gel permeation chromatography) of the component (A1) is not particularly limited, but is preferably 1,000 to 50,000, more preferably 1,500 to 30,000, and most preferably 2,000 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) is not particularly limited, but is preferably 1.0 to 5.0, more preferably 1.0 to 4.0, and most preferably 1.0 to 3.0. Here, Mn is the number average molecular weight.

As the component (A), one type may be used alone, or two or more types may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, both reduction of roughness and mask reproducibility can be reliably achieved, and a resist pattern with further improved lithography properties can be formed.

In the resist composition of the present embodiment, as the component (A), one kind of composition may be used, or two or more kinds of compositions may be used in combination.

In the resist composition of the present embodiment, the base component may contain "a base component which exhibits changed solubility in a developing solution under action of acid" other than the component (A1) (hereafter, referred to as "component (A2)").

The component (A2) is not particularly limited, and any of the multitude of conventional base components used within chemically amplified resist compositions (e.g., base resins used within chemically amplified resist compositions for ArF excimer lasers or KrF excimer lasers, preferably ArF excimer lasers) can be used. As the component (A2), one type of resin may be used, or two or more types of resins may be used in combination.

In the resist composition of the present embodiment, the amount of the component (A) can be appropriately adjusted depending on the thickness of the resist film to be formed, and the like.

<Acid Generator Component: Component (B)>

The component (B) used in the present invention includes an acid generator (B1) (hereafter, referred to as "component (B1)") containing a compound having a nitrogen atom exhibiting a proton acceptor property and an acid generating site capable of generating an acid upon exposure in the same molecule thereof.

[Component (B1)]

In the component (B1), the "nitrogen atom having proton acceptor properties" means a nitrogen atom having a lone pair (unshared electron pair) capable of trapping (accepting) and bonding a proton released by means of decomposition of a part of the intermolecular structure upon exposure or a proton released in the surroundings of the component (B1) upon exposure.

Though the nitrogen atom in the component (B1) is not particularly limited so long as it has a lone pair capable of trapping a proton, for example, it is preferably a nitrogen atom constituting each of structures of the following formulae (y1) to (y5).

On the other hand, examples of the nitrogen atom not having proton acceptor properties include a nitrogen atom constituting an imide or an amide. In general, since the nitrogen atom constituting an imide or an amide is resonant with a double bond of the carbonyl group, the lone pair of the nitrogen atom hardly traps a proton.

Examples of a functional group containing a nitrogen atom having proton acceptor properties include those having at least one of the structures represented by the following formulae (y1) to (y5). Here, though the carbon atom constituting the structure represented by the formula (y4) forms a double bond together with a nitrogen atom not shown in the formula (y4) is identical to a structure represented by the formula (y3), in such a case, it should be construed that the subject structure is regarded as a structure represented by the formula (y3).

In each formula, "*" represents a valence bond, preferably bonded to a hydrogen atom, a carbon atom, a nitrogen atom or an oxygen atom, more preferably bonded to a carbon atom or a nitrogen atom, and still more preferably bonded to a carbon atom.

[Chemical Formula 36]

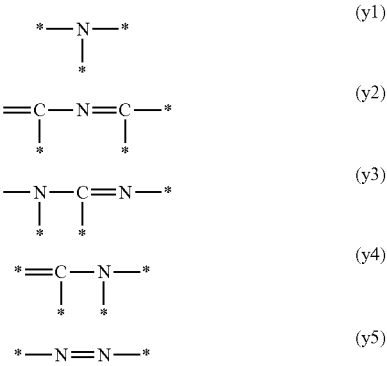

Examples of the functional group containing one of the structure represented by the formula (y1) include groups represented by the following formulae (y1-1) to (y1-3).

However, with respect to the groups represented by formulae (y1-2) and (y1-3), any hydrogen atom bonded to a carbon atom constituting the ring skeleton may be removed to bring a bond on the carbon atom.

[Chemical Formula 37]

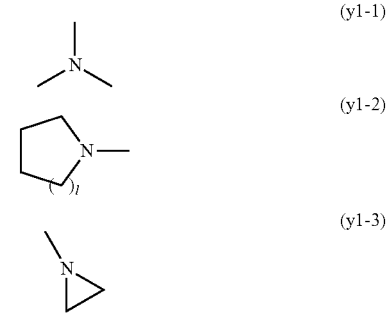

In the formula, l represents 1 or 2.

Examples of the functional group containing two or more of the structure represented by the formula (y1) include groups represented by the following formulae (y1-4) to (y1-6).

[Chemical Formula 38]

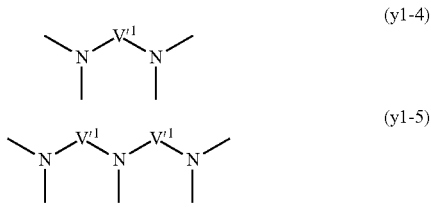

(y1-6)

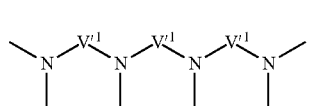

In the formulae, each V'¹ independently represents a linear, branched, or cyclic alkylene group, and V'1 is preferably a linear or branched alkylene group having from 1 to 10 carbon atoms, more preferably a linear alkylene group having from 1 to 5 carbon atoms, and still more preferably a linear alkylene group having from 2 to 3 carbon atoms.

Specific examples of the functional group containing two or more of the structure represented by the formula (y1) include groups represented by the following formulae (y1-4-1), (y1-4-2), (y1-5-1) and (y1-6-1). However, with respect to the group represented by the formula (y1-4-2), the bond on the ring skeleton is omitted from the description.

[Chemical Formula 39]

(y1-4-1)

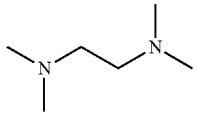

(y1-5-1)

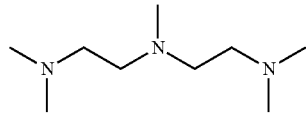

(y1-6-1)

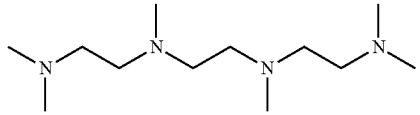

(y1-4-2)

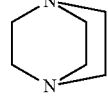

Examples of the functional group containing one or two of the structure represented by the formula (y2) and the functional group containing one of the structures represented by the formulae (y3) to (y5) include the groups represented by the following formulae (y2-1) to (y2-3), (y3-1) to (y3-3), (y4-1), and (y5-1).

Incidentally, the formula (y2-3) is an example of the functional group containing one of each structure represented by the formulae (y2) and (y4). However, the bond on the ring skeleton of each of the formulae is omitted from the description.

[Chemical Formula 40]

(y2-1)

(y2-2)

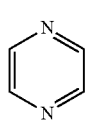

(y2-3)

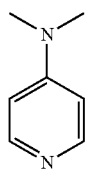

(y3-1)

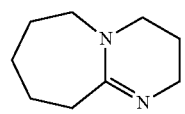

(y3-2)

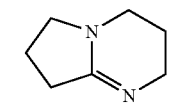

(y3-3)

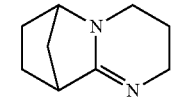

(y4-1)

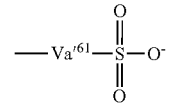

(y5-1)

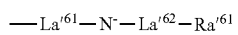

The acid generating site capable of generating an acid upon exposure, which the component (B1) has, means a site capable of generating or releasing a proton upon exposure.

The site capable of generating or releasing a proton upon exposure is preferably a group containing a sulfonic acid anion, a carbo anion, a carboxylic acid anion, an imide anion or a sulfonyl methide anion, and more preferably a group represented by any one of the following formulae (r-an-1) to (r-an-3).

[Chemical Formula 41]

(r-an-1)

$$-Va'^{61}-\overset{O}{\underset{O}{\overset{\|}{S}}}-O^-$$

(r-an-2)

$$-La'^{61}-N^--La'^{62}-Ra'^{61}$$

(r-an-3)

$$-La'^{63}-\underset{La'^{65}-Ra'^{63}}{\overset{|}{C^-}}-La'^{64}-Ra'^{62}$$

In formulae (r-an-1) to (r-an-3), $Va'^{61}$ represents a divalent hydrocarbon group having a fluorine atom; $La'^{61}$ and $La'^{62}$ represents —SO$_2$—; La$^{t63}$ to La$^{t65}$ represents —SO$_2$— or a single bond; and Ra$^{t61}$ to Ra$^{t63}$ each independently represents a hydrocarbon group.

The divalent hydrocarbon group represented by Va$^{t61}$ is preferably the same group as that exemplified above as the divalent hydrocarbon group for Ya$^{21}$ in the general formula (a2-1), more preferably an alkylene group having from 1 to 5 carbon atoms, and still more preferably a methylene group or an ethylene group.

The hydrocarbon group for Va$^{t61}$ has part or all of the hydrogen atoms within the hydrocarbon group substituted with fluorine, and the hydrocarbon group more preferably has 30 to 100% of the hydrogen atoms substituted with fluorine. Above all, a (per)fluoroalkylene group in which a part or all of the hydrogen atoms of the alkylene group exemplified as the divalent hydrocarbon group represented by Ya$^{21}$ are substituted with a fluorine atom is especially preferable.

Examples of the hydrocarbon group represented by Ra$^{t61}$ to Ra$^{t63}$ include a monovalent hydrocarbon group in which one of the bonds of the same group as that exemplified above as the divalent hydrocarbon group for Ya$^{21}$ in the general formula (a2) is bonded to the hydrogen atom. It is preferable that a part or all of the hydrogen atoms of the hydrocarbon group constituting each of Ra$^{t61}$ to Ra$^{t63}$ are substituted with a fluorine atom, and it is more preferable that from 30 to 100% of the hydrogen atoms of the hydrocarbon group are substituted with a fluorine atom. Above all, a (per)fluoroalkyl group in which all of the hydrogen atoms bonded to a group in which the alkylene group having from 1 to 10 carbon atoms as exemplified above as the divalent hydrocarbon group for Ya$^{21}$ is converted to a monovalent alkyl group are substituted with a fluorine atom is especially preferable.

Specific examples of the groups represented by the formulae (r-an-1) to (r-an-3) are given below.

[Chemical Formula 42]

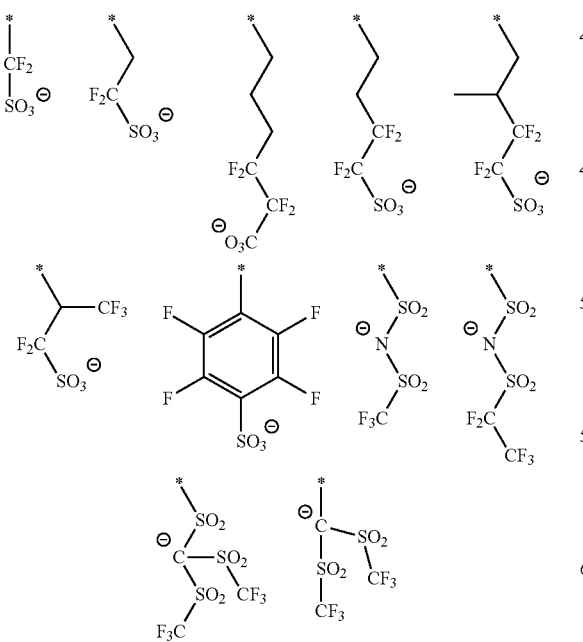

In the component (B1), the number of the acid generating sites capable of generating an acid upon exposure is larger than the number of the nitrogen atoms having proton acceptor properties by 1 or more, preferably from 1 to 5, more preferably from 1 to 3, and still more preferably 1 or 2.

When the number of the acid generating sites is larger than the number of the nitrogen atoms within the above-described numerical value range, when the compound is sufficiently exposed, an acid is generated, whereas when the exposure is insufficient, an acid is hardly generated, or an acid is hardly diffused into the resist film. Thus, the contrast in acid generation concentration between exposed areas and unexposed areas increases, and a sufficient difference in development easiness between exposed areas and unexposed areas can be exhibited, whereby the lithography properties such as LWR become more excellent. In addition, in the unexposed areas, the nitrogen atom having proton acceptor properties may function as a quencher of an acid, so that it traps an unnecessary acid which has been diffused into the unexposed areas. Thus, the lithography properties such as LWR become more excellent.

Conventionally, a component having acid-generating ability which changes the solubility of the base material component in a developing solution and a component having a function to trap the unnecessary acid in the unexposed areas were individually added in the resist composition and adjusted, and therefore, there was involved a problem in enhancing the lithography properties such as LWR due to an influence of nonuniform distribution of the respective components in the resist film. However, since the component (B1) according to the present invention is an acid generator having the both functions (the function to generate an acid upon exposure and the function to trap the unnecessary acid) in the same molecule thereof, it may be considered that the uniformity of distribution in the resist film may be enhanced, and it may be considered that the lithography properties such as LWR are enhanced.

Incidentally, it may be considered that when the nitrogen atom having proton acceptor properties traps a proton released upon exposure, the proton acceptor properties decrease or disappear, or the group containing the nitrogen atom changes into an acidic group.

In the component (B1), the acid generating site capable of generating an acid upon exposure and the nitrogen atom having proton acceptor properties are contained in the same molecule thereof. Here, it is preferable that the component (B1) is a salt composed of a cation and an anion, and it is more preferable that the acid generating site and the nitrogen atom are contained in the same anion of the salt.

Preferred examples of the component (B1) include a compound represented by the following general formula (b1-1).

[Chemical Formula 43]

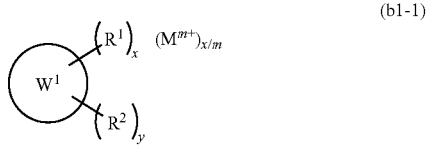

(b1-1)

In the formula, R$^1$ represents a group having an anion portion that generates acid upon exposure; R$^2$ represents a hydrogen atom or a substituent that does not have an anion portion that generates acid upon exposure; W$^1$ represents a z-valent functional group containing n nitrogen atoms having proton acceptor properties; n represents an integer of 1 or more; z=x+y, n≤x≤z, and 0≤y≤z−x; m represents an integer of 1 or more; and M$^{m+}$ represents an m-valent organic cation.

Among the compounds represented by general formula (b1-1), a compound represented by the following general formula (b1-2) is preferable.

[Chemical Formula 44]

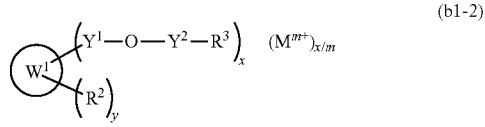
(b1-2)

In the formula, $Y^1$ and $Y^2$ each independently represents a single bond or a divalent linking group; $R^3$ represents an anion group represented by any one of the formulae (r-an-1) to (r-an-3); $R^2$ represents a hydrogen atom or a substituent that does not have an anion portion that generates acid upon exposure; $W^1$ represents a z-valent functional group containing n nitrogen atoms having proton acceptor properties; n represents an integer of 1 or more; z=x+y, n≤x≤z, and 0≤y≤z−x; m represents an integer of 1 or more; and $M^{m+}$ represents an m-valent organic cation.

{Anion Moiety of the Compound Represented by the Formulae (b1-1) and (b1-2)}

In the formula (b1-1), suitable examples of the anion site capable of generating an acid upon exposure, which $R^1$ has, include the functional groups represented by the formulae (r-an-1) to (r-an-3). Above all, the functional group represented by the formula (r-an-1) is more preferable. Here, it is preferable that $R^1$ has the one of the above-described anion moiety (anion group).

In addition, in the formula (b1-2), $R^3$ is preferably the anion group represented by the formula (r-an-1).

In the formulae (b1-1) and (b1-2), $R^2$ represents a hydrogen atom or a substituent that does not have an anion portion that generates acid upon exposure. The substituent is preferably an organic group, and more preferably a hydrocarbon group having from 1 to 20 carbon atoms, which may have a substituent. The hydrocarbon group may be any of a linear hydrocarbon group, a branched hydrocarbon group, or a cyclic hydrocarbon group, and it may be either an aliphatic hydrocarbon group or an aromatic hydrocarbon group.

In the formulae (b1-1) and (b1-2), $W^1$ is preferably a functional group containing at least one of the structures represented by the formulae (y1) to (y5), and more preferably a group containing at least one of the functional groups represented by the formulae (y1-1) to (y1-6), (y1-4-1), (y1-4-2), (y1-5-1), (y1-6-1), (y2-1) to (y2-3), (y3-1) to (y3-3), (y4-1), and (y5-1).

In the formula (b1-1), z which represents the valence of $W^1$ and n which is the number of nitrogen atoms having proton acceptor properties, which $W^1$ contains, have the relations of z=x+y, n≤x≤z, and 0≤y≤z−x. x, y and z are integers.

x is preferably 1 to 6, more preferably 1 to 4, and most preferably 1 or 2.

In addition, n is preferably equal to x or smaller than x by from 1 to 2, and more preferably equal to x or smaller than x by 1.

In addition, y is preferably 0 or 1.

In the formula (b1-2), each of $Y^1$ and $Y^2$ independently represents a single bond or a divalent linking group. Examples of the divalent linking group include the same groups as those exemplified above for $Ya^{21}$ in the formula (a2-1). Each of $Y^1$ and $Y^2$ is preferably a divalent linking group containing a hetero atom. Above all, a divalent aliphatic hydrocarbon group having from 1 to 10 carbon atoms; a linking group containing an oxygen atom (such as —O—, —C(=O)—O—, —C(=O)—, and —O—C(=O)—O—); and a linking group composed of a combination of these groups are more preferable. However, the case where in "—$Y^1$—O—" and "—O—$Y^2$—", oxygen atoms are adjacent and bonded to each other is excluded.

In the formula (b1-2), each of $Y^1$ and $Y^2$ is preferably a single bond, a divalent aliphatic hydrocarbon group having from 1 to 10 carbon atoms, —C(=O)—, or a linking group composed of a combination of these groups.

Preferable examples of the anion moiety of the compound represented by the formula (b1-1) include anions represented by the following formulae (b1-1-1) to (b1-1-13).

[Chemical Formula 45]

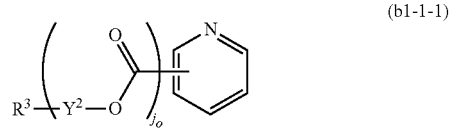
(b1-1-1)

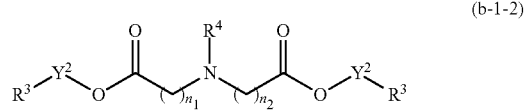
(b-1-2)

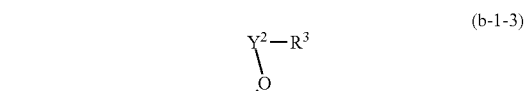
(b-1-3)

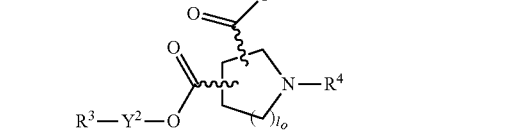
(b-1-4)

(b-1-5)

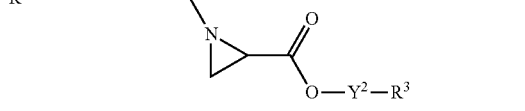
(b-1-6)

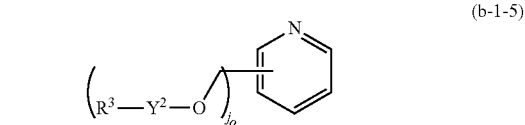
(b-1-7)

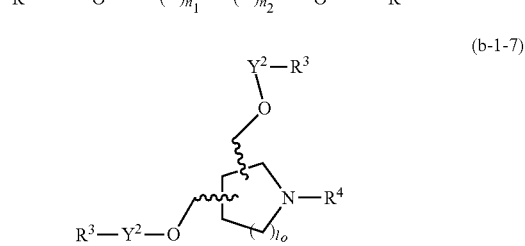

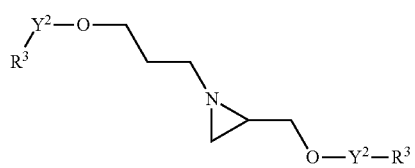
(b-1-8)

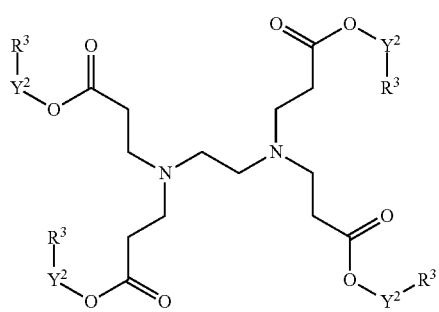
(b1-1-9)

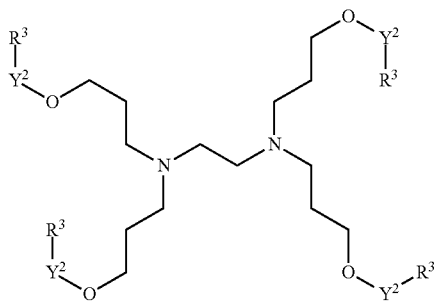
(b1-1-10)

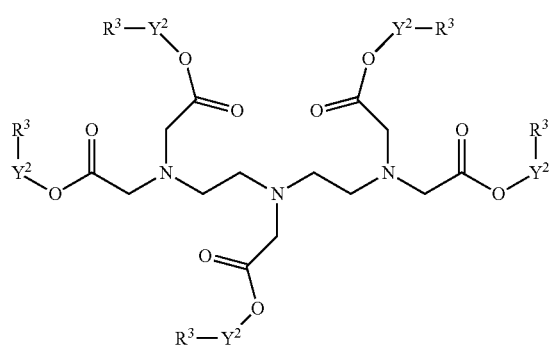
(b1-1-11)

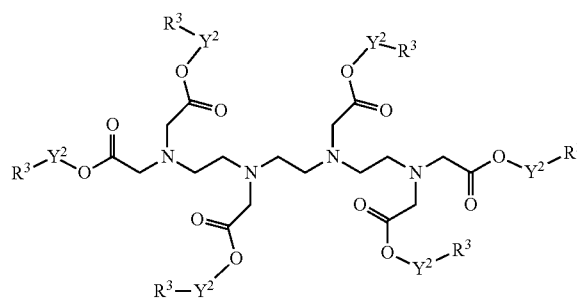
(b1-1-12)

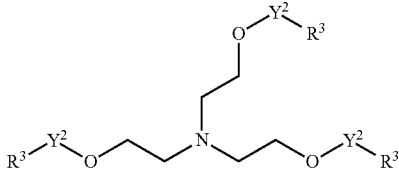
(b1-1-13)

In the formulae, $Y^2$ and $R^3$ are the same as defined above; jo represents an integer of from 1 to 4; $n_1$ and $n_2$ each independently represents an integer of from 1 to 6; lo represents an integer of from 1 to 2; and $R^4$ represents a hydrogen atom or a hydrocarbon group having from 1 to 10 carbon atoms.

$Y^2$ is preferably a single bond, a group as exemplified as the divalent hydrocarbon group for $Ya^{21}$, or a group in which the divalent hydrocarbon group is combined with an ester bond. The divalent hydrocarbon group is more preferably an alkylene group having from 1 to 5 carbon atoms, and still more preferably a methylene group or an ethylene group.

In addition, $R^3$ is preferably the group represented by the formula (r-an-1).

It is preferable that each counter cation of $R^3$ is independently a monovalent organic cation.

{Cation Moiety of the Compound Represented by the Formulae (b1-1) and (b1-2)}

In the formulae (b1-1) and (b1-2), $(M^{m+})_{x/m}$ represents an m-valent organic cation. Though the organic cation is not particularly limited, for example, organic cations which are known as a cation moiety of an onium salt acid generator of the conventional resist composition, or the like can be used. Preferable examples of such organic cation include the same cation moieties as those described later for the component (B2). Among these, as $(M^{m+})_{x/m}$, a sulfonium cation or a iodonium cation is preferable, and a cation represented by any one of formulae (ca-1) to (ca-4) described later is preferable.

In the component (B), as the component (B1), one kind of the aforementioned compound may be used, or two or more kinds of compounds may be used in combination.

In the resist composition, the amount of the component (B1) relative to 100 parts by weight of the component (A) is preferably within a range from 0.5 to 60 parts by weight, more preferably from 1 to 50 parts by weight, still more preferably from 1 to 40 parts by weight, and most preferably from 1 to 30 parts by weight. When the amount of the component (B1) within the resist composition is at least as large the lower limit of the above preferable range, various lithography properties of the resist composition such as reduction of roughness and mask reproducibility are improved. Further, a resist pattern having an excellent shape can be reliably obtained. On the other hand, when the amount of the component (B1) is no more than the upper limit of the above preferable range, a uniform solution can be obtained and the storage stability becomes satisfactory.

In the component (B), the amount of the component (B1) based on the total weight of the component (B) is preferably 20% by weight or more, more preferably 40% by weight or more, still more preferably 50% by weight or more, and may be even 100% by weight. The amount of the component (B1) is most preferably 100% by weight. When the amount of the component (B1) within the component (B) is at least as large the lower limit of the above preferable range, the resist composition can reliably achieve both reduction of roughness and mask reproducibility, and a resist pattern with further improved lithography properties can be formed.

[Component (B2)]

In the resist composition of the present invention, an acid generator other than the component (B1) (hereafter, referred to as "component (B2)") may be used in combination as the component (B).

The component (B2) is not particularly limited as long it does not fall under the definition of the component (B1), and any of the known acid generators used in conventional chemically amplified resist compositions can be used.

Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators. Among these, it is preferable to use an onium salt acid generator.

As the onium salt acid generator, a compound represented by general formula (b-1) below (hereafter, sometimes referred to as "component (b-1)"), a compound represented by general formula (b-2) below (hereafter, sometimes referred to as "component (b-2)") or a compound represented by general formula (b-3) below (hereafter, sometimes referred to as "component (b-3)") may be used.

[Chemical Formula 46]

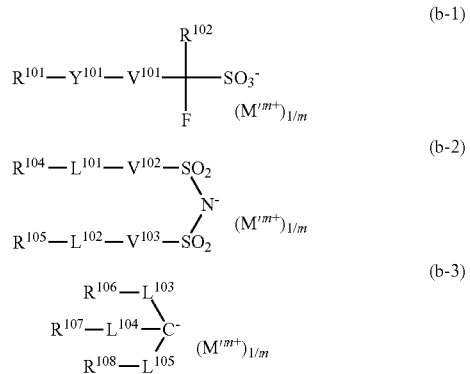

In the formulae, $R^{101}$ and $R^{104}$ to $R^{108}$ each independently represents a cyclic group which may have a substituent, a chain-like alkyl group which may have a substituent or a chain-like alkenyl group which may have a substituent, provided that $R^{104}$ and $R^{105}$ may be mutually bonded to form a ring; $R^{102}$ represents a fluorine atom or a fluorinated alkyl group of 1 to 5 carbon atoms; $Y^{101}$ represents a single bond or a divalent linking group containing an oxygen atom; $V^{101}$ to $V^{103}$ each independently represents a single bond, an alkylene group or a fluorinated alkylene group; $L^{101}$ to $L^{102}$ each independently represents a single bond or an oxygen atom; $L^{103}$ to $L^{105}$ each independently represents a single bond, —CO— or —SO$_2$—; and $M'^{m+}$ represents an organic cation having a valency of m.

{Anion Moiety}

Anion Moiety of Component (b-1)

In the formula (b-1), $R^{101}$ represents a cyclic group which may have a substituent, a chain-like alkyl group which may have a substituent or a chain-like alkenyl group which may have a substituent.

(Cyclic Group which May have a Substituent)

The cyclic group is preferably a cyclic hydrocarbon group, and the cyclic hydrocarbon group may be either an aromatic hydrocarbon group or an aliphatic hydrocarbon group. An "aliphatic hydrocarbon group" refers to a hydrocarbon group that has no aromaticity. The aliphatic hydrocarbon group may be either saturated or unsaturated, but in general, the aliphatic hydrocarbon group is preferably saturated.

The aromatic hydrocarbon group for $R^{101}$ is a hydrocarbon group having an aromatic ring. The aromatic hydrocarbon ring preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring contained in the aromatic hydrocarbon group represented by $R^{101}$ include benzene, fluorene, naphthalene, anthracene, phenanthrene and biphenyl; and aromatic hetero rings in which part of the carbon atoms constituting the aforementioned aromatic rings has been substituted with a hetero atom. Examples of the hetero atom within the aromatic hetero rings include an oxygen atom, a sulfur atom and a nitrogen atom.

Specific examples of the aromatic hydrocarbon group represented by $R^{101}$ include a group in which one hydrogen atom has been removed from the aforementioned aromatic ring (i.e., an aryl group, such as a phenyl group or a naphthyl group), and a group in which one hydrogen of the aforementioned aromatic ring has been substituted with an alkylene group (e.g., an arylalkyl group such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atom, more preferably 1 or 2, and most preferably 1.

Examples of the cylic aliphatic hydrocarbon group for $R^{101}$ include aliphatic hydrocarbon groups containing a ring in the structure thereof.

As examples of the hydrocarbon group containing a ring in the structure thereof, an alicyclic hydrocarbon group (a group in which one hydrogen atom has been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given.

The alicyclic hydrocarbon group preferably has 3 to 20 carbon atoms, and more preferably 3 to 12 carbon atoms.

The alicyclic hydrocarbon group may be either a polycyclic group or a monocyclic group. As the monocyclic alicyclic hydrocarbon group, a group in which one or more hydrogen atoms have been removed from a monocycloalkane is preferable. The monocycloalkane preferably has 3 to 6 carbon atoms, and specific examples thereof include cyclopentane and cyclohexane. As the polycyclic alicyclic hydrocarbon group, a group in which one or more hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

Among these examples, as the cyclic aliphatic hydrocarbon group for $R^{101}$, a group in which one or more hydrogen atoms have been removed from a monocycloalkane or a polycycloalkane is preferable, a group in which one or more hydrogen atoms have been removed from a polycycloalkane is more preferable, an adamantyl group or a norbornyl group is still more preferable, and an adamantyl group is most preferable.

The linear or branched aliphatic hydrocarbon group which may be bonded to the alicyclic hydrocarbon group preferably has 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—CH$_2$—], an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—].

As the branched aliphatic hydrocarbon group, branched alkylene groups are preferred, and specific examples include various alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)CH$_2$CH$_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. As the alkyl group within the alkylalkylene group, a linear alkyl group of 1 to 5 carbon atoms is preferable.

The cyclic hydrocarbon group for R$^{101}$ may contain a hetero atom such as a heterocycle. Specific examples include lactone-containing cyclic groups represented by the aforementioned general formulae (a0-r-1) to (a0-r-7), the —SO$_2$— containing cyclic group represented by the aforementioned formulae (a0-r-8) to (a0-r-11), and other heterocyclic groups shown below.

[Chemical Formula 47]

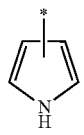
(r-hr-1)

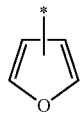
(r-hr-2)

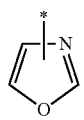
(r-hr-3)

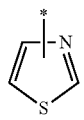
(r-hr-4)

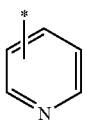
(r-hr-5)

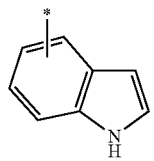
(r-hr-6)

(r-hr-7)

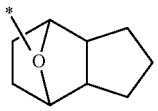
(r-hr-8)

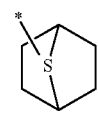
(r-hr-9)

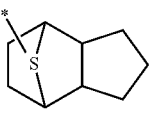
(r-hr-10)

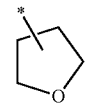
(r-hr-11)

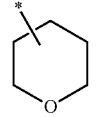
(r-hr-12)

(r-hr-13)

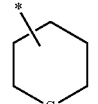
(r-hr-14)

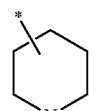
(r-hr-15)

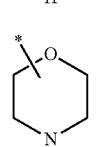
(r-hr-16)

As the substituent for the cyclic hydrocarbon group for R$^{101}$, an alkyl group, an alkoxy group, a halogen atom, a halogenated alkyl group, a hydroxyl group, a carbonyl group, a nitro group or the like can be used.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

The carbonyl group as the substituent is a group that substitutes a methylene group (—$CH_2$—) constituting the cyclic hydrocarbon group.

(Chain-like Alkyl Group which may have a Substituent)

The chain-like alkyl group for $R^{101}$ may be linear or branched.

The linear alkyl group preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched alkyl group preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

(Chain-like Alkenyl Group which May have a Substituent)

The chain-like alkenyl group for $R^{101}$ may be linear or branched, and preferably has 2 to 10 carbon atoms, more preferably 2 to 5 carbon atoms, still more preferably 2 to 4 carbon atoms, and most preferably 3 carbon atoms. Examples of linear alkenyl groups include a vinyl group, a propenyl group (an allyl group) and a butynyl group. Examples of branched alkenyl groups include a 1-methylvinyl group, a 2-methylvinyl group, a 1-methylpropenyl group and a 2-methylpropenyl group.

Among the above-mentioned examples, as the chain-like alkenyl group, a vinyl group or a propenyl group is more preferable, and a vinyl group is most preferable.

As the substituent for the chain-like alkyl group or alkenyl group for $R^{101}$, an alkoxy group, a halogen atom, a halogenated alkyl group, a hydroxyl group, a carbonyl group, a nitro group, an amino group, a cyclic group for $R^{101}$ or the like can be used.

Among these examples, as $R^{101}$, a cyclic group which may have a substituent is preferable, and a cyclic hydrocarbon group which may have a substituent is more preferable. Specifically, a phenyl group, a naphthyl group, a group in which one or more hydrogen atoms have been removed from a polycycloalkane, a lactone-containing cyclic group represented by any one of the aforementioned formula (a0-r-1) to (a0-r-7), and an —$SO_2$— containing cyclic group represented by any one of the aforementioned formula (a0-r-8) to (a0-r-11).

In formula (b-1), $Y^{101}$ represents a single bond or a divalent linking group containing an oxygen atom.

In the case where $Y^{101}$ is a divalent linking group containing an oxygen atom, $Y^{101}$ may contain an atom other than an oxygen atom. Examples of atoms other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an oxycarbonyl group (—O—C(=O)—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group. Furthermore, the combinations may have a sulfonyl group (—$SO_2$—) bonded thereto. As the combination, the linking group represented by formulas (y-a1-1) to (y-a1-7) shown below can be mentioned.

[Chemical Formula 48]

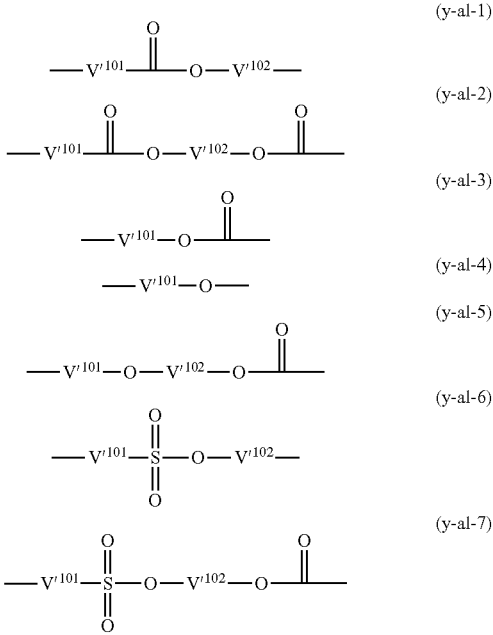

In the formulae, $V'^{101}$ represents a single bond or an alkylene group of 1 to 5 carbon atoms; $V'^{102}$ represents a divalent saturated hydrocarbon group of 1 to 30 carbon atoms.

The divalent saturated hydrocarbon group for $V'^{102}$ is preferably an alkylene group of 1 to 30 carbon atoms.

The alkylene group for $V'^{101}$ and $V'^{102}$ may be a linear alkylene group or a branched alkylene group, and a linear alkylene group is preferable.

Specific examples of the alkylene group for $V'^{101}$ and $V'^{102}$ include a methylene group [—$CH_2$]; an alkylmethylene group, such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—; an ethylene group [—$CH_2CH_2$—]; an alkylethylene group, such as —CH($CH_3$)$CH_2$—, —CH($CH_3$)CH($CH_3$)—, —C($CH_3$)$_2CH_2$— and —CH(CH$_2$CH$_3$)CH$_2$—; a trimethylene group (n-propylene group) [—CH$_2$CH$_2$CH$_2$—]; an alkyltrimethylene group, such as —CH(CH$_3$)CH$_2$CH$_2$— and —CH$_2$CH(CH$_3$)CH$_2$—; a tetramethylene group [—CH$_2$CH$_2$CH$_2$CH$_2$—]; an alkyltetramethylene group, such as —CH(CH$_3$)CH$_2$CH$_2$CH$_2$—, —CH$_2$CH(CH$_3$)CH$_2$CH$_2$—; and a pentamethylene group [—CH$_2$CH$_2$CH$_2$CH$_2$CH$_2$—].

Further, part of methylene group within the alkylene group for V'$^{101}$ and V'$^{102}$ may be substituted with a divalent aliphatic cyclic group of 5 to 10 carbon atoms. The aliphatic cyclic group is preferably a divalent group in which one hydrogen atom has been removed from the cyclic aliphatic hydrocarbon group for Ra'$^3$ in the aforementioned formula (a1-r-1), and a cyclohexylene group, 1,5-adamantylene group or 2,6-adamantylene group is preferable.

Y$^{101}$ is preferably a divalent linking group containing an ether bond or an ester bond, and groups represented by the aforementioned formulas (y-a1-1) to (y-a1-5) are preferable.

In formula (b-1), V$^{101}$ represents a single bond, an alkylene group or a fluorinated alkylene group. The alkylene group and the fluorinated alkylene group for V$^{101}$ preferably has 1 to 4 carbon atoms. Examples of the fluorinated alkylene group for V$^{101}$ include a group in which part or all of the hydrogen atoms within the alkylene group for V$^{101}$ have been substituted with fluorine. Among these examples, as V$^{101}$, a single bond or a fluorinated alkylene group of 1 to 4 carbon atoms is preferable.

In formula (b-1), R$^{102}$ represents a fluorine atom or a fluorinated alkyl group of 1 to 5 carbon atoms. R$^{102}$ is preferably a fluorine atom or a perfluoroalkyl group of 1 to 5 carbon atoms, and more preferably a fluorine atom.

As a specific example of the anion moiety for the component (b-1), in the case where Y$^{101}$ a single bond, a fluorinated alkylsulfonate anion such as a trifluoromethanesulfonate anion or a perfluorobutanesulfonate anion can be mentioned; and in the case where Y$^{101}$ represents a divalent linking group containing an oxygen atom, anions represented by formulae (an-1) to (an-3) shown below can be mentioned.

[Chemical Formula 49]

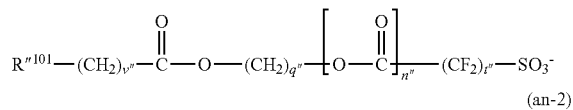
(an-1)

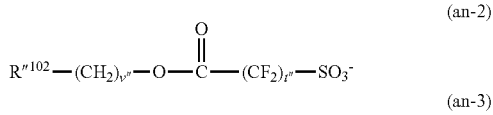
(an-2)

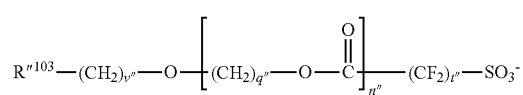
(an-3)

In the formulae, R"$^{101}$ represents an aliphatic cyclic group which may have a substituent, a group represented by any one of the aforementioned formulas (r-hr-1) to (r-hr-6) or a chain-like alkyl group which may have a substituent; R"$^{102}$ represents an aliphatic cyclic group which may have a substituent, a lactone-containing cyclic group represented by any one of the aforementioned formulae (a0-r-1) to (a0-r-7) or an —SO$_2$— containing cyclic group represented by any one of the aforementioned formulae (a0-r-8) to (a0-r-11); R"$^{103}$ represents an aromatic cyclic group which may have a substituent, an aliphatic cyclic group which may have a substituent or a chain-like alkenyl group which may have a substituent; v" represents an integer of 0 to 3; q" represents an integer of 1 to 20; t" represents an integer of 1 to 3; and n" represents 0 or 1.

As the aliphatic cyclic group for R"$^{101}$, R"$^{102}$ and R"$^{103}$ which may have a substituent, the same groups as the cyclic aliphatic hydrocarbon group for R$^{101}$ described above are preferable. As the substituent, the same groups as those described above for substituting the cyclic aliphatic hydrocarbon group for R$^{101}$ can be mentioned.

As the aromatic cyclic group for R"$^{103}$ which may have a substituent, the same groups as the aromatic hydrocarbon group for the cyclic hydrocarbon group represented by R$^{101}$ described above are preferable. The substituent is the same as defiend for the substituent for the aromatic hydrocarbon group represented by R$^{101}$.

As the chain-like alkyl group for R"$^{101}$ which may have a substituent, the same groups as those described above for R$^{101}$ are preferable. As the chain-like alkenyl group for R"$^{103}$ which may have a substituent, the same groups as those described above for R$^{101}$ are preferable.

Anion Moiety of Component (b-2)

In formula (b-2), R$^{104}$ and R$^{105}$ each independently represents a cyclic group which may have a substituent, a chain-like alkyl group which may have a substituent or a chain-like alkenyl group which may have a substituent, and is the same as defined for R$^{101}$ in formula (b-1). R$^{104}$ and R$^{105}$ may be mutually bonded to form a ring.

As R$^{104}$ and R$^{105}$, a chain-like alkyl group which may have a substituent is preferable, and a linear or branched alkyl group or a linear or branched fluorinated alkyl group is more preferable.

The chain-like alkyl group preferably has 1 to 10 carbon atoms, more preferably 1 to 7 carbon atoms, and still more preferably 1 to 3 carbon atoms. The smaller the number of carbon atoms of the chain-like alkyl group for R$^{104}$ and R$^{105}$, the more the solubility in a resist solvent is improved. Further, in the chain-like alkyl group for R$^{104}$ and R$^{105}$, it is preferable that the number of hydrogen atoms substituted with fluorine atoms is as large as possible because the acid strength increases and the transparency to high energy radiation of 200 nm or less or electron beam is improved. The fluorination ratio of the chain-like alkyl group is preferably from 70 to 100%, more preferably from 90 to 100%, and it is particularly desirable that the chain-like alkyl group be a perfluoroalkyl group in which all hydrogen atoms are substituted with fluorine atoms.

In formula (b-2), V$^{102}$ and V$^{103}$ each independently represents a single bond, an alkylene group or a fluorinated alkylene group, and is the same as defined for V$^{101}$ in formula (b-1).

In formula (b-2), L$^{101}$ and L$^{102}$ each independently represents a single bond or an oxygen atom.

Anion Moiety of Component (b-3)

In formula (b-3), R$^{106}$ to R$^{108}$ each independently represents a cyclic group which may have a substituent, a chain-like alkyl group which may have a substituent or a chain-like alkenyl group which may have a substituent, and is the same as defined for R$^{101}$ in formula (b-1).

L$^{103}$ to L$^{105}$ each independently represents a single bond, —CO— or —SO$_2$—.

{Cation Moiety}

In formulae (b-1), (b-2) and (b-3), M'$^{m+}$ represents an onium cation having a valency of m, preferably a sulfonium cation or an iodonium cation, and most preferably an organic cation represented by any one of the following formulae (ca-1) to (ca-4).

[Chemical Formula 50]

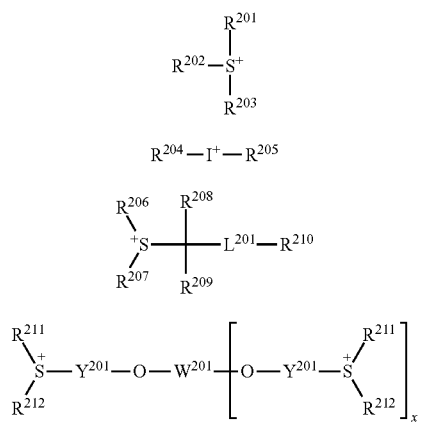

In the formulae, $R^{201}$ to $R^{207}$, $R^{211}$ and $R^{212}$ independently represents an aryl group, an alkyl group or an alkenyl group, provided that two of $R^{201}$ to $R^{203}$, $R^{206}$ and $R^{207}$, or $R^{211}$ and $R^{212}$ may be mutually bonded to form a ring with the sulfur atom; $R^{208}$ and $R^{209}$ each independently represents a hydrogen atom or an alkyl group of 1 to 5 carbon atoms; $R^{210}$ represents an aryl group which may have a substituent, an alkyl group which may have a substituent, an alkenyl group which may have a substituent or an —$SO_2$— containing cyclic group which may have a substituent; $L^{201}$ represents —C(=O)— or —C(=O)—O—; $Y^{201}$ each independently represents an arylene group, an alkylene group or an alkenylene group; x represents 1 or 2; and $W^{201}$ represents a linking group having a valency of (x+1).

As the aryl group for $R^{201}$ to $R^{207}$, $R^{211}$ and $R^{212}$, an unsubstituted aryl group of 6 to 20 carbon atoms can be mentioned, and a phenyl group or a naphthyl group is preferable.

The alkyl group for $R^{201}$ to $R^{207}$, $R^{211}$ and $R^{212}$ is preferably a chain-like or cyclic alkyl group having 1 to 30 carbon atoms.

The alkenyl group for $R^{201}$ to $R^{207}$, $R^{211}$ and $R^{212}$ preferably has 2 to 10 carbon atoms.

Specific examples of the substituent which $R^{201}$ to $R^{207}$ and $R^{210}$ to $R^{212}$ may have include an alkyl group, a halogen atom, a halogenated alkyl group, a carbonyl group, a cyano group, an amino group, an aryl group, and groups represented by formulae (ca-r-1) to (ca-r-7) shown below.

[Chemical Formula 51]

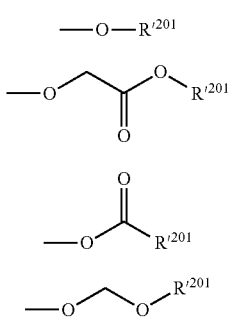

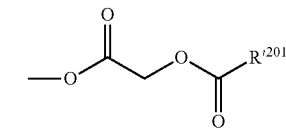

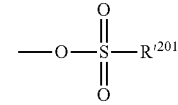

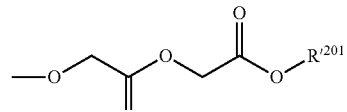

In the formulae, $R'^{201}$ each independently represents a hydrogen atom, a cyclic group which may have a substituent, a chain-like alkyl group which may have a substituent or a chain-like alkenyl group which may have a substituent.

As the cyclic group which may have a substituent, the chain-like alkyl group which may have a substituent and the chain-like alkenyl group which may have a substituent for $R'^{201}$, the same groups as those described above for $R'^{101}$ can be mentioned. As the cyclic group which may have a substituent and chain-like alkyl group which may have a substituent, the same groups as those described above for the acid dissociable group represented by the aforementioned formula (a1-r-2) can be also mentioned.

When $R^{201}$ to $R^{203}$, $R^{206}$, $R^{207}$, $R^{211}$ and $R^{212}$ are mutually bonded to form a ring with the sulfur atom, these groups may be mutually bonded via a hetero atom such as a sulfur atom, an oxygen atom or a nitrogen atom, or a functional group such as a carbonyl group, —SO—, —$SO_2$—, —$SO_3$—, —COO—, —CONH— or —N(R)— (wherein $R_N$ represents an alkyl group of 1 to 5 carbon atoms). The ring containing the sulfur atom in the skeleton thereof is preferably a 3 to 10-membered ring, and most preferably a 5 to 7-membered ring. Specific examples of the ring formed include a thiophene ring, a thiazole ring, a benzothiophene ring, a thianthrene ring, a benzothiophene ring, a dibenzothiophene ring, a 9H-thioxanthene ring, a thioxanthone ring, a phenoxathiin ring, a tetrahydrothiophenium ring, and a tetrahydrothiopyranium ring.

$R^{208}$ and $R^{209}$ each independently represents a hydrogen atom or an alkyl group of 1 to 5 carbon atoms, preferably a hydrogen atom or an alkyl group of 1 to 3 carbon atoms, and when $R^{208}$ and $R^{209}$ each represents an alkyl group, $R^{208}$ and $R^{209}$ may be mutually bonded to form a ring.

$R^{210}$ represents an aryl group which may have a substituent, an alkyl group which may have a substituent, an alkenyl group which may have a substituent, or an —$SO_2$— containing cyclic group which may have a substituent.

Examples of the aryl group for $R^{210}$ include an unsubstituted aryl group of 6 to 20 carbon atoms, and a phenyl group or a naphthyl group is preferable.

As the alkyl group for $R^{210}$, a chain-like or cyclic alkyl group having 1 to 30 carbon atoms is preferable.

The alkenyl group for $R^{210}$ preferably has 2 to 10 carbon atoms.

The —$SO_2$— containing cyclic group for $R^{210}$ which may have a substituent is the same as defined for the aforementioned "—$SO_2$— containing cyclic group", and the group represented by the aforementioned general formula (a0-r-8) is preferable.

Each $Y^{201}$ independently represents an arylene group, an alkylene group or an alkenylene group.

Examples of the arylene group for $Y^{201}$ include groups in which one hydrogen atom has been removed from an aryl group given as an example of the aromatic hydrocarbon group for $R^{101}$ in formula (b-1) described later.

The alkylene group and the alkenylene group for $Y^{201}$ is the same as defined for the aliphatic hydrocarbon group as the divalent linking group represented by $Va^1$ in the aforementioned general formula (a1-1).

In the formula (ca-4), x represents 1 or 2.

$W^{201}$ represents a linking group having a valency of (x+1), i.e., a divalent or trivalent linking group.

As the divalent linking group for $W^{201}$, a divalent hydrocarbon group which may have a substituent is preferable, and as examples thereof, the same hydrocarbon groups as those described above for $Ya^{21}$ in the general formula (a2-1) can be mentioned. The divalent linking group for $W^{201}$ may be linear, branched or cyclic, and cyclic is more preferable. Among these, an arylene group having two carbonyl groups, each bonded to the terminal thereof is preferable. Examples of the arylene group include a phenylene group and a naphthylene group, and a phenylene group is particularly desirable.

As the trivalent linking group for $W^{201}$, a group in which one hydrogen atom has been removed from the aforementioned divalent linking group for $W^{201}$ and a group in which the divalent linking group has been bonded to another divalent linking group can be mentioned. The trivalent linking group for $W^{201}$ is preferably a group in which 2 carbonyl groups are bonded to an arylene group.

Specific examples of preferable cations represented by formula (ca-1) include cations represented by formulae (ca-1-1) to (ca-1-67) shown below.

[Chemical Formula 52]

(ca-1-1)

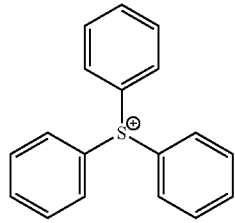

(ca-1-2)

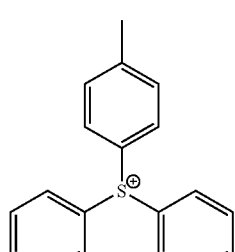

(ca-1-3)

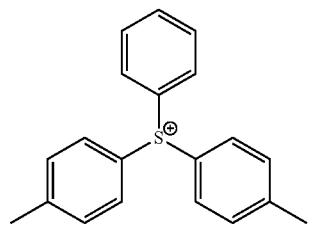

(ca-1-4)

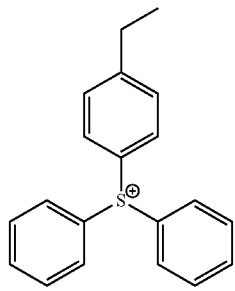

(ca-1-5)

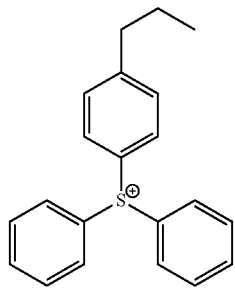

(ca-1-6)

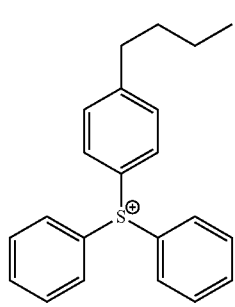

(ca-1-7)

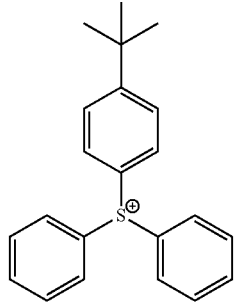

(ca-1-8)

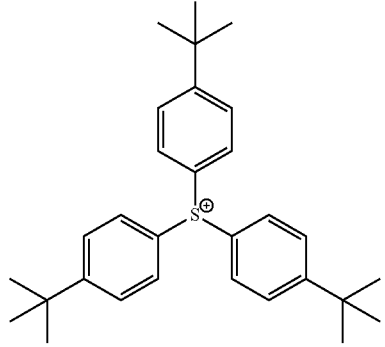

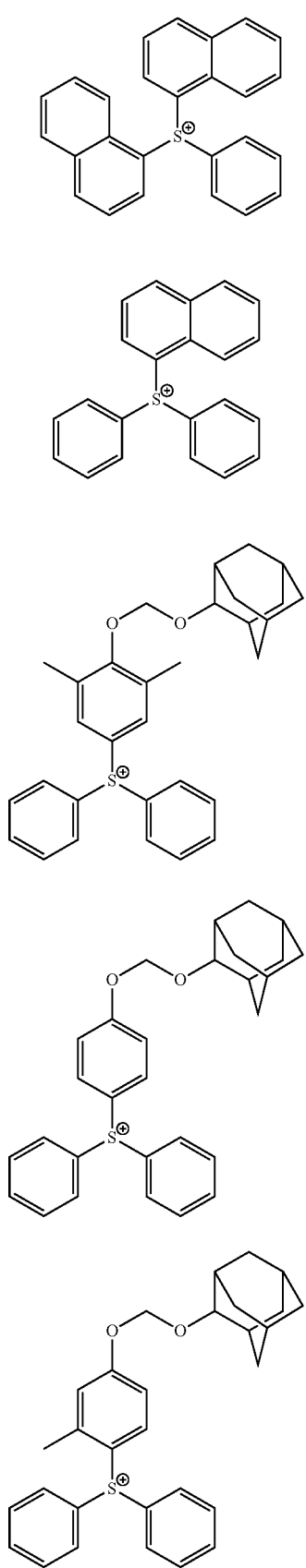
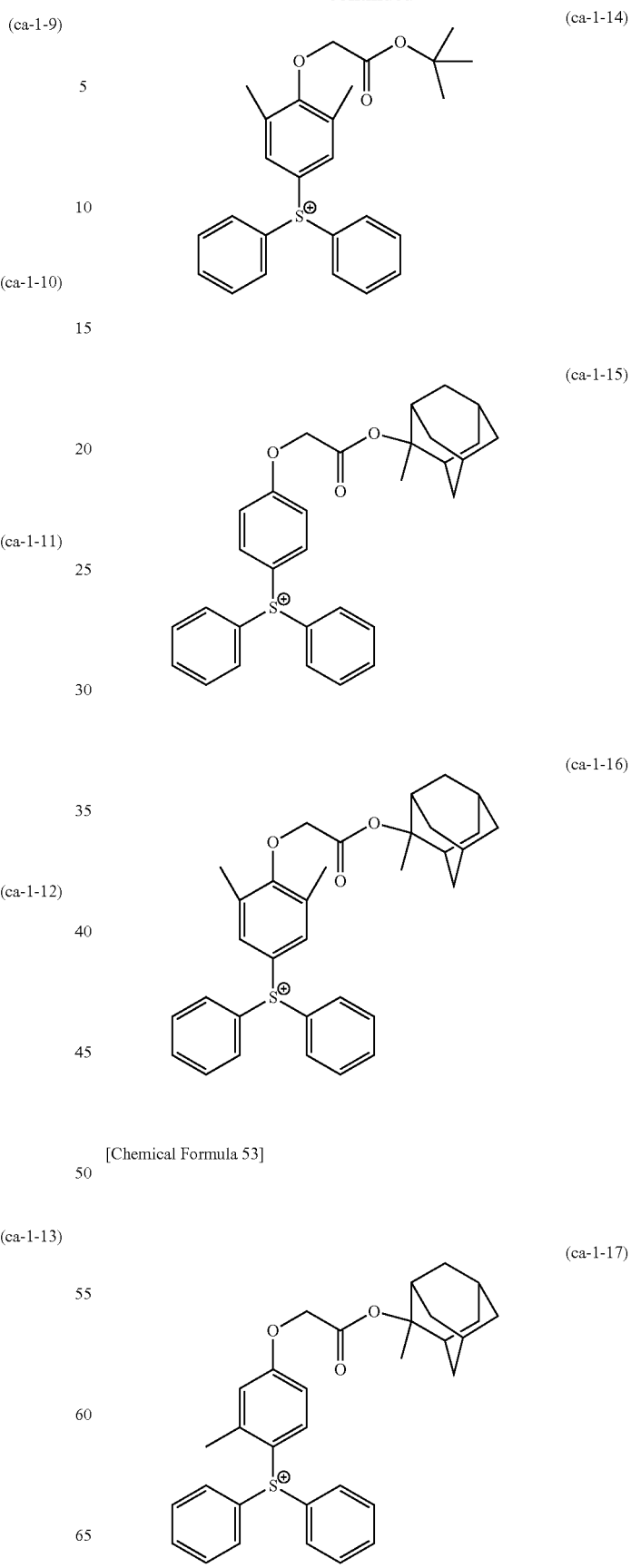
[Chemical Formula 53]

85
-continued
(ca-1-18)
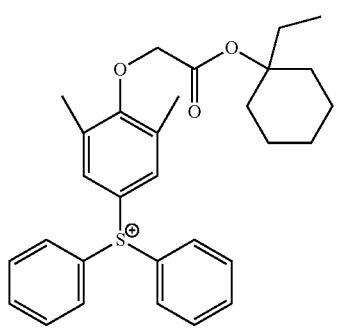
(ca-1-19)
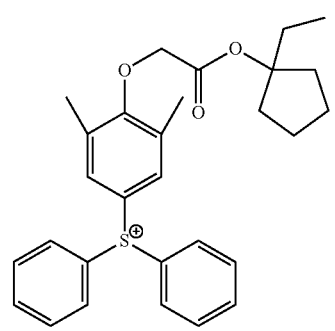
(ca-1-20)
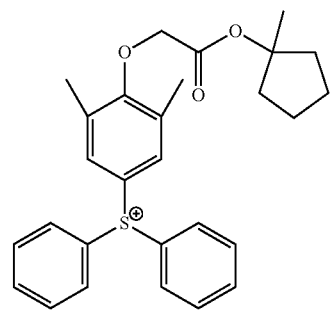
(ca-1-21)
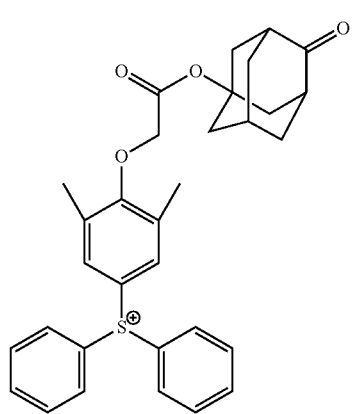
86
-continued
(ca-1-22)
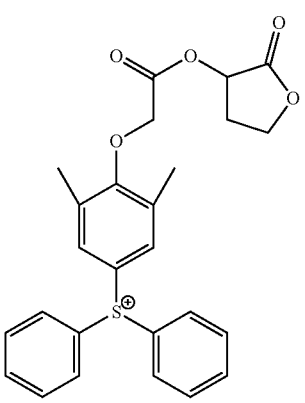
(ca-1-23)
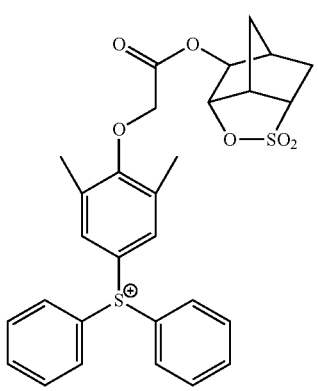
(ca-1-24)
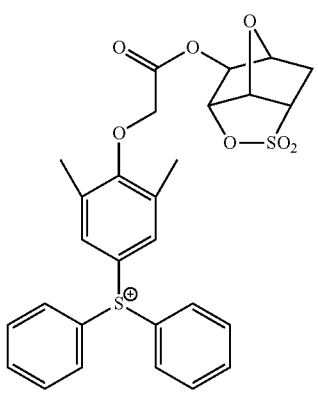
(ca-1-25)
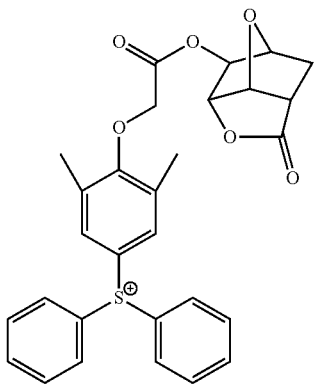

-continued
(ca-1-26)
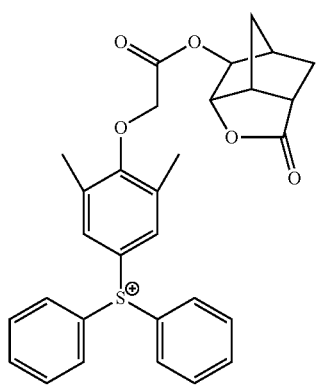
(ca-1-27)
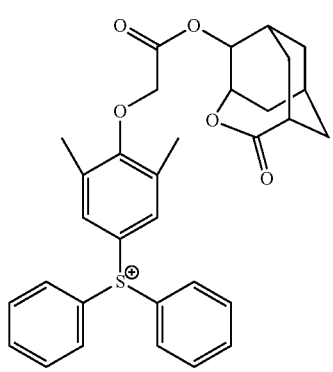
(ca-1-28)
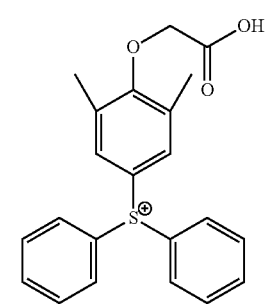
(ca-1-29)
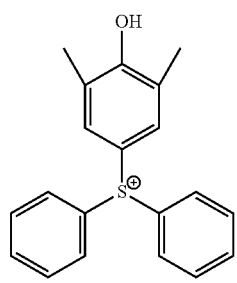
(ca-1-30)
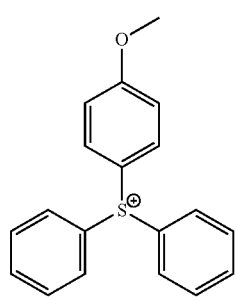
-continued
(ca-1-31)
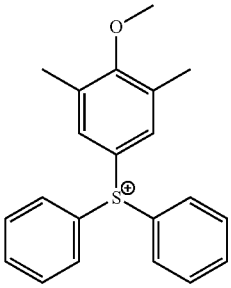
(ca-1-32)
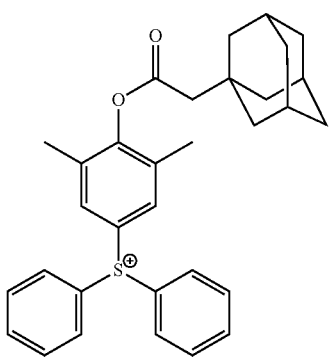
(ca-1-33)
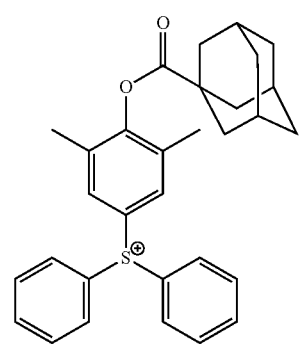
[Chemical Formula 54]
(ca-1-34)
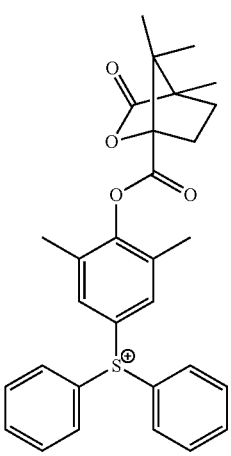

(ca-1-35)
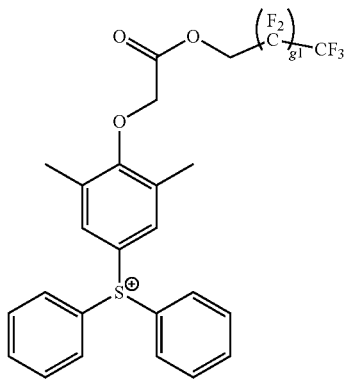
(ca-1-36)
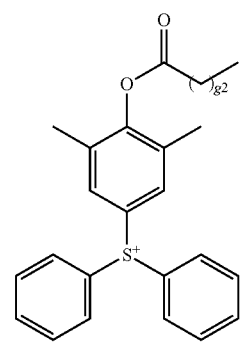
(ca-1-37)
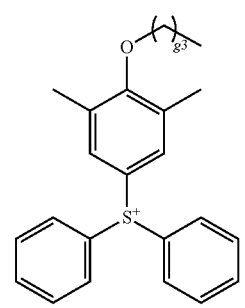
(ca-1-38)
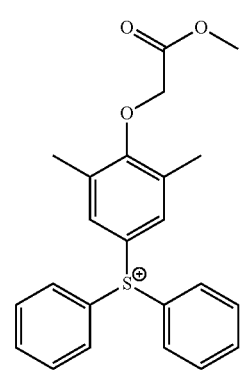
(ca-1-39)
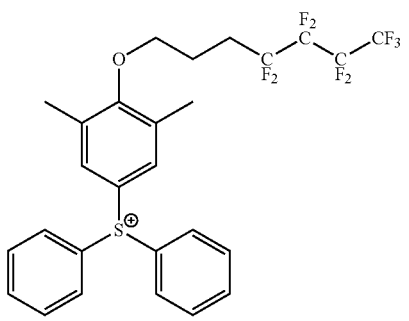
(ca-1-40)
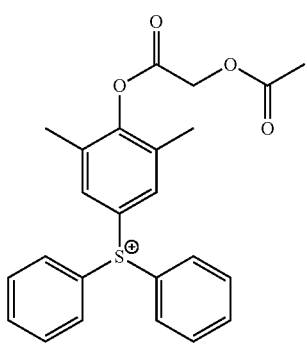
(ca-1-41)
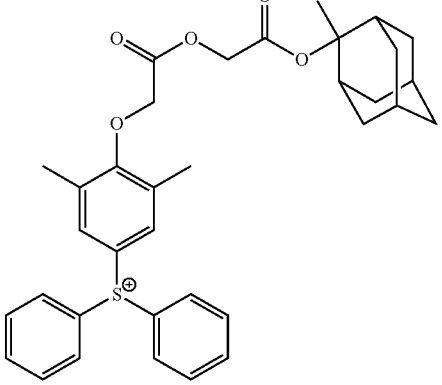
(ca-1-42)
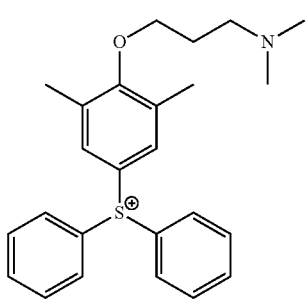
(ca-1-43)
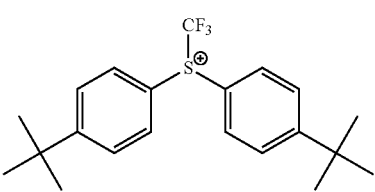

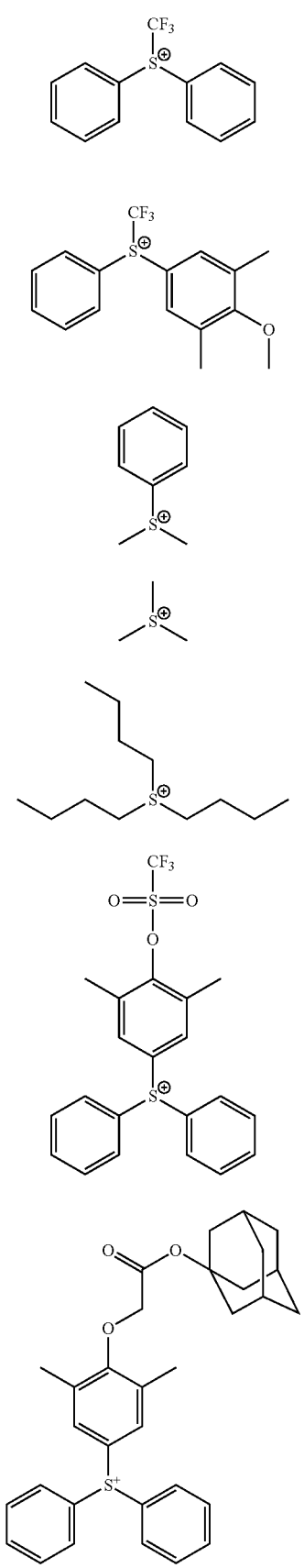
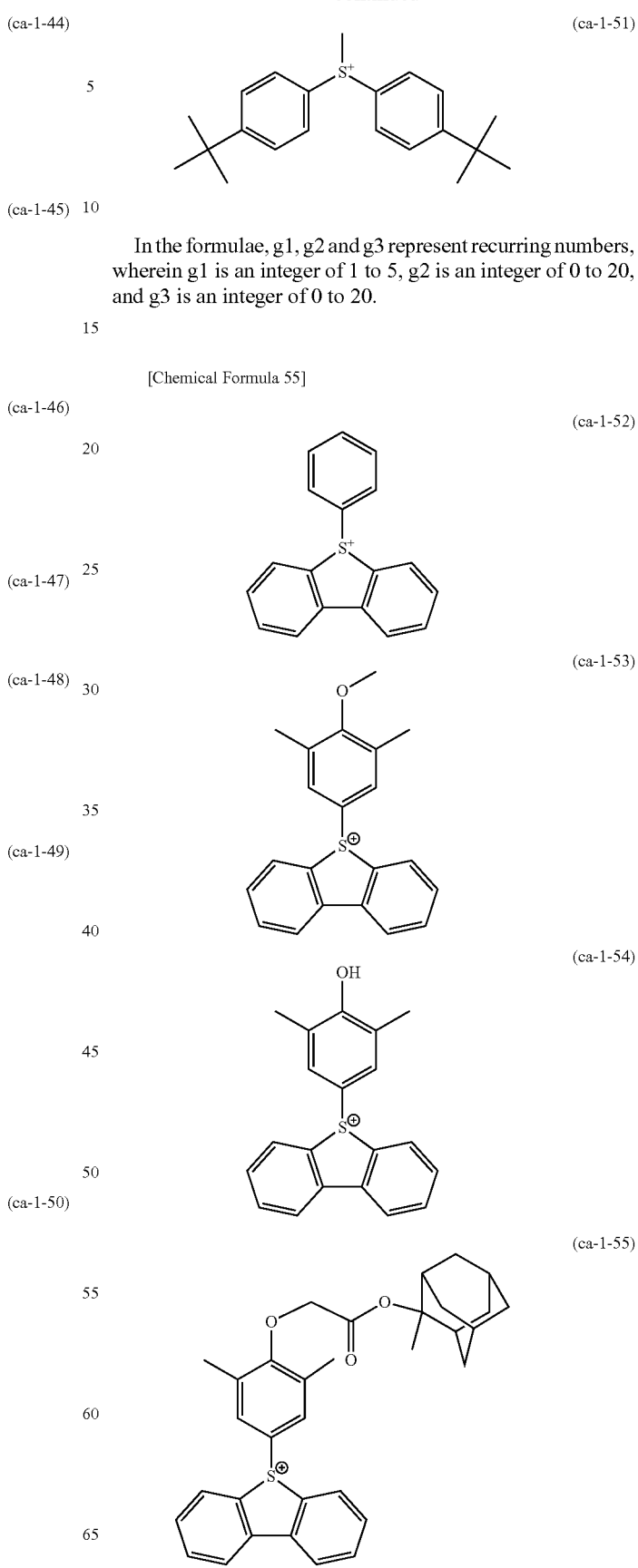
In the formulae, g1, g2 and g3 represent recurring numbers, wherein g1 is an integer of 1 to 5, g2 is an integer of 0 to 20, and g3 is an integer of 0 to 20.
[Chemical Formula 55]

(ca-1-56)
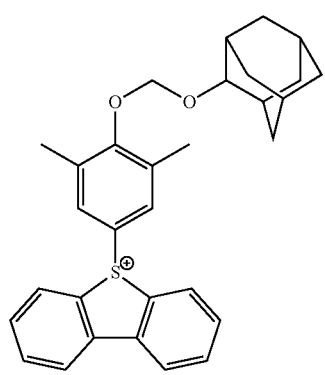
(ca-1-57)
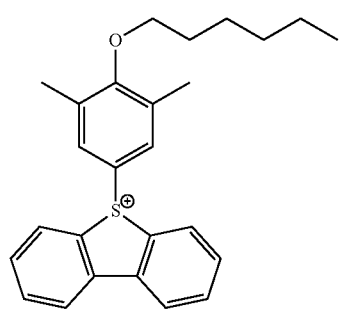
(ca-1-58)
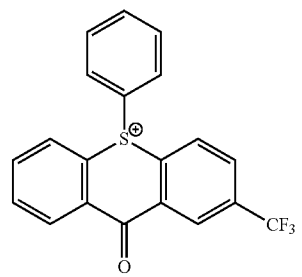
(ca-1-59)
(ca-1-60)
(ca-1-61)
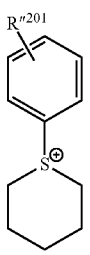
(ca-1-62)
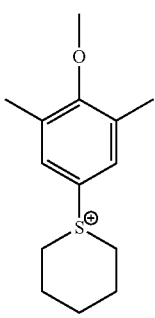
(ca-1-63)
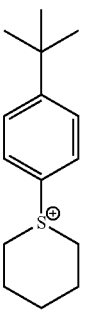
(ca-1-64)
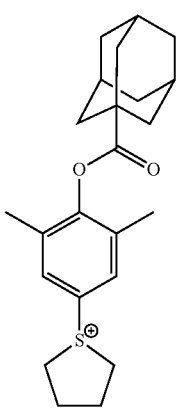

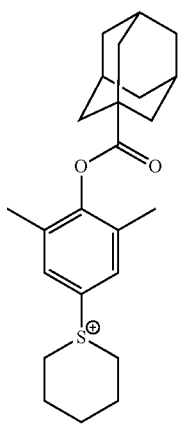
(ca-1-65)

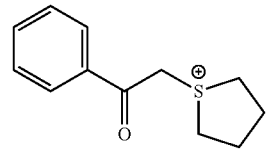
(ca-3-1)

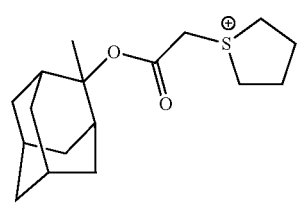
(ca-3-2)

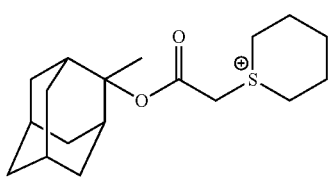
(ca-3-3)

(ca-1-66)

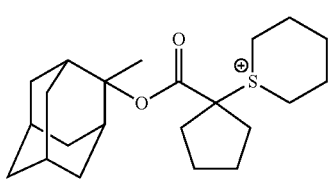
(ca-3-4)

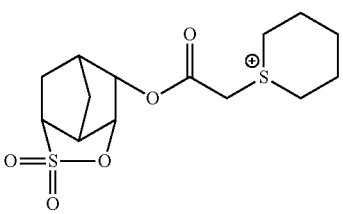

(ca-3-5)

(ca-3-6)

(ca-1-67)

[Chemical Formula 56]

Specific examples of preferable cations represented by formula (ca-4) include cations represented by formulae (ca-4-1) and (ca-4-2) shown below.

[Chemical Formula 57]

(ca-4-1)

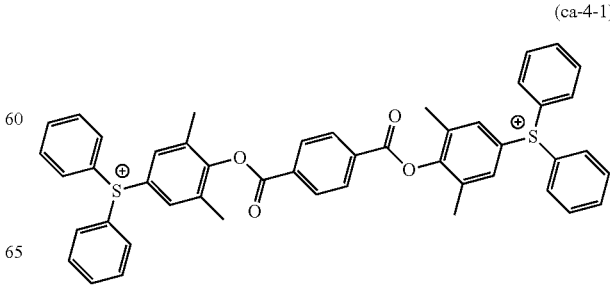

In the formulae, $R''^{201}$ represents a hydrogen atom or a substituent, and as the substituent, the same groups as those described above for substituting $R^{201}$ to $R^{207}$ and $R^{210}$ to $R^{212}$ can be mentioned.

Specific examples of preferable cations represented by the formula (ca-2) include a diphenyliodonium cation and a bis(4-tert-butylphenyl)iodonium cation.

Specific examples of preferable cations represented by formula (ca-3) include cations represented by formulae (ca-3-1) to (ca-3-6) shown below.

(ca-4-2)

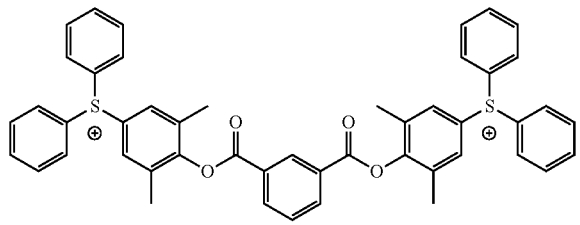

Among the above examples, as the cation moiety [$(M^{m+})_{1/m}$], a cation represented by general formula (ca-1) is preferable, and a cation represented by any one of formulae (ca-1-1) to (ca-1-67) is more preferable.

As the component (B2), one type of acid generator may be used, or two or more types may be used in combination.

When the resist composition contains the component (B2), the amount of the component (B2) relative to 100 parts by weight of the component (A) is preferably within a range from 1 to 15 parts by weight, more preferably 1.5 to 12.5 parts by weight, and still more preferably 2 to 10 parts by weight.

When the amount of the component (B2) is at least as large as the lower limit of the above preferable range, the sensitivity can be reliably controlled. On the other hand, when the amount of the component is no more than the upper limit of the above preferable range, in particular, both reduction of roughness and mask reproducibility can be reliably achieved.

When the component (B1) and the component (B2) are used in combination as the component (B), the weight ratio of the component (B1): the component (B2) is preferably from 99:1 to 5:95, more preferably from 95:5 to 10:90, and most preferably from 90:10 to 20:80.

When the amounts of the component (B1) and the component (B2) are within the above-mentioned range, in particular, both reduction of roughness and mask reproducibility can be reliably achieved.

In the resist composition of the present invention, the total amount of the component (B) relative to 100 parts by weight of the component (A) is preferably 0.5 to 50 parts by weight, and more preferably 1 to 40 parts by weight. When the amount of the component (B) is within the above-mentioned range, formation of a resist pattern can be satisfactorily performed. Further, by virtue of the above-mentioned range, a uniform solution can be obtained and the storage stability becomes satisfactory.

[Component (D)]

The resist composition of the present invention may include, in addition to the components (A) and (B), an acid diffusion control component (hereafter, sometimes referred to as "component (D)").

The component (D) functions as an acid diffusion control agent, i.e., a quencher which traps the acid generated from the component (B) and the like upon exposure.

The component (D) may be a photodecomposable base (D1) (hereafter, referred to as "component (D1)") which is decomposed upon exposure and then loses the ability of controlling of acid diffusion, or a nitrogen-containing organic compound (D2) (hereafter, referred to as "component (D2)") which does not fall under the definition of component (D1).

Component (D1)

When a resist pattern is formed using a resist composition containing the component (D1), the contrast between exposed portions and unexposed portions is improved.

The component (D1) is not particularly limited, as long as it is decomposed upon exposure and then loses the ability of controlling of acid diffusion. As the component (D1), at least one compound selected from the group consisting of a compound represented by general formula (d1-1) shown below (hereafter, referred to as "component (d1-1)"), a compound represented by general formula (d1-2) shown below (hereafter, referred to as "component (d1-2)") and a compound represented by general formula (d1-3) shown below (hereafter, referred to as "component (d1-3)") is preferably used.

At exposed portions, the components (d1-1) to (d1-3) are decomposed and then lose the ability of controlling of acid diffusion (i.e., basicity), and therefore the components (d1-1) to (d1-3) cannot function as a quencher, whereas at unexposed portions, the components (d1-1) to (d1-3) functions as a quencher.

[Chemical Formula 58]

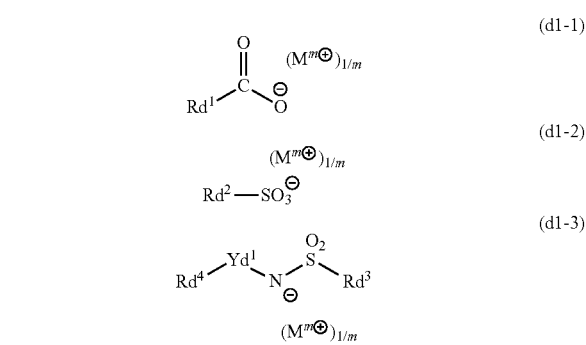

In the formulae, $Rd^1$ to $Rd^4$ represent a cyclic group which may have a substituent, a chain-like alkyl group which may have a substituent or a chain-like alkenyl group which may have a substituent, provided that, the carbon atom adjacent to the sulfur atom within the $Rd^2$ in the formula (d1-2) has no fluorine atom bonded thereto; $Yd^1$ represents a single bond or a divalent linking group; m represents an integer of 1 or more; and each $M^{m+}$ independently represents an organic cation having a valency of m.

{Component (d1-1)}—Anion Moiety

In formula (d1-1), $Rd^1$ represents a cyclic group which may have a substituent, a chain-like alkyl group which may have a substituent or a chain-like alkenyl group which may have a substituent, and is the same groups as those defined above for $R^{101}$ in the aforementioned formula (b-1).

Among these, as the group for $Rd^1$, an aromatic hydrocarbon group which may have a substituent, an aliphatic cyclic group which may have a substituent and a chain-like alkyl group which may have a substituent are preferable. As the substituents which these groups may have, a fluorine atom or a fluorinated alkyl group is preferable.

The aromatic hydrocarbon group is preferably a phenyl group or a naphthyl group.

Examples of the aliphatic cyclic group include groups in which one or more hydrogen atoms have been removed from a polycycloalkane such as adamantane, norbornane, isobornane, tricyclodecane or tetracyclododecane.

The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group or a 4-methylpentyl group.

In the case where the chain-like alkyl group is a fluorinated alkyl group having a fluorine atom or a fluorinated alkyl group, the fluorinated alkyl group preferably has 1 to 11 carbon atoms, more preferably 1 to 8 carbon atoms, and still more preferably 1 to 4 carbon atoms. The fluorinated alkyl group may contain an atom other than fluorine. Examples of the atom other than fluorine include an oxygen atom, a carbon atom, a hydrogen atom, a sulfur atom and a nitrogen atom.

As $Rd^1$, a fluorinated alkyl group in which part or all of the hydrogen atoms constituting a linear alkyl group have been substituted with fluorine atom(s) is preferable, and a fluorinated alkyl group in which all of the hydrogen atoms constituting a linear alkyl group have been substituted with fluorine atoms (i.e., a linear perfluoroalkyl group) is more preferable.

Specific examples of preferable anion moieties for the component (d1-1) are shown below.

[Chemical Formula 59]

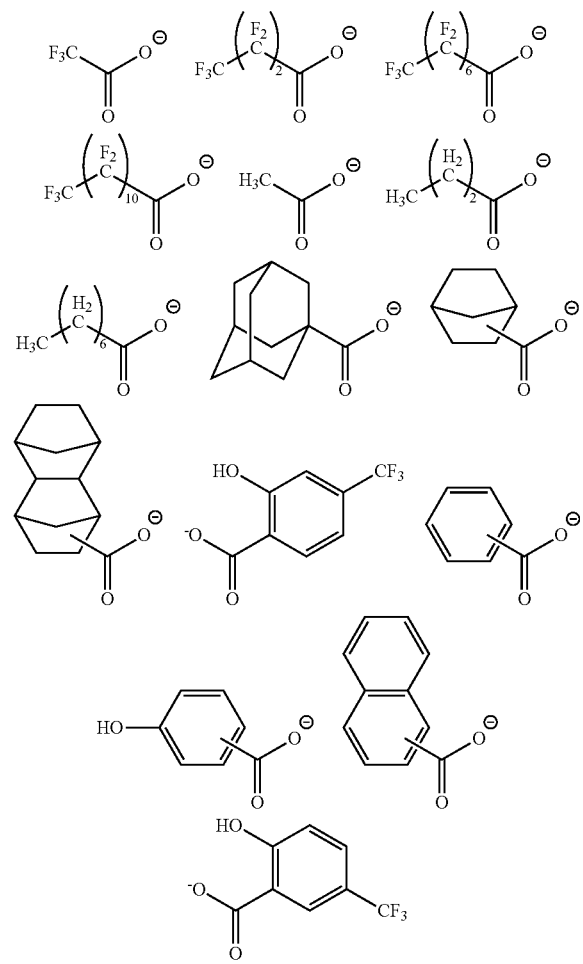

Cation Moiety

In formula (d1-1), $M^{m+}$ represents an organic cation having a valency of m.

As the organic cation for $M^{m+}$, for example, the same cation moieties as those represented by the aforementioned formulae (ca-1) to (ca-4) are preferable, and cation moieties represented by the aforementioned formulae (ca-1-1) to (ca-1-67) are more preferable.

As the component (d1-1), one type of compound may be used, or two or more types of compounds may be used in combination.

{Component (d1-2)}—Anion Moiety

In formula (d1-2), $Rd^2$ represents a cyclic group which may have a substituent, a chain-like alkyl group which may have a substituent or a chain-like alkenyl group which may have a substituent, and is the same groups as those defined above for $R^{101}$ in the aforementioned formula (b-1).

provided that, the carbon atom adjacent to the sulfur atom within $Rd^2$ group has no fluorine atom bonded thereto (i.e., the carbon atom adjacent to the sulfur atom within $Rd^2$ group does not substituted with a fluorine atom). As a result, the anion of the component (d1-2) becomes an appropriately weak acid anion, thereby improving the quenching ability of the component (D).

As $Rd^2$, a chain-like alkyl group which may have a substituent or an aliphatic cyclic group which may have a substituent is preferable. The chain-like alkyl group preferably has 1 to 10 carbon atoms, and more preferably 3 to 10 carbon atoms. As the aliphatic cyclic group, a group in which one or more hydrogen atoms have been removed from adamantane, norbornane, isobornane, tricyclodecane, tetracyclododecane or camphor (which may have a substituent) is more preferable.

The hydrocarbon group for $Rd^2$ may have a substituent. As the substituent, the same groups as those described above for substituting the hydrocarbon group (e.g., aromatic hydrocarbon group, aliphatic hydrocarbon group) for $Rd^1$ in the formula (d1-1) can be mentioned.

Specific examples of preferable anion moieties for the component (d1-2) are shown below.

[Chemical Formula 60]

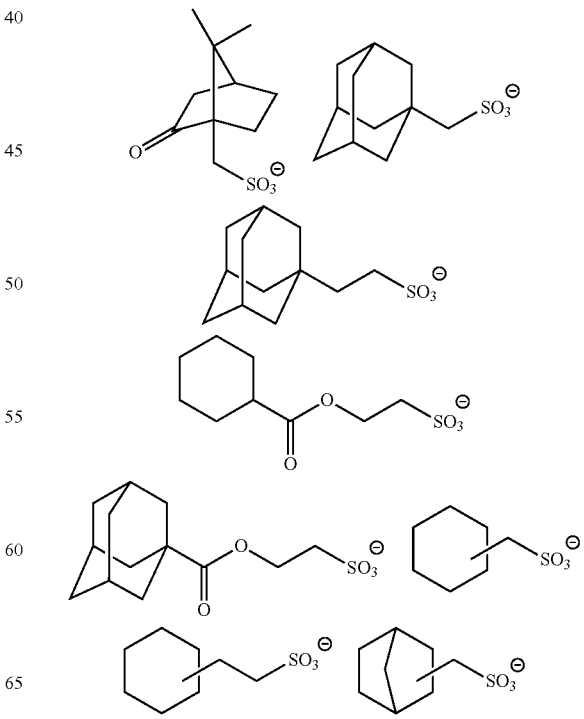

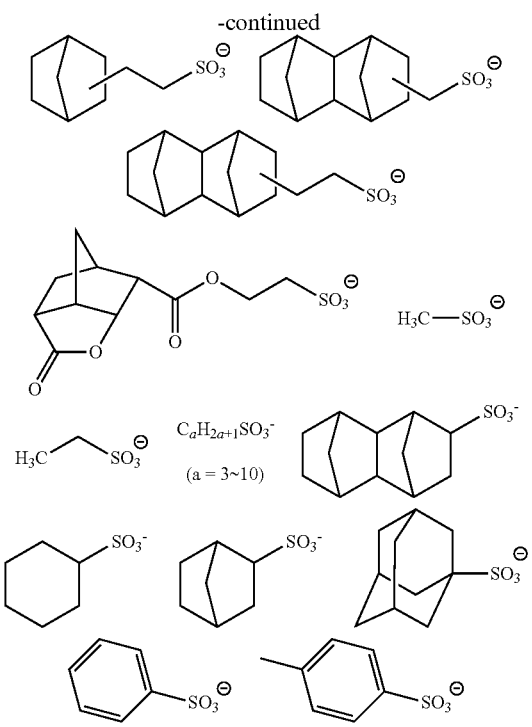

Cation Moiety

In formula (d1-2), $M^{m+}$ is an organic cation having a valency of m, and is the same as defined for $M^{m+}$ in the aforementioned formula (d1-1).

As the component (d1-2), one type of compound may be used, or two or more types of compounds may be used in combination.

{Component (d1-3)}—Anion Moiety

In formula (d1-3), $Rd^3$ represents a cyclic group which may have a substituent, a chain-like alkyl group which may have a substituent or a chain-like alkenyl group which may have a substituent, and is the same groups as those defined above for $R^{101}$ in the aforementioned formula (b-1), and a cyclic group containing a fluorine atom, a chain-like alkyl group or a chain-like alkenyl group is preferable. Among these, a fluorinated alkyl group is preferable, and more preferably the same fluorinated alkyl groups as those described above for $Rd^1$.

In formula (d1-3), $Rd^4$ represents a cyclic group which may have a substituent, a chain-like alkyl group which may have a substituent or a chain-like alkenyl group which may have a substituent, and is the same groups as those defined above for $R^{101}$ in the aforementioned formula (b-1).

Among these, an alkyl group which may have substituent, an alkoxy group which may have substituent, an alkenyl group which may have substituent or a cyclic group which may have substituent is preferable.

The alkyl group for $Rd^4$ is preferably a linear or branched alkyl group of 1 to 5 carbon atoms, and specific examples include a methyl group, an ethyl group, a propyl group, an isopropyl group, an n-butyl group, an isobutyl group, a tert-butyl group, a pentyl group, an isopentyl group, and a neopentyl group. Part of the hydrogen atoms within the alkyl group for $Rd^4$ may be substituted with a hydroxy group, a cyano group or the like.

The alkoxy group for $Rd^4$ is preferably an alkoxy group of 1 to 5 carbon atoms, and specific examples thereof include a methoxy group, an ethoxy group, an n-propoxy group, an iso-propoxy group, an n-butoxy group and a tert-butoxy group. Among these, a methoxy group and an ethoxy group are preferable.

As the alkenyl group for $Rd^4$, the same groups as those described above for $R^{101}$ in the aforementioned formula (b-1) can be mentioned, and a vinyl group, a propenyl group (an allyl group), a 1-methylpropenyl group and a 2-methylpropenyl group are preferable. These groups may have an alkyl group of 1 to 5 carbon atoms or a halogenated alkyl group of 1 to 5 carbon atoms as a substituent.

As the cyclic group for $Rd^4$, the same groups as those described above for $R^{101}$ in the aforementioned formula (b-1) can be mentioned. Among these, as the cyclic group, an alicyclic group (e.g., a group in which one or more hydrogen atoms have been removed from a cycloalkane such as cyclopentane, cyclohexane, adamantane, norbornane, isobornane, tricyclodecane or tetracyclododecane) or an aromatic group (e.g., a phenyl group or a naphthyl group) is preferable. When $Rd^4$ is an alicyclic group, the resist composition can be satisfactorily dissolved in an organic solvent, thereby improving the lithography properties. Alternatively, when $Rd^4$ is an aromatic group, the resist composition exhibits an excellent photoabsorption efficiency in a lithography process using EUV or the like as the exposure source, thereby resulting in the improvement of the sensitivity and the lithography properties.

In formula (d1-3), $Yd^1$ represents a single bond or a divalent linking group.

The divalent linking group for $Yd^1$ is not particularly limited, and examples thereof include a divalent hydrocarbon group (aliphatic hydrocarbon group, or aromatic hydrocarbon group) which may have a substituent and a divalent linking group containing a hetero atom. The divalent linking groups are the same as defined for the divalent hydrocarbon group which may have a substituent and the divalent linking group containing a hetero atom explained above as the divalent linking group for $Ya^{21}$ in the aforementioned formula (a2-1).

As $Yd^1$, a carbonyl group, an ester bond, an amide bond, an alkylene group or a combination of these is preferable. As the alkylene group, a linear or branched alkylene group is more preferable, and a methylene group or an ethylene group is still more preferable.

Specific examples of preferable anion moieties for the component (d1-3) are shown below.

[Chemical Formula 61]

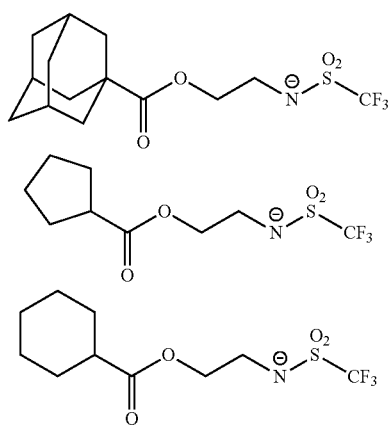

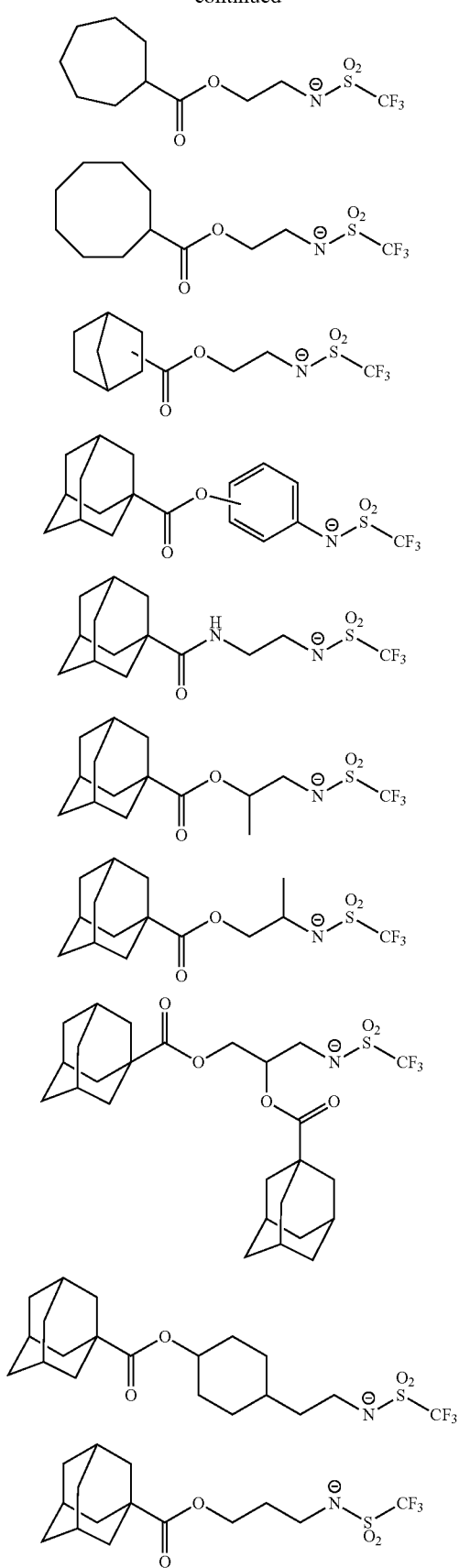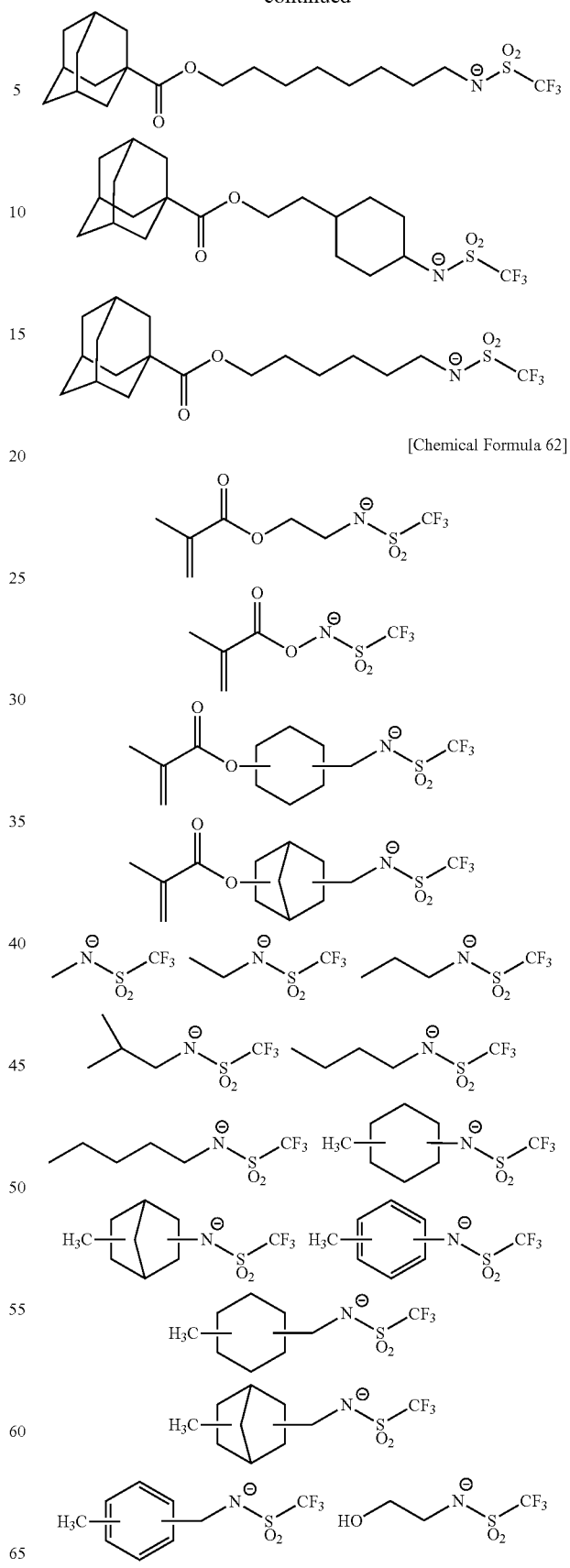

Cation Moiety

In formula (d1-3), $M^{m+}$ is an organic cation having a valency of m, and is the same as defined for $M^{m+}$ in the aforementioned formula (d1-1).

As the component (d1-3), one type of compound may be used, or two or more types of compounds may be used in combination.

As the component (D1), one type of the aforementioned components (d1-1) to (d1-3), or at least two types of the aforementioned components (d1-1) to (d1-3) can be used in combination.

The amount of the component (D1) relative to 100 parts by weight of the component (A) is preferably within a range from 0.5 to 10 parts by weight, more preferably from 0.5 to 8 parts by weight, and still more preferably from 1 to 8 parts by weight.

When the amount of the component (D1) is at least as large as the lower limit of the above-mentioned range, excellent lithography properties and excellent resist pattern shape can be obtained. On the other hand, when the amount of the component (D1) is no more than the upper limit of the above-mentioned range, sensitivity can be maintained at a satisfactory level, and through-put becomes excellent.

(Production Method of Component (D1))

The production methods of the components (d1-1) and (d1-2) are not particularly limited, and the components (d1-1) and (d1-2) can be produced by conventional methods.

Further, the production method of the component (d1-3) is not particularly limited, and the component (d1-3) can be produced in the same manner as disclosed in US2012-0149916.

Component (D2)

The acid diffusion control component may contain a nitrogen-containing organic compound (D2) (hereafter, referred to as component (D2)) which does not fall under the definition of component (D1).

The component (D2) is not particularly limited, as long as it functions as an acid diffusion control agent, and does not fall under the definition of the component (D1). As the component (D2), any of the conventionally known compounds may be selected for use. Among these, an aliphatic amine, particularly a secondary aliphatic amine or tertiary aliphatic amine is preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris {2-(1-ethoxypropoxy)ethyl}amine, tris[2-{2-(2-hydroxyethoxy)ethoxy}ethyl]amine and triethanolamine triacetate, and triethanolamine triacetate is preferable.

Further, as the component (D2), an aromatic amine may be used.

Examples of aromatic amines include 4-dimethylaminopyridine, pyrrole, indole, pyrazole, imidazole and derivatives thereof, as well as tribenzylamine, 2,6-diisopropylaniline and N-tert-butoxycarbonylpyrrolidine.

As the component (D2), one type of compound may be used alone, or two or more types may be used in combination.

The component (D2) is typically used in an amount within a range from 0.01 to 5 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

[Component (E)]

Furthermore, in the resist composition of the present embodiment, for preventing any deterioration in sensitivity, and improving the resist pattern shape and the post exposure stability of the latent image formed by the pattern-wise exposure of the resist layer, at least one compound (E) (hereafter referred to as the "component (E)") selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters and phenylphosphinic acid.

As the component (E), one type may be used alone, or two or more types may be used in combination.

The component (E) is typically used in an amount within a range from 0.01 to 5 parts by weight, relative to 100 parts by weight of the component (A).

[Component (F)]

In the present invention, the resist composition may further include a fluorine additive (hereafter, referred to as "component (F)") for imparting water repellency to the resist film.

As the component (F), for example, a fluorine-containing polymeric compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be used.

Specific examples of the component (F) include polymers having a structural unit (f1) represented by general formula (f1-1) shown below. As the polymer, a polymer (homopolymer) consisting of a structural unit (f1) represented by formula (f1-1) shown below; a copolymer of the structural unit (f1) and the aforementioned structural unit (a1); and a copolymer of the structural unit (f1), a structural unit derived from acrylic acid or methacrylic acid and the aforementioned structural unit (a1) are preferable. As the structural unit (a1) to be copolymerized with the structural unit (f1), a structural unit derived from 1-ethyl-1-cyclooctyl(meth)acrylate is preferable.

[Chemical Formula 63]

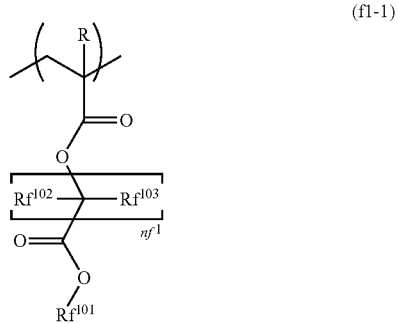

In the formula, R is the same as defined above; $Rf^{102}$ and $Rf^{103}$ each independently represents a hydrogen atom, a halogen atom, an alkyl group of 1 to 5 carbon atoms, or a halogenated alkyl group of 1 to 5 carbon atoms, provided that $Rf^{102}$ and $Rf^{103}$ may be the same or different; $nf^1$ represents an integer of 1 to 5; and $Rf^{101}$ represents an organic group containing a fluorine atom.

In formula (f1-1), R bonded to the carbon atom on the α-position is the same as defined above. As R, a hydrogen atom or a methyl group is preferable.

In formula (f1-1), examples of the halogen atom for $Rf^{102}$ and $Rf^{103}$ include a fluorine atom, a chlorine atom, a bromine atom and an iodine atom, and a fluorine atom is particularly desirable. Examples of the alkyl group of 1 to 5 carbon atoms for $Rf^{102}$ and $Rf^{103}$ include the same alkyl group of 1 to 5 carbon atoms as those described above for R, and a methyl group or an ethyl group is preferable. Specific examples of the halogenated alkyl group of 1 to 5 carbon atoms represented by $Rf^{102}$ or $Rf^{103}$ include groups in which part or all of the hydrogen atoms of the aforementioned alkyl groups of 1 to 5 carbon atoms have been substituted with halogen atoms. Examples of the halogen atom include a fluorine atom, a chlorine atom, a bromine atom and an iodine atom, and a fluorine atom is particularly desirable. Among these, as $Rf^{102}$ and $Rf^{103}$, a hydrogen atom, a fluorine atom or an alkyl group of 1 to 5 carbon atoms is preferable, and a hydrogen atom, a fluorine atom, a methyl group or an ethyl group is more preferable.

In formula (f1-1), $nf^1$ represents an integer of 1 to 5, preferably an integer of 1 to 3, and more preferably 1 or 2.

In formula (f1-1), $Rf^{101}$ represents an organic group containing a fluorine atom, and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and most preferably 1 to 10 carbon atoms.

It is preferable that the hydrocarbon group having a fluorine atom has 25% or more of the hydrogen atoms within the hydrocarbon group fluorinated, more preferably 50% or more, and most preferably 60% or more, as the hydrophobicity of the resist film during immersion exposure is enhanced.

Among these, as $Rf^{101}$, a fluorinated hydrocarbon group of 1 to 5 carbon atoms is preferable, and a trifluoromethyl group, $-CH_2-CF_3$, $-CH_2-CF_2-CF_3$, $-CH(CF_3)_2$, $-CH_2-CH_2-CF_3$, and $-CH_2-CH_2-CF_2-CF_2-CF_2-CF_3$ are most preferable.

The weight average molecular weight (Mw) (the polystyrene equivalent value determined by gel permeation chromatography) of the component (F) is preferably 1,000 to 50,000, more preferably 5,000 to 40,000, and most preferably 10,000 to 30,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the component (F) is preferably 1.0 to 5.0, more preferably 1.0 to 3.0, and most preferably 1.2 to 2.5.

As the component (F), one type may be used alone, or two or more types may be used in combination.

The component (F) is generally used in an amount within a range from 0.5 to 10 parts by weight, relative to 100 parts by weight of the component (A).

If desired, other miscible additives can also be added to the resist composition of the present invention. Examples of such miscible additives include additive resins for improving the performance of the resist film, dissolution inhibitors, plasticizers, stabilizers, colorants, halation prevention agents, and dyes.

[Component (S)]

The resist composition of the present invention can be prepared by dissolving the resist materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone (MEK), cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

These solvents can be used individually, or in combination as a mixed solvent.

Among these, PGMEA, PGME, γ-butyrolactone, EL and cyclohexanone are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL or cyclohexanone is mixed as the polar solvent, the PGMEA:EL or cyclohexanone weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3. Furthermore, a mixed solvent of PGMEA, PGME and cyclohexanone is also preferable.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate In general, the organic solvent is used in an amount such that the solid content of the resist composition becomes within the range from 1 to 20% by weight, and preferably from 2 to 15% by weight.

By using the resist composition of the present invention, a resist pattern with reduced roughness and excellent mask reproducibility can be formed.

As the miniaturization of pattern progress, particularly in the formation of a resist pattern having a narrow pitch, the diffusion control of acid generated at exposed portions of a resist film, suppression of pattern collapse and contrast between the exposed portion and the unexposed portion of a resist film become important.

The resist composition of the present invention includes a polymeric compound (A1) having a structural unit (a0) containing an acid decomposable group that exhibits increased polarity by the action of acid and a specific cyclic group, and an acid generator (B1) having a nitrogen atom and an acid generating site in the same molecule thereof.

At an unexposed portion of the resist film, the component (B1) functions as a quencher for acid (proton), whereas at exposed portions of the resist film, the component (B1) functions as an acid generator. Therefore, at an exposed portion of the resist film, acid required for formation of resist pattern is generated from the component (B1). On the other hand, by interaction between the molecules, diffusion of the generated acid is suppressed (shortening of acid diffusion). Further, at an unexposed portion, even when a small amount of acid is generated from the component (B1) by an undesired exposure, the acid is trapped by the nitrogen atom within the molecule of the component (B1), and diffusion of the acid is suppressed at the unexposed portion. As such, difference in the acid concentration between the exposed portions and the unexposed portions of the resist film is increased.

In addition, the component (A1) includes a structural unit (a0) which combines the effects conventionally obtainable by different kinds of structural units (a structural unit containing an acid decomposable group that exhibits increased polarity by the action of acid and a structural unit containing a lactone-containing cyclic group or the like). Specifically, the specific cyclic group (lactone-containing cyclic group, —$SO_2$— containing cyclic group, carbonate-containing cyclic group) contained in the structural unit (a0) contributes to improvement in the adhesion of the resist film to a substrate. Further, since the structural unit (a0) contains an acid decomposable group, the acid decomposable group is dissociated by the action of acid so as to increase the polarity of the base resin. Furthermore, by using the structural unit (a0), the ratio of the amount of the structural unit containing an acid decomposable group within the base resin can be increased. By using the component (A1) having such a structural unit (a0), a resist pattern which exhibits a great change in the solubility in a developing solution by the action of acid can be formed.

By a synergistic action of a combination of the component (A1) and the component (B1), it is presumed that both reduction of roughness and mask reproducibility can be achieved, and a resist pattern with improved lithography properties can be formed.

<<Method of Forming a Resist Pattern>>

The method of forming a resist pattern according to the present invention includes: forming a resist film on a substrate using a resist composition of the present invention; conducting exposure of the resist film; and developing the resist film to form a resist pattern.

The method for forming a resist pattern according to the present invention can be performed, for example, as follows.

Firstly, a resist composition of the present invention is applied to a substrate using a spinner or the like, and a bake treatment (post applied bake (PAB)) is conducted at a temperature of 80 to 150° C. for 40 to 120 seconds, preferably 60 to 90 seconds, to form a resist film.

Following selective exposure of the thus formed resist film, either by exposure through a mask having a predetermined pattern formed thereon (mask pattern) using an exposure apparatus such as an ArF exposure apparatus, an electron beam lithography apparatus or an EUV exposure apparatus, or by patterning via direct irradiation with an electron beam without using a mask pattern, baking treatment (post exposure baking (PEB)) is conducted under temperature conditions of 80 to 150° C. for 40 to 120 seconds, and preferably 60 to 90 seconds.

Next, the resist film is subjected to a developing treatment. The developing treatment is conducted using an alkali developing solution in the case of an alkali developing process, and a developing solution containing an organic solvent (organic developing solution) in the case of a solvent developing process.

After the developing treatment, it is preferable to conduct a rinse treatment. The rinse treatment is preferably conducted using pure water in the case of an alkali developing process, and a rinse solution containing an organic solvent in the case of a solvent developing process.

In the case of a solvent developing process, after the developing treatment or the rinsing, the developing solution or the rinse liquid remaining on the pattern can be removed by a treatment using a supercritical fluid.

After the developing treatment or the rinse treatment, drying is conducted. If desired, bake treatment (post bake) can be conducted following the developing. In this manner, a resist pattern can be obtained.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective to KrF excimer laser, ArF excimer laser, EB and EUV, and particularly effective to ArF excimer laser, EB and EUV.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

As an example of the alkali developing solution used in an alkali developing process, a 0.1 to 10% by weight aqueous solution of tetramethylammonium hydroxide (TMAH) can be given.

As the organic solvent contained in the organic developing solution used in a solvent developing process, any of the conventional organic solvents can be used which are capable of dissolving the component (A) (prior to exposure). Specific examples of the organic solvent include polar solvents such as ketone solvents, ester solvents, alcohol solvents, nitrite solvents, amide solvents and ether solvents, and hydrocarbon solvents.

A ketone solvent is an organic solvent containing C—C(=O)—C within the structure thereof. An ester solvent is an organic solvent containing C—C(=O)—O—C within the structure thereof. An alcohol solvent is an organic solvent containing an alcoholic hydroxy group within the structure thereof, and an "alcoholic hydroxy group" refers to a hydroxy group bonded to a carbon atom of an aliphatic hydrocarbon group. A nitrile solvent is an organic solvent containing a nitrile group in the structure thereof. An amide solvent is an organic solvent containing an amide group within the structure thereof. An ether solvent is an organic solvent containing C—O—C within the structure thereof.

Some organic solvents have a plurality of the functional groups which characterizes the aforementioned solvents within the structure thereof. In such a case, the organic solvent can be classified as any type of the solvent having the characteristic functional group. For example, diethyleneglycol monomethylether can be classified as either an alcohol solvent or an ether solvent.

A hydrocarbon solvent consists of a hydrocarbon which may be halogenated, and does not have any substituent other than a halogen atom. Examples of the halogen atom include a fluorine atom, a chlorine atom, a bromine atom and an iodine atom, and a fluorine atom is preferable.

As the organic solvent contained in the organic developing solution, among these, a polar solvent is preferable, and ketone solvents, ester solvents and nitrile solvents are preferable.

Specific examples of ketone solvents include 1-octanone, 2-octanone, 1-nonanone, 2-nonanone, acetone, 4-heptanone, 1-hexanone, 2-hexanone, diisobutyl ketone, cyclohexanone, methyl cyclohexanone, phenylacetone, methyl ethyl ketone, methyl isobutyl ketone, acetylacetone, acetonylacetone, ionone, diacetonylalcohol, acetylcarbinol, acetophenone, methyl naphthyl ketone, isophorone, propylenecarbonate, γ-butyrolactone and methyl amyl ketone (2-heptanone).

As a ketone solvent, methyl amyl ketone (2-heptanone) is preferable.

Examples of ester solvents include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate and propyl-3-methoxypropionate.

As an ester solvent, butyl acetate is preferable.

Examples of nitrile solvents include acetonitrile, propionitrile, valeronitrile, butyronitrile and the like.

If desired, the organic developing solution may have a conventional additive blended. Examples of the additive include surfactants. The surfactant is not particularly limited, and for example, an ionic or non-ionic fluorine and/or silicon surfactant can be used. As the surfactant, a non-ionic surfactant is preferable, and a fluorine surfactant or a silicon surfactant is more preferable.

When a surfactant is added, the amount thereof based on the total amount of the organic developing solution is generally 0.001 to 5% by weight, preferably 0.005 to 2% by weight, and more preferably 0.01 to 0.5% by weight.

The developing treatment can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

As the organic solvent contained in the rinse liquid used in the rinse treatment after the developing treatment in the case of a solvent developing process, any of the aforementioned organic solvents contained in the organic developing solution can be used which hardly dissolves the resist pattern. In general, at least one solvent selected from the group consisting of hydrocarbon solvents, ketone solvents, ester solvents, alcohol solvents, amide solvents and ether solvents is used.

Among these, at least one solvent selected from the group consisting of hydrocarbon solvents, ketone solvents, ester solvents, alcohol solvents and amide solvents is preferable, more preferably at least one solvent selected from the group consisting of alcohol solvents and ester solvents, and an alcohol solvent is particularly desirable.

The alcohol solvent used for the rinse liquid is preferably a monohydric alcohol of 6 to 8 carbon atoms, and the monohydric alcohol may be linear, branched or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol and benzyl alcohol. Among these, 1-hexanol, 2-heptanol and 2-hexanol are preferable, and 1 hexanol and 2-hexanol are more preferable.

These organic solvents can be used individually, or at least 2 solvents may be mixed together. Further, an organic solvent other than the aforementioned examples or water may be mixed together. However, in consideration of the development characteristics, the amount of water within the rinse liquid, based on the total amount of the rinse liquid is preferably 30% by weight or less, more preferably 10% by weight or less, still more preferably 5% by weight or less, and most preferably 3% by weight or less.

If desired, the rinse solution may have a conventional additive blended. Examples of the additive include surfactants. Examples of the additive include surfactants. As the surfactant, the same surfactants as those described above can be mentioned, and a non-ionic surfactant is preferable, and a fluorine surfactant or a silicon surfactant is more preferable.

When a surfactant is added, the amount thereof based on the total amount of the rinse liquid is generally 0.001 to 5% by weight, preferably 0.005 to 2% by weight, and more preferably 0.01 to 0.5% by weight.

The rinse treatment using a rinse liquid (washing treatment) can be conducted by a conventional rinse method. Examples of the rinse method include a method in which the rinse liquid is continuously applied to the substrate while rotating it at a constant rate (rotational coating method), a method in which the substrate is immersed in the rinse liquid for a predetermined time (dip method), and a method in which the rinse liquid is sprayed onto the surface of the substrate (spray method).

EXAMPLES

As follows is a description of examples of the present invention, although the scope of the present invention is by no way limited by these examples.

In the following examples, a compound represented by a chemical formula (1) is designated as "compound (1)", and the same applies for compounds represented by other chemical formulae.

In the NMR analysis, the internal standard for $^1$H-NMR and $^{13}$C-NMR was tetramethylsilane. The internal standard for $^{19}$F-NMR was hexafluorobenzene (provided that the peak of hexafluorobenzene was regarded as −160 ppm).

<Synthesis Example of Acid Generator (B1)>

[Synthesis of Compound (Q-1)]

In a nitrogen atmosphere, 3,5-pyridinedicarboxylic acid (5.0 g), compound (A-1) (12.2 g) and pyridine (150 g) were stirred. Diisopropylcarbodiimide (16.8 g) was dropwise added thereto. Thereafter, the mixture was stirred at room temperature for 24 hours, and pure water (150 g) was then added, thereby stopping the reaction. Thereafter, the resulting mixture was washed three times with t-butyl methyl ether (500 g) to obtain 147 g of an 8.3 wt % aqueous solution of a compound (QA-1).

The obtained compound was analyzed by NMR, and the structure thereof was identified by the following results.

¹H-NMR (400 MHz, DMSO-d6): δ (ppm)=9.36 (2H, ArH), 8.74 (1H, ArH), 4.92 (4H, CH₂).

¹⁹F-NMR (376 MHz, DMSO-d6): δ (ppm)=−110.9.

[Chemical Formula 64]

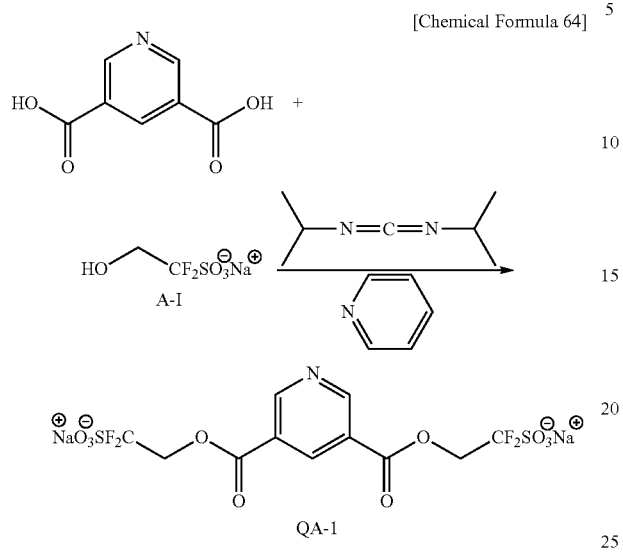

Subsequently, triphenylsulfonium bromide (5.8 g) and dichloromethane (35 g) were added to the 8.3 wt % aqueous solution of compound (QA-1) (42.0 g), and the mixture was stirred at room temperature for 1 hour. Thereafter, the reaction mixture was subjected to liquid separation to recover an organic phase, which was then washed five times with pure water. Thereafter, the solvent was distilled off under reduced pressure to obtain 6.8 g of a compound (Q-1) represented by the following formula Q-1.

The obtained compound was analyzed by NMR, and the structure thereof was identified by the following results.

¹H-NMR (400 MHz, DMSO-d6): δ (ppm)=9.36 (2H, ArH), 8.74 (1H, ArH), 7.74 -7.9 0 (m, 30H, ArH), 4.92 (4H, CH₂).

¹⁹F-NMR (376 MHz, DMSO-d6): δ (ppm)=−110.9.

[Chemical Formula 65]

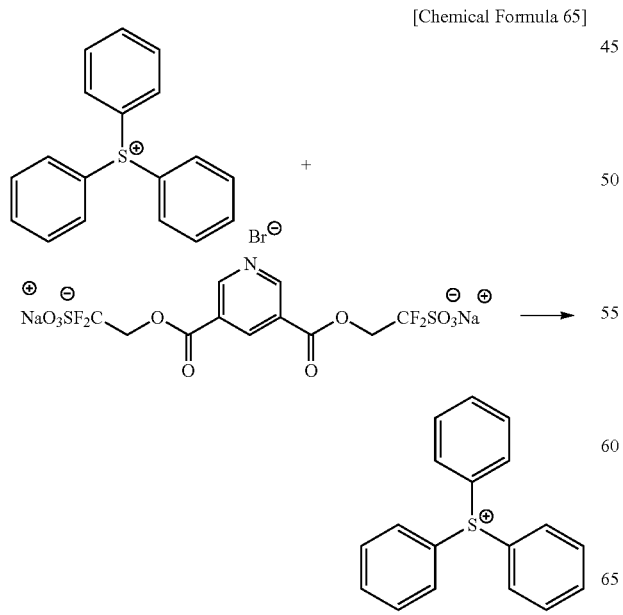

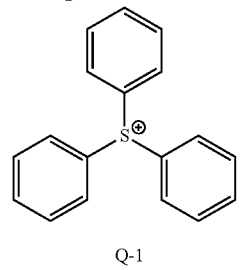

[Synthesis of Compound (Q-2)]

The synthesis was conducted in the same manner as that in compound (Q-1), thereby obtain a compound (Q-2) represented by the following chemical formula Q-2.

The obtained compound was analyzed by NMR, and the structure thereof was identified by the following results.

¹H-NMR (400 MHz, DMSO-d6): δ (ppm)=9.36 (2H, ArH), 8.74 (1H, ArH), 4.92 (4H, CH₂), 2.59 (4H, CH₂), 1.49 (4H, CH₂), 1.30 (4H, CH₂), 0.871 (6H, CH₃).

¹⁹F-NMR (376 MHz, DMSO-d6): δ (ppm)=−110.9.

[Chemical Formula 66]

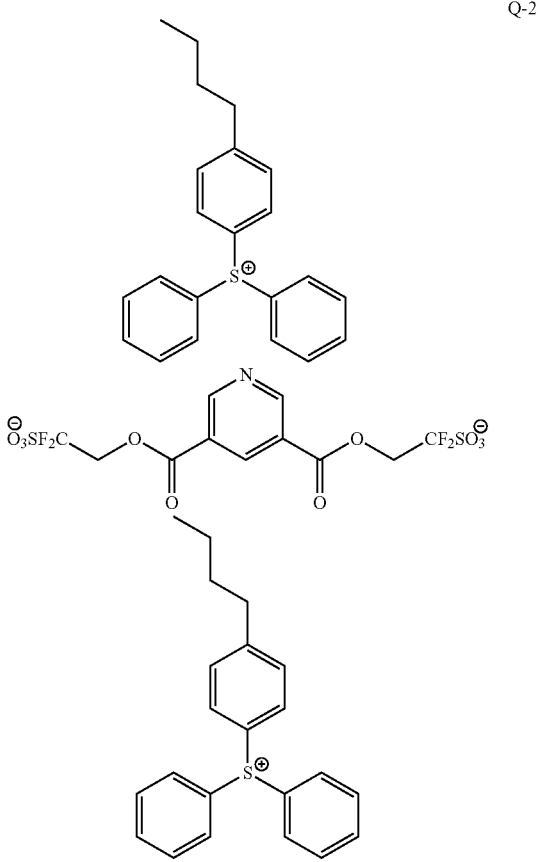

<Production of Resist Composition>

Examples 1 to 34, Comparative Examples 1 to 22, Reference Examples 1 to 16

The components shown in Tables 1 to 4 were mixed together and dissolved to obtain each resist composition.

TABLE 1

| | Component (A) | Component (B) | | | Component (D) | Component (F) | Component (S) | |
|---|---|---|---|---|---|---|---|---|
| Example 1 | (A)-1 [100] | (B1)-1 [8.0] | — | — | — | (F)-1 [2.0] | (S)-1 [10] | (S)-2 [3200] |
| Example 2 | (A)-1 [100] | (B1)-1 [9.0] | (B1)-2 [3.0] | — | — | (F)-1 [2.0] | (S)-1 [10] | (S)-2 [3200] |
| Example 3 | (A)-1 [100] | (B1)-1 [3.5] | — | (B2)-1 [4.2] | — | (F)-1 [2.0] | (S)-1 [10] | (S)-2 [3200] |
| Example 4 | (A)-1 [100] | (B1)-1 [9.0] | — | — | (D)-1 [2.8] | (F)-1 [2.0] | (S)-1 [10] | (S)-2 [3200] |
| Example 5 | (A)-1 [100] | (B1)-1 [3.5] | (B1)-2 [3.0] | (B2)-1 [5.0] | — | (F)-1 [2.0] | (S)-1 [10] | (S)-2 [3200] |
| Example 6 | (A)-1 [100] | (B1)-1 [12.5] | (B1)-2 [3.0] | — | (D)-1 [2.8] | (F)-1 [2.0] | (S)-1 [10] | (S)-2 [3200] |
| Example 7 | (A)-1 [100] | (B1)-1 [6.5] | — | (B2)-1 [3.3] | (D)-1 [2.8] | (F)-1 [2.0] | (S)-1 [10] | (S)-2 [3200] |
| Example 8 | (A)-1 [100] | (B1)-1 [3.5] | (B1)-2 [3.0] | (B2)-1 [6.0] | (D)-1 [2.8] | (F)-1 [2.0] | (S)-1 [10] | (S)-2 [3200] |
| Example 9 | (A)-1 [100] | — | (B1)-2 [4.5] | (B2)-1 [9.5] | — | (F)-1 [2.0] | (S)-1 [10] | (S)-2 [3200] |
| Example 10 | (A)-1 [100] | — | (B1)-2 [3.0] | (B2)-1 [10.0] | (D)-1 [2.8] | (F)-1 [2.0] | (S)-1 [10] | (S)-2 [3200] |
| Example 11 | (A)-2 [100] | (B1)-1 [8.0] | — | — | — | (F)-1 [2.0] | (S)-1 [10] | (S)-2 [3200] |
| Example 12 | (A)-3 [100] | (B1)-1 [8.0] | — | — | — | (F)-1 [2.0] | (S)-1 [10] | (S)-2 [3200] |
| Example 13 | (A)-4 [100] | (B1)-1 [8.0] | — | — | — | (F)-1 [2.0] | (S)-1 [10] | (S)-2 [3200] |
| Example 14 | (A)-5 [100] | (B1)-1 [8.0] | — | — | — | (F)-1 [2.0] | (S)-1 [10] | (S)-2 [3200] |
| Example 15 | (A)-6 [100] | (B1)-1 [8.0] | — | — | — | (F)-1 [2.0] | (S)-1 [10] | (S)-2 [3200] |
| Example 16 | (A)-7 [100] | (B1)-1 [8.0] | — | — | — | (F)-1 [2.0] | (S)-1 [10] | (S)-2 [3200] |
| Example 17 | (A)-8 [100] | (B1)-1 [8.0] | — | — | — | (F)-1 [2.0] | (S)-1 [10] | (S)-2 [3200] |

TABLE 2

| | Component (A) | Component (B) | | Component (D) | Component (F) | Component (S) | |
|---|---|---|---|---|---|---|---|
| Comp. Ex. 1 | (A)-1 [100] | — | (B2)-1 [3.9] | (D)-1 [3.3] | (F)-1 [2.0] | (S)-1 [10] | (S)-2 [3200] |
| Comp. Ex. 2 | (A)-2 [100] | — | (B2)-1 [3.9] | (D)-1 [3.3] | (F)-1 [2.0] | (S)-1 [10] | (S)-2 [3200] |
| Comp. Ex. 3 | (A)-3 [100] | — | (B2)-1 [3.9] | (D)-1 [3.3] | (F)-1 [2.0] | (S)-1 [10] | (S)-2 [3200] |
| Comp. Ex. 4 | (A)-4 [100] | — | (B2)-1 [3.9] | (D)-1 [3.3] | (F)-1 [2.0] | (S)-1 [10] | (S)-2 [3200] |
| Comp. Ex. 5 | (A)-5 [100] | — | (B2)-1 [3.9] | (D)-1 [3.3] | (F)-1 [2.0] | (S)-1 [10] | (S)-2 [3200] |
| Comp. Ex. 6 | (A)-6 [100] | — | (B2)-1 [3.9] | (D)-1 [3.3] | (F)-1 [2.0] | (S)-1 [10] | (S)-2 [3200] |
| Comp. Ex. 7 | (A)-7 [100] | — | (B2)-1 [3.9] | (D)-1 [3.3] | (F)-1 [2.0] | (S)-1 [10] | (S)-2 [3200] |
| Comp. Ex. 8 | (A)-8 [100] | — | (B2)-1 [3.9] | (D)-1 [3.3] | (F)-1 [2.0] | (S)-1 [10] | (S)-2 [3200] |
| Comp. Ex. 9 | (A)-9 [100] | — | (B2)-1 [3.9] | (D)-1 [3.3] | (F)-1 [2.0] | (S)-1 [10] | (S)-2 [3200] |
| Ref. Ex. 1 | (A)-9 [100] | (B1)-1 [8.0] | — | — | (F)-1 [2.0] | (S)-1 [10] | (S)-2 [3200] |
| Ref. Ex. 2 | (A)-9 [100] | (B1)-1 [9.0] | (B1)-2 [3.0] | — | (F)-1 [2.0] | (S)-1 [10] | (S)-2 [3200] |
| Ref. Ex. 3 | (A)-9 [100] | (B1)-1 [3.5] | (B2)-1 [4.2] | — | (F)-1 [2.0] | (S)-1 [10] | (S)-2 [3200] |
| Ref. | (A)-9 | (B1)-1 | — | (D)-1 | (F)-1 | (S)-1 | (S)-2 |

TABLE 2-continued

|  | Component (A) | Component (B) | | | Component (D) | Component (F) | Component (S) | |
|---|---|---|---|---|---|---|---|---|
| Ex. 4 Ref. | [100] (A)-9 | [9.0] (B1)-1 | (B1)-2 | (B2)-1 | [2.8] — | [2.0] (F)-1 | [10] (S)-1 | [3200] (S)-2 |
| Ex. 5 Ref. | [100] (A)-9 | [3.5] (B1)-1 | [3.0] (B1)-2 | [5.0] — | (D)-1 | [2.0] (F)-1 | [10] (S)-1 | [3200] (S)-2 |
| Ex. 6 Ref. | [100] (A)-9 | [12.5] (B1)-1 | [3.0] — | (B2)-1 | [2.8] (D)-1 | [2.0] (F)-1 | [10] (S)-1 | [3200] (S)-2 |
| Ex. 7 Ref. | [100] (A)-9 | [6.5] (B1)-1 | (B1)-2 | [3.3] (B2)-1 | [2.8] (D)-1 | [2.0] (F)-1 | [10] (S)-1 | [3200] (S)-2 |
| Ex. 8 Comp. | [100] (A)-9 | [3.5] — | [3.0] (B1)-2 | [6.0] (B2)-1 | [2.8] — | [2.0] (F)-1 | [10] (S)-1 | [3200] (S)-2 |
| Ex. 10 Comp. | [100] (A)-9 | [4.5] — | [9.5] (B1)-2 | (B2)-1 | (D)-1 | [2.0] (F)-1 | [10] (S)-1 | [3200] (S)-2 |
| Ex. 11 | [100] | [3.0] | [10.0] | | [2.8] | [2.0] | [10] | [3200] |

TABLE 3

|  | Component (A) | Component (B) | | | Component (D) | Component (F) | Component (S) | |
|---|---|---|---|---|---|---|---|---|
| Example 18 | (A)-1 [100] | (B1)-3 [6.5] | — | — | — | (F)-1 [2.0] | (S)-1 [10] | (S)-2 [3200] |
| Example 19 | (A)-1 [100] | (B1)-3 [4.5] | (B1)-2 [1.5] | — | — | (F)-1 [2.0] | (S)-1 [10] | (S)-2 [3200] |
| Example 20 | (A)-1 [100] | (B1)-3 [2.0] | — | (B2)-1 [2.5] | — | (F)-1 [2.0] | (S)-1 [10] | (S)-2 [3200] |
| Example 21 | (A)-1 [100] | (B1)-3 [4.5] | — | — | (D)-1 [1.7] | (F)-1 [2.0] | (S)-1 [10] | (S)-2 [3200] |
| Example 22 | (A)-1 [100] | (B1)-3 [2.0] | (B1)-2 [1.4] | (B2)-1 [3.2] | — | (F)-1 [2.0] | (S)-1 [10] | (S)-2 [3200] |
| Example 23 | (A)-1 [100] | (B1)-3 [5.0] | (B1)-2 [1.7] | — | (D)-1 [1.4] | (F)-1 [2.0] | (S)-1 [10] | (S)-2 [3200] |
| Example 24 | (A)-1 [100] | (B1)-3 [3.5] | — | (B2)-1 [2.2] | (D)-1 [2.3] | (F)-1 [2.0] | (S)-1 [10] | (S)-2 [3200] |
| Example 25 | (A)-1 [100] | (B1)-3 [1.5] | (B1)-2 [1.0] | (B2)-1 [3.2] | (D)-1 [1.2] | (F)-1 [2.0] | (S)-1 [10] | (S)-2 [3200] |
| Example 26 | (A)-1 [100] | — | (B1)-2 [2.5] | (B2)-1 [3.5] | — | (F)-1 [2.0] | (S)-1 [10] | (S)-2 [3200] |
| Example 27 | (A)-1 [100] | — | (B1)-2 [1.5] | (B2)-1 [3.5] | (D)-1 [1.4] | (F)-1 [2.0] | (S)-1 [10] | (S)-2 [3200] |
| Example 28 | (A)-2 [100] | (B1)-3 [6.5] | — | — | — | (F)-1 [2.0] | (S)-1 [10] | (S)-2 [3200] |
| Example 29 | (A)-3 [100] | (B1)-3 [6.5] | — | — | — | (F)-1 [2.0] | (S)-1 [10] | (S)-2 [3200] |
| Example 30 | (A)-4 [100] | (B1)-3 [6.5] | — | — | — | (F)-1 [2.0] | (S)-1 [10] | (S)-2 [3200] |
| Example 31 | (A)-5 [100] | (B1)-3 [6.5] | — | — | — | (F)-1 [2.0] | (S)-1 [10] | (S)-2 [3200] |
| Example 32 | (A)-6 [100] | (B1)-3 [6.5] | — | — | — | (F)-1 [2.0] | (S)-1 [10] | (S)-2 [3200] |
| Example 33 | (A)-7 [100] | (B1)-3 [6.5] | — | — | — | (F)-1 [2.0] | (S)-1 [10] | (S)-2 [3200] |
| Example 34 | (A)-8 [100] | (B1)-3 [6.5] | — | — | — | (F)-1 [2.0] | (S)-1 [10] | (S)-2 [3200] |

TABLE 4

|  | Component (A) | Component (B) | | | Component (D) | Component (F) | Component (S) | |
|---|---|---|---|---|---|---|---|---|
| Comp. Ex. 12 | (A)-1 [100] | — | — | (B2)-1 [3.5] | (D)-1 [2.8] | (F)-1 [2.0] | (S)-1 [10] | (S)-2 [3200] |
| Comp. Ex. 13 | (A)-2 [100] | — | — | (B2)-1 [3.5] | (D)-1 [2.8] | (F)-1 [2.0] | (S)-1 [10] | (S)-2 [3200] |
| Comp. Ex. 14 | (A)-3 [100] | — | — | (B2)-1 [3.5] | (D)-1 [2.8] | (F)-1 [2.0] | (S)-1 [10] | (S)-2 [3200] |
| Comp. Ex. 15 | (A)-4 [100] | — | — | (B2)-1 [3.5] | (D)-1 [2.8] | (F)-1 [2.0] | (S)-1 [10] | (S)-2 [3200] |
| Comp. Ex. 16 | (A)-5 [100] | — | — | (B2)-1 [3.5] | (D)-1 [2.8] | (F)-1 [2.0] | (S)-1 [10] | (S)-2 [3200] |
| Comp. Ex. 17 | (A)-6 [100] | — | — | (B2)-1 [3.5] | (D)-1 [2.8] | (F)-1 [2.0] | (S)-1 [10] | (S)-2 [3200] |

TABLE 4-continued

| | Component (A) | Component (B) | | Component (D) | Component (F) | Component (S) | |
|---|---|---|---|---|---|---|---|
| Comp. Ex. 18 | (A)-7 [100] | — | — | (B2)-1 [3.5] | (D)-1 [2.8] | (F)-1 [2.0] | (S)-1 [10] | (S)-2 [3200] |
| Comp. Ex. 19 | (A)-8 [100] | — | — | (B2)-1 [3.5] | (D)-1 [2.8] | (F)-1 [2.0] | (S)-1 [10] | (S)-2 [3200] |
| Comp. Ex. 20 | (A)-10 [100] | — | — | (B2)-1 [3.5] | (D)-1 [2.8] | (F)-1 [2.0] | (S)-1 [10] | (S)-2 [3200] |
| Ref. Ex. 9 | (A)-10 [100] | (B1)-3 [6.5] | — | — | — | (F)-1 [2.0] | (S)-1 [10] | (S)-2 [3200] |
| Ref. Ex. 10 | (A)-10 [100] | (B1)-3 [4.5] | (B1)-2 [1.5] | — | — | (F)-1 [2.0] | (S)-1 [10] | (S)-2 [3200] |
| Ref. Ex. 11 | (A)-10 [100] | (B1)-3 [2.0] | — | (B2)-1 [2.5] | — | (F)-1 [2.0] | (S)-1 [10] | (S)-2 [3200] |
| Ref. Ex. 12 | (A)-10 [100] | (B1)-3 [4.5] | — | — | (D)-1 [1.7] | (F)-1 [2.0] | (S)-1 [10] | (S)-2 [3200] |
| Ref. Ex. 13 | (A)-10 [100] | (B1)-3 [2.0] | (B1)-2 [1.4] | (B2)-1 [3.2] | — | (F)-1 [2.0] | (S)-1 [10] | (S)-2 [3200] |
| Ref. Ex. 14 | (A)-10 [100] | (B1)-3 [5.0] | (B1)-2 [1.7] | — | (D)-1 [1.4] | (F)-1 [2.0] | (S)-1 [10] | (S)-2 [3200] |
| Ref. Ex. 15 | (A)-10 [100] | (B1)-3 [3.5] | — | (B2)-1 [2.2] | (D)-1 [2.3] | (F)-1 [2.0] | (S)-1 [10] | (S)-2 [3200] |
| Ref. Ex. 16 | (A)-10 [100] | (B1)-3 [1.5] | (B1)-2 [1.0] | (B2)-1 [3.2] | (D)-1 [1.2] | (F)-1 [2.0] | (S)-1 [10] | (S)-2 [3200] |
| Comp. Ex. 21 | (A)-10 [100] | — | (B1)-2 [2.5] | (B2)-1 [3.5] | — | (F)-1 [2.0] | (S)-1 [10] | (S)-2 [3200] |
| Comp. Ex. 22 | (A)-10 [100] | — | (B1)-2 [1.5] | (B2)-1 [3.5] | (D)-1 [1.4] | (F)-1 [2.0] | (S)-1 [10] | (S)-2 [3200] |

In Tables 1 to 4, the values in brackets [ ] indicate the amount (in terms of parts by weight) of the component added, and the reference characters indicate the following.

(A)-1 to (A)-10: polymeric compounds represented by the following chemical formulae (A)-1 to (A)-10

With respect to each polymeric compound, the copolymer compositional ratio (the ratio of each structural unit within the chemical formula (molar ratio)), the weight average molecular weight (Mw) and the molecular weight dispersity (Mw/Mn) are indicated with the chemical formula.

The weight average molecular weight (Mw) and the molecular weight dispersity (Mw/Mn) of each polymeric compound were determined by the polystyrene equivalent value as measured by gel permeation chromatography (GPC). The copolymer compositional ratio (the molar ratio of the respective structural units indicated in the structural formula shown below) of each polymeric compound was determined by 13 nuclear magnetic resonance spectroscopy (600 MHz $^{13}$C-NMR).

[Chemical Formula 67]

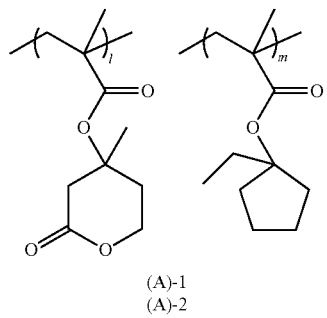

(A)-1
(A)-2

-continued

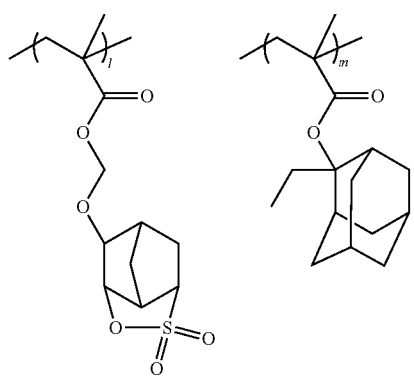

(A)-3

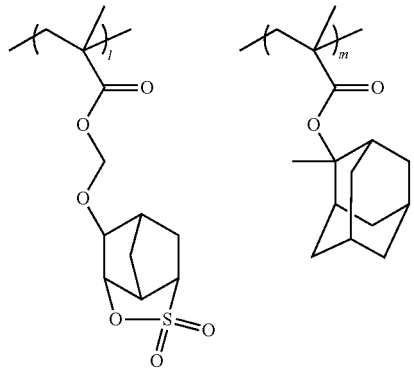

(A)-4

(A)-1: l/m=50/50, Mw=6,200, Mw/Mn=1.82
(A)-2: l/m=70/30, Mw=5,100, Mw/Mn=1.55
(A)-3: l/m=50/50, Mw=6,500, Mw/Mn=1.74
(A)-4: l/m=50/50, Mw=8,200, Mw/Mn=1.65

[Chemical Formula 68]
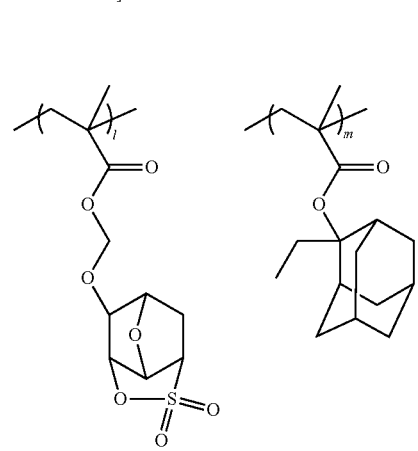
(A)-5
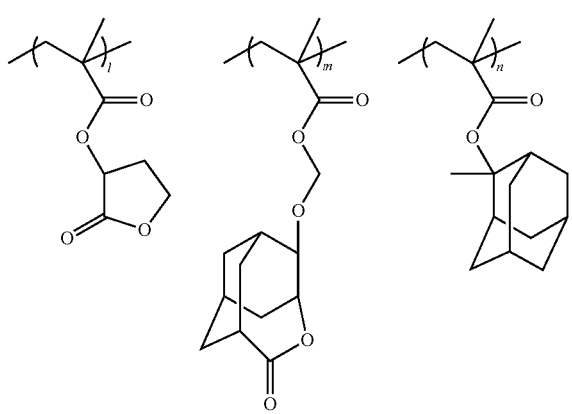
(A)-6
(A)-5: l/m=50/50, Mw=7,500, Mw/Mn=1.86
(A)-6: l/m/n=30/20/50, Mw=7,200, Mw/Mn=1.72
[Chemical Formula 69]
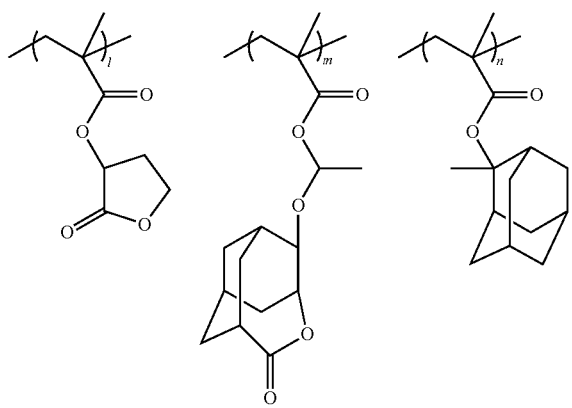
(A)-7
-continued
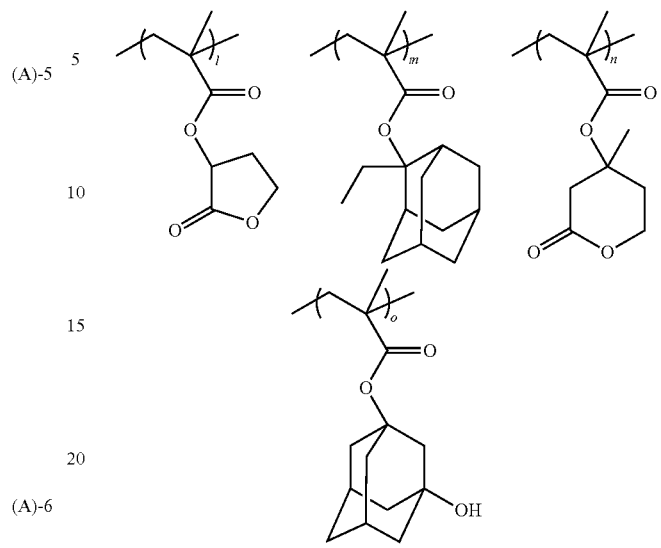
(A)-8
(A)-7: l/m/n=30/20/50, Mw=6,300, Mw/Mn=1.61
(A)-8: l/m/n/o=45/5/40/10, Mw=7,700, Mw/Mn=1.83
[Chemical Formula 70]
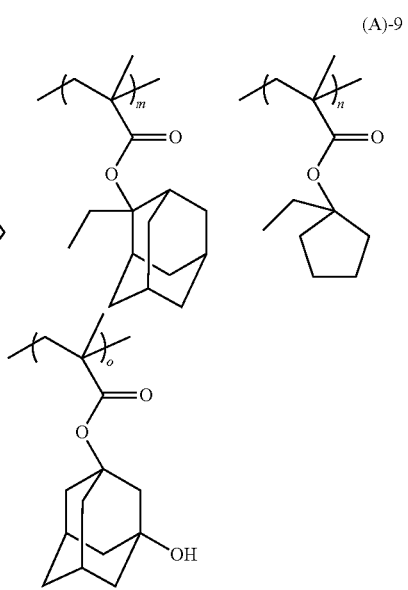
(A)-9
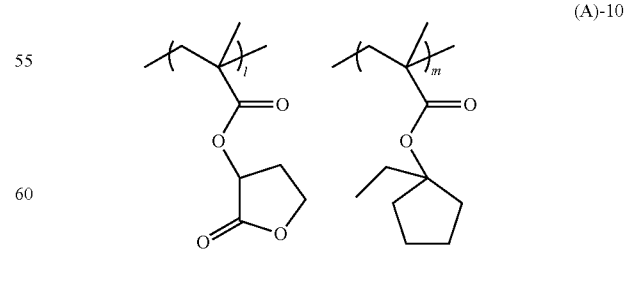
(A)-10
(A)-9: l/m/n/o=45/5/40/10, Mw=6,300, Mw/Mn=1.87
(A)-10: l/m=50/50, Mw=5,300, Mw/Mn=1.83
(B1)-1: acid generator of the compound (Q-1)

(B1)-2: acid generator of the compound represented by (B1)-2 below (B1)-3: acid generator of the compound (Q-2)

(B2)-1: acid generator of the compound represented by (B2)-1 below (D)-1: acid diffusion control agent of a compound represented by chemical formula (D)-1 below (F)-1: fluorine-containing polymeric compound represented by chemical formula (F)-1 below. The weight average molecular weight (Mw) and the dispersity (Mw/Mn) in terms of the polystyrene equivalent value measured by gel permeation chromatography (GPC) were 26,100 and 1.50, respectively. The composition of the copolymer (ratio (molar ratio) of the respective structural units within the structural formula) as determined by carbon 13 nuclear magnetic resonance spectroscopy (600 MHz, $^{13}$C-NMR), was 1/m=77/23.

(S)-1: γ-butyrolactone (S)-2: a mixed solvent of PGMEA/PGME/cyclohexanone=45/30/25 (weight ratio)

[Chemical Formula 71]

(B1)-2

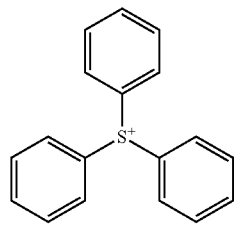
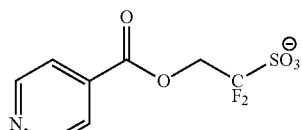

(B2)-1

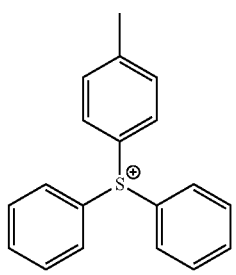
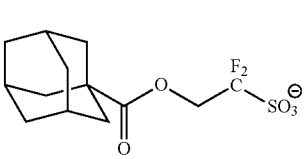

(D)-1

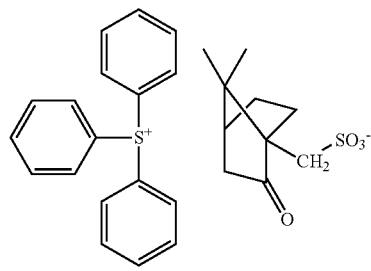

(F)-1

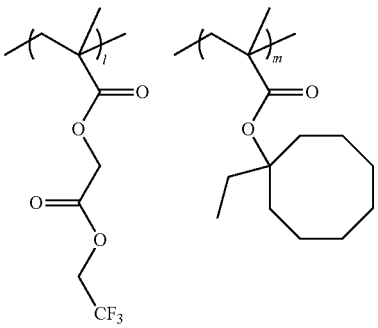

<Formation of Positive-Tone Resist Pattern; Examples 1 to 17, Comparative Examples 1 to 11, Reference Examples 1 to 8>

An organic anti-reflection film composition (product name: ARC95, manufactured by Brewer Science Ltd.) was applied to an 12-inch silicon wafer using a spinner, and the composition was then baked at 205° C. for 60 seconds and dried, thereby forming an organic anti-reflection film having a film thickness of 98 nm.

Then, the resist composition of each example (Examples 1 to 17, Comparative Examples 1 to 11, Reference Examples 1 to 8) was applied to the organic anti-reflection film using a spinner, and was then prebaked (PAB) on a hotplate at 120° C. for 60 seconds and dried, thereby forming a resist film having a film thickness of 80 nm.

Subsequently, the resist film was selectively irradiated with an ArF excimer laser (193 nm) through a photomask (6% halftone), using an immersion lithography ArF exposure apparatus NSR-S610 (manufactured by Nikon Corporation; NA (numerical aperture)=1.30; Dipole 0.97/0.78 w/P; immersion medium: water).

Then, a post exposure bake (PEB) treatment was conducted at 100° C. for 60 seconds.

Thereafter, an alkali development was conducted for 10 seconds at 23° C. in a 2.38 wt % aqueous TMAH solution (product name: NMD-3; manufactured by Tokyo Ohka Kogyo Co., Ltd.), followed by drying by shaking.

As a result, in each of the examples, a 1:1 line and space pattern (LS pattern) having a line width of 40 nm and a pitch of 80 nm was formed.

<Evaluation of Positive-Tone Resist Pattern>

[Evaluation of Line Width Roughness (LWR)]

With respect to each of the LS patterns formed in the "Formation of Positive-Tone Resist Pattern", the line width at 400 points in the lengthwise direction of the line were measured using a measuring scanning electron microscope (SEM) (product name: S-9380, manufactured by Hitachi High-Technologies Corporation; acceleration voltage: 300V). From the results, the value of 3 times the standard deviation s (i.e., 3s) was determined, and the average of the 3s values at 400 points was calculated as a yardstick of LWR. The results are indicated under "LWR (nm)" in Table 5.

The smaller this 3s value is, the lower the level of roughness of the line width, indicating that a LS pattern with a uniform width was obtained.

[Evaluation of Mask Reproducibility]

In accordance with the same procedure as in the "Formation of Positive-Tone Resist Pattern", an LS pattern having a pitch of 80 nm was formed with the same exposure dose and using a mask pattern in which the target size of the line width was 35 to 44 nm (10 target sizes at intervals of 1 nm).

The gradient of a graph obtained by plotting the target size (nm) on the horizontal axis, and the line width (nm) of the line pattern actually formed on the resist film using each mask pattern on the vertical axis. The gradient of the plotted line is indicated under "MEEF" in Table 5.

The gradient of the plotted line closer to 1 indicates that a resist pattern faithful to the mask pattern was formed.

TABLE 5

| Positive-tone resist pattern | PAB/PEB (° C./° C.) | LWR (nm) | MEEF |
|---|---|---|---|
| Ex. 1 | 120/100 | 3.42 | 4.57 |
| Ex. 2 | 120/100 | 3.47 | 4.42 |
| Ex. 3 | 120/100 | 3.63 | 4.68 |
| Ex. 4 | 120/100 | 3.69 | 4.77 |
| Ex. 5 | 120/100 | 3.82 | 4.51 |
| Ex. 6 | 120/100 | 3.78 | 4.82 |
| Ex. 7 | 120/100 | 3.74 | 4.95 |
| Ex. 8 | 120/100 | 3.72 | 4.86 |
| Ex. 9 | 120/100 | 3.69 | 4.72 |
| Ex. 10 | 120/100 | 3.72 | 4.63 |
| Ex. 11 | 120/100 | 3.86 | 4.67 |
| Ex. 12 | 120/100 | 3.79 | 4.79 |
| Ex. 13 | 120/100 | 3.81 | 4.83 |
| Ex. 14 | 120/100 | 3.77 | 4.69 |
| Ex. 15 | 120/100 | 4.19 | 5.01 |
| Ex. 16 | 120/100 | 3.92 | 5.16 |
| Ex. 17 | 120/100 | 4.21 | 5.21 |
| Comp. Ex. 1 | 120/100 | 5.26 | 7.20 |
| Comp. Ex. 2 | 120/100 | 5.13 | 6.91 |
| Comp. Ex. 3 | 120/100 | 5.21 | 7.11 |
| Comp. Ex. 4 | 120/100 | 5.13 | 6.56 |
| Comp. Ex. 5 | 120/100 | 5.38 | 6.42 |
| Comp. Ex. 6 | 120/100 | 5.27 | 7.23 |
| Comp. Ex. 7 | 120/100 | 5.14 | 7.52 |
| Comp. Ex. 8 | 120/100 | 5.11 | 6.79 |
| Comp. Ex. 9 | 120/100 | 5.29 | 6.50 |
| Ref. Ex. 1 | 120/100 | 4.79 | 6.21 |
| Ref. Ex. 2 | 120/100 | 4.64 | 5.80 |
| Ref. Ex. 3 | 120/100 | 4.73 | 6.13 |
| Ref. Ex. 4 | 120/100 | 4.69 | 5.72 |
| Ref. Ex. 5 | 120/100 | 4.83 | 5.89 |
| Ref. Ex. 6 | 120/100 | 4.92 | 5.73 |
| Ref. Ex. 7 | 120/100 | 4.87 | 5.92 |
| Ref. Ex. 8 | 120/100 | 4.72 | 5.83 |
| Comp. Ex. 10 | 120/100 | 4.81 | 5.69 |
| Comp. Ex. 11 | 120/100 | 4.74 | 5.78 |

<Formation of Negative-Tone Resist Pattern; Examples 18 to 34, Comparative Examples 12 to 22, Reference Examples 9 to 16>

An organic anti-reflection film composition (product name: ARC95, manufactured by Brewer Science Ltd.) was applied to an 12-inch silicon wafer using a spinner, and the composition was then baked at 205° C. for 60 seconds and dried, thereby forming an organic anti-reflection film having a film thickness of 98 nm.

Then, the resist composition of each example (Examples 18 to 34, Comparative Examples 12 to 22, Reference Examples 9 to 16) was applied to the organic anti-reflection film using a spinner, and was then prebaked (PAB) on a hotplate at 110° C. for 60 seconds and dried, thereby forming a resist film having a film thickness of 85 nm.

Subsequently, the resist film was selectively irradiated with an ArF excimer laser (193 nm) through a photomask (6% halftone), using an immersion lithography ArF exposure apparatus NSR-S610 (manufactured by Nikon Corporation; NA (numerical aperture)=1.30; Dipole 0.97/0.78 w/P; immersion medium: water).

Then, a post exposure bake (PEB) treatment was conducted at 90° C. for 60 seconds.

Next, a solvent development was conducted at 23° C. for 13 seconds using butyl acetate, followed by drying by shaking.

As a result, in each of the examples, a 1:1 space and line pattern (SL pattern) having a line width of 40 nm and a pitch of 90 nm was formed.

<Evaluation of Resist Pattern>
[Evaluation of Line Width Roughness (LWR)]

With respect to each of the LS patterns formed in "Formation of Negative-Tone Resist Pattern", the space width at 400 points in the lengthwise direction of the space were measured using a measuring scanning electron microscope (SEM) (product name: S-9380, manufactured by Hitachi High-Technologies Corporation; acceleration voltage: 300V). From the results, the value of 3 times the standard deviation s (i.e., 3s) was determined, and the average of the 3s values at 400 points was calculated as a yardstick of LWR. The results are indicated under "LWR (nm)" in Table 6.

[Evaluation of Mask Reproducibility]

In accordance with the same procedure as in the "Formation of Negative-Tone Resist Pattern", an SL pattern having a pitch of 90 nm was formed with the same exposure dose and using a mask pattern in which the target size of the space width was 35 to 44 nm (10 target sizes at intervals of 1 nm).

The gradient of a graph obtained by plotting the target size (nm) on the horizontal axis, and the space width (nm) of the line pattern actually formed on the resist film using each mask pattern on the vertical axis. The gradient of the plotted line is indicated under "MEEF" in Table 6.

TABLE 6

| Negative-tone resist pattern | PAB/PEB (° C./° C.) | LWR (nm) | MEEF |
|---|---|---|---|
| Ex. 18 | 110/90 | 5.18 | 5.66 |
| Ex. 19 | 110/90 | 5.12 | 5.73 |
| Ex. 20 | 110/90 | 5.26 | 5.89 |
| Ex. 21 | 110/90 | 5.29 | 5.81 |
| Ex. 22 | 110/90 | 5.32 | 5.78 |
| Ex. 23 | 110/90 | 5.19 | 5.82 |
| Ex. 24 | 110/90 | 5.22 | 5.99 |
| Ex. 25 | 110/90 | 5.33 | 5.81 |
| Ex. 26 | 110/90 | 5.26 | 5.69 |
| Ex. 27 | 110/90 | 5.31 | 5.97 |
| Ex. 28 | 110/90 | 5.35 | 5.94 |
| Ex. 29 | 110/90 | 5.29 | 5.82 |
| Ex. 30 | 110/90 | 5.21 | 5.79 |
| Ex. 31 | 110/90 | 5.28 | 5.88 |
| Ex. 32 | 110/90 | 5.46 | 6.11 |
| Ex. 33 | 110/90 | 5.41 | 6.06 |
| Ex. 34 | 110/90 | 5.44 | 6.24 |
| Comp. Ex. 12 | 110/90 | 6.25 | 6.88 |
| Comp. Ex. 13 | 110/90 | 6.41 | 7.03 |
| Comp. Ex. 14 | 110/90 | 6.33 | 6.92 |
| Comp. Ex. 15 | 110/90 | 6.21 | 6.79 |
| Comp. Ex. 16 | 110/90 | 6.37 | 6.81 |
| Comp. Ex. 17 | 110/90 | 6.44 | 7.13 |
| Comp. Ex. 18 | 110/90 | 6.71 | 7.09 |
| Comp. Ex. 19 | 110/90 | 6.52 | 6.99 |
| Comp. Ex. 20 | 110/90 | 6.22 | 6.94 |
| Ref. Ex. 9 | 110/90 | 5.79 | 6.52 |
| Ref. Ex. 10 | 110/90 | 5.62 | 6.59 |
| Ref. Ex. 11 | 110/90 | 5.83 | 6.71 |
| Ref. Ex. 12 | 110/90 | 5.66 | 6.68 |
| Ref. Ex. 13 | 110/90 | 5.57 | 6.66 |
| Ref. Ex. 14 | 110/90 | 5.61 | 6.57 |
| Ref. Ex. 15 | 110/90 | 5.74 | 6.69 |
| Ref. Ex. 16 | 110/90 | 5.68 | 6.72 |
| Comp. Ex. 21 | 110/90 | 5.66 | 6.75 |
| Comp. Ex. 22 | 110/90 | 5.59 | 6.64 |

From the results shown in Tables 5 and 6, i.e., comparison between Examples 1 to 10, Reference Examples 1 to 8 and Comparative Examples 10 and 11, comparison between Examples 10 to 17 and Comparative Examples 1 to 8, comparison between Examples 18 to 27, Reference Examples 9 to 16 and Comparative Examples 21 and 22, and comparison between Examples 27 to 34 and Comparative Examples 12 to 19, it was confirmed that the resist composition of the Examples according to the present invention were capable of forming a resist pattern with reduced roughness, excellent mask reproducibility and excellent lithography properties as compared to Comparative Examples and Reference Examples.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A resist composition which generates acid upon exposure and exhibits changed solubility in a developing solution under the action of acid, the resist composition comprising:
a base component (A) which exhibits changed solubility in a developing solution under the action of acid and an acid generator component (B) which generates an acid upon exposure,
the base component (A) comprising a polymeric compound (A1) comprising a structural unit (a0) represented by general formula (a0-1) shown below:

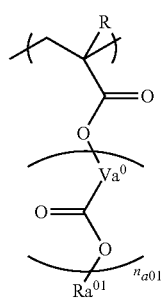
(a0-1)

wherein R represents a hydrogen atom, an alkyl group of 1 to 5 carbon atoms or a halogenated alkyl group of 1 to 5 carbon atoms; $Va^0$ represents a divalent hydrocarbon group which may contain an ether bond; $n_{a01}$ each independently represents an integer of 0 to 2; and $Ra^{01}$ represents an acid dissociable group represented by general formula (a0-r-100) shown below:

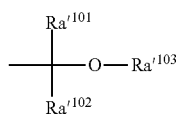
(a0-r-100)

wherein $Ra'^{101}$ and $Ra'^{102}$ represents a hydrogen atom or an alkyl group; and $Ra'^{103}$ represents a lactone-containing cyclic group, an —SO$_2$— containing cyclic group or a carbonate-containing cyclic group; and
the acid generator component (B) comprising an acid generator (B1) comprising a compound containing a nitrogen atom exhibiting a proton acceptor property and an acid generating site capable of generating an acid upon exposure in the same molecule thereof.

2. The resist composition according to claim 1, wherein the polymeric compound (A1) further comprises a structural unit (a1) which contains an acid decomposable group that exhibits increased polarity by the action of acid, and does not fall under the definition of the structural unit (a0).

3. The resist composition according to claim 1, wherein the acid generator (B1) is a compound represented by general formula (b1-1) shown below:

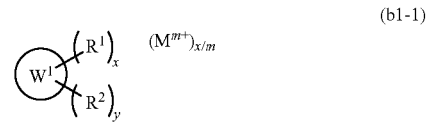
(b1-1)

wherein $R^1$ represents a group having an anion portion that generates acid upon exposure; $R^2$ represents a hydrogen atom or a substituent that does not have an anion portion that generates acid upon exposure; $W^1$ represents a z-valent functional group containing n nitrogen atoms having proton acceptor properties; n represents an integer of 1 or more; z=x+y, n≤x≤z, and 0≤y≤z−x; m represents an integer of 1 or more; and $M^{m+}$ represents an m-valent organic cation.

4. A method for forming a resist pattern comprising a step of forming a resist film using the resist composition of claim 1 on a support, a step of exposing the resist film, and a step of developing the resist film to form a resist pattern.

5. The resist composition according to claim 1, wherein the acid generator (B1) is a compound represented by general formula (b1-2) shown below:

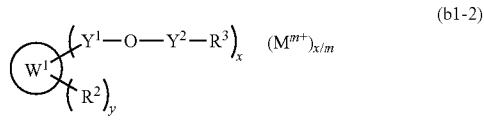
(b1-2)

wherein $Y^1$ and $Y^2$ each independently represents a single bond or a divalent linking group; $R^3$ represents an anion group represented by any one of the formulae (r-an-1) to (r-an-3) shown below; $R^2$ represents a hydrogen atom or a substituent that does not have an anion portion that generates acid upon exposure; $W^1$ represents a z-valent functional group containing n nitrogen atoms having proton acceptor properties; n represents an integer of 1 or more; z=x+y, n≤x≤z, and 0≤y≤z−x; m represents an integer of 1 or more; and $M^{m+}$ represents an m-valent organic cation;

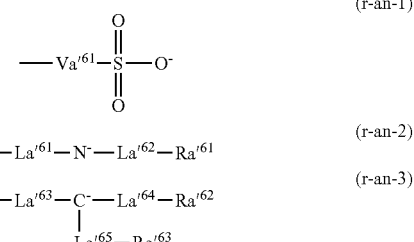

wherein $Va'^{61}$ represents a divalent hydrocarbon group having a fluorine atom; $La'^{61}$ and $La'^{62}$ represents —SO$_2$—; $La'^{63}$ to La$^{t65}$ represents —SO$_2$— or a single bond; and Ra$^{t61}$ to Ra$^{t63}$ each independently represents a hydrocarbon group.

6. A resist composition which generates acid upon exposure and exhibits changed solubility in a developing solution under the action of acid, the resist composition comprising:
a base component (A) which exhibits changed solubility in a developing solution under the action of acid and an acid generator component (B) which generates an acid upon exposure,
the base component (A) comprising a polymeric compound (A1) comprising a structural unit (a0) containing an acid decomposable group that exhibits increased polarity by the action of acid represented by general formula (a0-r-200) shown below:

wherein Ra$'^{104}$ and Ra$'^{105}$ each independently represents a hydrocarbon group, and Ra$'^{106}$ a lactone-containing cyclic group, an —SO$_2$— containing cyclic group or a carbonate-containing cyclic group; or Ra$'^{104}$ represents a hydrocarbon group, and Ra$'^{105}$ and Ra$'^{106}$ are mutually bonded to form a lactone-containing cyclic group, an —SO$_2$— containing cyclic group or a carbonate-containing cyclic group; and
the acid generator component (B) comprising an acid generator (B 1) which is a compound containing a nitrogen atom exhibiting a proton acceptor property and an acid generating site capable of generating an acid upon exposure in the same molecule thereof, and which is represented by general formula (b1-1) shown below:

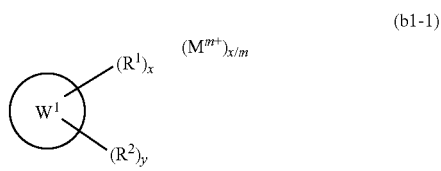

wherein R$^1$ represents a group having an anion portion that generates acid upon exposure; R$^2$ represents a hydrogen atom or a substituent that does not have an anion portion that generates acid upon exposure; W$^1$ represents a z-valent functional group containing n nitrogen atoms having proton acceptor properties, which contains at least one of the structures represented by the formulae (y2) to (y5) shown below:

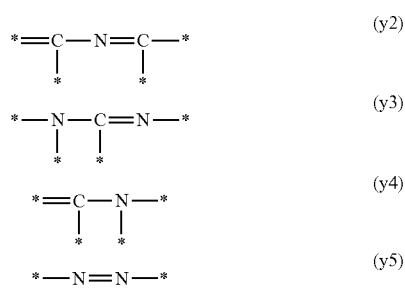

wherein "*" represents a valence bond;
n represents an integer of 1 or more; z=x+y, n+1≤x≤z, and 0≤y≤z−x; m represents an integer of 1 or more; and M$^{m+}$ represents an m-valent organic cation.

7. The resist composition according to claim 6, wherein the polymeric compound (A1) further comprises a structural unit (a1) which contains an acid decomposable group that exhibits increased polarity by the action of acid, and does not fall under the definition of the structural unit (a0).

8. A method for forming a resist pattern comprising a step of forming a resist film using the resist composition of claim 6 on a support, a step of exposing the resist film, and a step of developing the resist film to form a resist pattern.

9. The resist composition according to claim 6, wherein the structural unit (a0) is represented by general formula (a0-1) shown below:

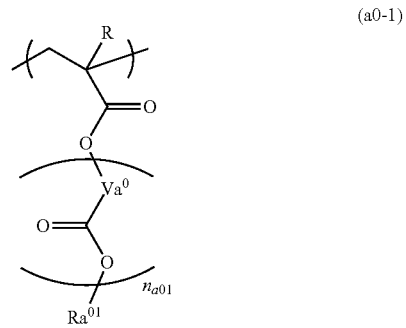

wherein R represents a hydrogen atom, an alkyl group of 1 to 5 carbon atoms or a halogenated alkyl group of 1 to 5 carbon atoms; Va$^0$ represents a divalent hydrocarbon group which may contain an ether bond; n$_{a01}$ each independently represents an integer of 0 to 2; and Ra$^{01}$ represents an acid dissociable group represented by general formula (a0-r-200).

10. The resist composition according to claim 6, wherein W$^1$ contains a structure represented by the formula (y2) shown below:

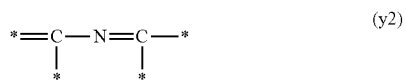

wherein "*" represents a valence bond.

11. The resist composition according to claim 10, wherein W$^1$ contains a structure represented by the formula (y2-1) shown below:

12. A resist composition which generates acid upon exposure and exhibits changed solubility in a developing solution under the action of acid, the resist composition comprising:
a base component (A) which exhibits changed solubility in a developing solution under the action of acid and an acid generator component (B) which generates an acid upon exposure,
the base component (A) comprising a polymeric compound (A1) comprising a structural unit (a0) containing an acid decomposable group that exhibits increased polarity by the action of acid represented by general formula (a0-r-200) shown below:

(a0-r-200)

wherein $Ra'^{104}$ and $Ra'^{105}$ each independently represents a hydrocarbon group, and $Ra'^{106}$ a lactone-containing cyclic group, an —$SO_2$— containing cyclic group or a carbonate-containing cyclic group; or $Ra'^{104}$ represents a hydrocarbon group, and $Ra'^{105}$ and $Ra'^{106}$ are mutually bonded to form a lactone-containing cyclic group, an —$SO_2$— containing cyclic group or a carbonate-containing cyclic group; and the acid generator component (B) comprising an acid generator (B1) which is a compound containing a nitrogen atom exhibiting a proton acceptor property and an acid generating site capable of generating an acid upon exposure in the same molecule thereof, and which is represented by general formula (b1-2) shown below:

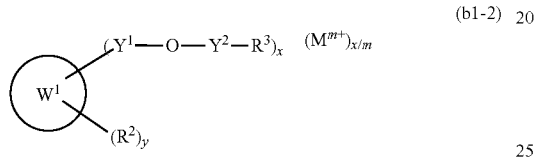
(b1-2)

wherein $Y^1$ and $Y^2$ each independently represents a single bond or a divalent linking group; $R^3$ represents an anion group represented by any one of the formulae (r-an-1) to (r-an-3) shown below; $R^2$ represents a hydrogen atom or a substituent that does not have an anion portion that generates acid upon exposure; $W^1$ represents a z-valent functional group containing n nitrogen atoms having proton acceptor properties, which contains at least one of the structures represented by the formulae (y2) to (y5) shown below:

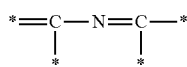
(y2)

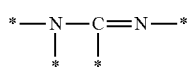
(y3)

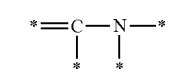
(y4)

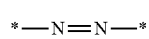
(y5)

wherein "*" represents a valence bond;
n represents an integer of 1 or more; z=x+y, n+1≤x≤z, and 0≤y≤z−x; m represents an integer of 1 or more; and $M^{m+}$ represents an m-valent organic cation;

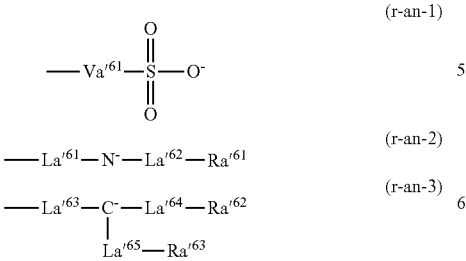
(r-an-1)
(r-an-2)
(r-an-3)

wherein $Va'^{61}$ represents a divalent hydrocarbon group having a fluorine atom; $La'^{61}$ and $La'^{62}$ represents —$SO_2$—; $La'^{63}$ to $La'^{65}$ represents —$SO_2$— or a single bond; and $Ra'^{61}$ to $Ra'^{63}$ each independently represents a hydrocarbon group.

13. The resist composition according to claim 12, wherein the polymeric compound (A1) further comprises a structural unit (a1) which contains an acid decomposable group that exhibits increased polarity by the action of acid, and does not fall under the definition of the structural unit (a0).

14. A method for forming a resist pattern comprising a step of forming a resist film using the resist composition of claim 12 on a support, a step of exposing the resist film, and a step of developing the resist film to form a resist pattern.

15. The resist composition according to claim 12, wherein the structural unit (a0) is represented by general formula (a0-1) shown below:

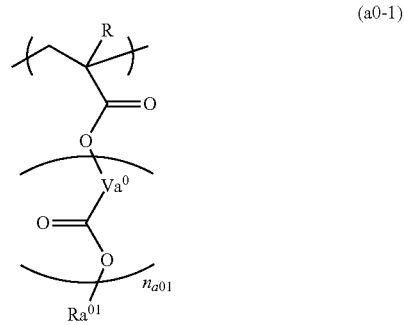
(a0-1)

wherein R represents a hydrogen atom, an alkyl group of 1 to 5 carbon atoms or a halogenated alkyl group of 1 to 5 carbon atoms; $Va^0$ represents a divalent hydrocarbon group which may contain an ether bond; $n_{a01}$ each independently represents an integer of 0 to 2; and $Ra^{01}$ represents an acid dissociable group represented by general formula (a0-r-200).

16. The resist composition according to claim 12, wherein $W^1$ contains a structure represented by the formula (y2) shown below:

(y2)

wherein "*" represents a valence bond.

17. The resist composition according to claim 16, wherein $W^1$ contains a structure represented by the formula (y2-1) shown below:

(y2-1)

* * * * *

UNITED STATES PATENT AND TRADEMARK OFFICE
CERTIFICATE OF CORRECTION

PATENT NO. : 9,128,374 B2
APPLICATION NO. : 14/056277
DATED : September 8, 2015
INVENTOR(S) : Tomohiro Oikawa Page 1 of 2

It is certified that error appears in the above-identified patent and that said Letters Patent is hereby corrected as shown below:

In the specification

Col. 4, line 6, "hydroxyalkylgroup" should be --hydroxyalkyl group--.
Col. 4, line 20, "acrylaminde"" should be --acrylamide"--.
Col. 4, line 32, after "($R^{\alpha 0}$)" insert --on--.
Col. 22, lines 25-35:

" 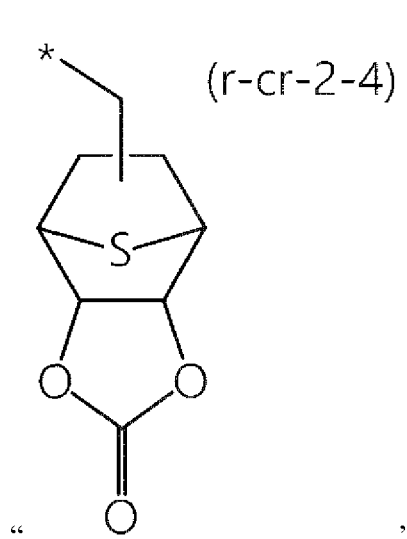 " should be -- 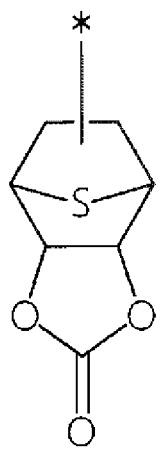 --.

Col. 24, line 43, "$Ra'_{101}$" should be --$Ra^{'101}$--.
Col. 33, lines 36-37, "(a0-r-1)" should be --(a1-r-1)--.
Col. 33, line 52, "(a0-r-1)," should be --(a1-r-1),--.
Col. 35, line 44, "(a2-r2-1)," should be --(a1-r2-1),--.
Col. 55, line 47, after "(—O—)," insert --a--.
Col. 60, line 45, "(a1))" should be --(a1)--.
Col. 72, line 34, "cylic" should be --cyclic--.
Col. 78, line 14, "defiend" should be --defined--.
Col. 80, line 37, "—N(R)—" should be -- —N($R_N$)— --.

Signed and Sealed this
Twenty-third Day of August, 2016

Michelle K. Lee
*Director of the United States Patent and Trademark Office*

CERTIFICATE OF CORRECTION (continued)
U.S. Pat. No. 9,128,374 B2

Col. 95, line 62, "dihphenyliodonium" should be --diphenyliodonium--.
Col. 108, line 1, "flourine" should be --fluorine--.
Col. 111, line 64, "at" should be --as--.
Col. 112, line 66, "methyl cyclohexanone," should be --methylcyclohexanone,--.
Col. 121, lines 49-50, "(600 MHz_$^{13}$C-NMR)." should be --(600 MHz, $^{13}$C-NMR).--.
Col. 122, line 63, "1/m" should be --l/m--.
Col. 124, line 66, "1/m" should be --l/m--.
Col. 125, line 18, "1/m" should be --l/m--.

In the claims

Col. 131, line 32 (Claim 6), "(B 1)" should be --(B1)--.